United States Patent
Hiramatsu et al.

(10) Patent No.: US 6,861,165 B2
(45) Date of Patent: Mar. 1, 2005

(54) ALUMINUM NITRIDE SINTERED COMPACT, CERAMIC SUBSTRATE, CERAMIC HEATER AND ELECTROSTATIC CHUCK

(75) Inventors: Yasuji Hiramatsu, Gifu (JP); Yasutaka Ito, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/926,362
(22) PCT Filed: Feb. 26, 2001
(86) PCT No.: PCT/JP01/01406

§ 371 (c)(1),
(2), (4) Date: Jan. 16, 2002

(87) PCT Pub. No.: WO01/62686

PCT Pub. Date: Aug. 30, 2001

(65) Prior Publication Data

US 2003/0044653 A1 Mar. 6, 2003

(30) Foreign Application Priority Data

Feb. 24, 2000 (JP) .......................................... 2000-48262
Feb. 24, 2000 (JP) .......................................... 2000-48338
Jul. 4, 2000 (JP) .......................................... 2000-202826
Nov. 28, 2000 (JP) .......................................... 2000-361768
Dec. 1, 2000 (JP) .......................................... 2000-367541

(51) Int. Cl.$^7$ ................................................. B32B 9/04
(52) U.S. Cl. .................... 428/704; 428/323; 428/325
(58) Field of Search ................................ 428/704, 323, 428/325, 698

(56) References Cited

U.S. PATENT DOCUMENTS

| 4,613,455 A | * | 9/1986 | Suzuki et al. ................ 252/516 |
| 5,154,863 A | | 10/1992 | Miyahara |
| 5,350,720 A | * | 9/1994 | Kawada et al. ............ 501/97.1 |
| 6,465,763 B1 | | 10/2002 | Ito et al. |
| 6,475,606 B2 | | 11/2002 | Niwa |
| 6,507,006 B1 | | 1/2003 | Hiramatsu et al. |
| 6,677,557 B2 | | 1/2004 | Ito et al. |
| 2002/0043527 A1 | | 4/2002 | Ito |
| 2002/0043530 A1 | | 4/2002 | Ito |
| 2002/0055021 A1 | | 5/2002 | Niwa |
| 2003/0015521 A1 | | 1/2003 | Ito |

FOREIGN PATENT DOCUMENTS

| EP | 0 393 524 | 10/1990 |
| EP | 0 598 399 | 5/1994 |
| JP | 61 146768 A | 7/1986 |
| JP | 63011575 | 1/1988 |
| JP | 2-275765 | 11/1990 |
| JP | 4317402 | 11/1992 |
| JP | 5-97523 | 4/1993 |
| JP | 5097523 | 4/1993 |
| JP | 5117039 | 5/1993 |
| JP | 5147910 | 6/1993 |
| JP | 6191955 | 7/1994 |
| JP | 6-191955 | 7/1994 |
| JP | 8-236603 | 9/1996 |
| JP | 9030866 | 2/1997 |
| JP | 9-124383 | 5/1997 |
| JP | 9124383 | 5/1997 |
| JP | 10080168 | 3/1998 |
| JP | 11-074064 | 3/1999 |
| JP | 11-111431 | 4/1999 |
| JP | 11228234 | 8/1999 |
| JP | 11236270 | 8/1999 |
| JP | 2000-048262 | 4/2003 |

* cited by examiner

Primary Examiner—Deborah Jones
Assistant Examiner—G Blackwell-Rudasill
(74) Attorney, Agent, or Firm—Oblon, Spivak, McClelland, Maier & Neustadt, P.C.

(57) ABSTRACT

The object of the present invention is to provide an aluminum nitride sintered body which has excellent mechanical strength and in which ceramic particles is prevented from coming off from the surface and/or side thereof and generation of free particles is suppressed. The aluminum nitride sintered body of the present invention is wherein it contains sulfur.

32 Claims, 20 Drawing Sheets (a)

(b)

(c)

(d)

(a)

(b)

(c)

(d)

(a)

(b)

(c)

(d)

×5000

ALUMINUM NITRIDE SINTERED COMPACT, CERAMIC SUBSTRATE, CERAMIC HEATER AND ELECTROSTATIC CHUCK

TECHNICAL FIELD

The present invention relates to an aluminum nitride sintered body which is suitable for a ceramic substrate used in a device for producing/examining a semiconductor such as a hot plate (a ceramic heater), an electrostatic chuck, a wafer prober and the like, as well as to a ceramic substrate produced by forming a conductor inside or on the surface of ceramic of said sintered body and the like, a ceramic heater and an electrostatic chuck using said ceramic substrate.

BACKGROUND ART

In a semiconductor producing/examining device including an etching device, a chemical vapor deposition device and the like, a heater, a wafer prober and the like using a metal base material such as stainless steel, aluminum alloy and the like have conventionally been employed.

However, in the case of such a metal heater, there was a problem that the temperature controlling property is not good and the body thereof becomes heavy and bulky due to the increased thickness, as well as a problem that the corrosion resistance to corrosive gases is not good. In order to solve such problems, a heater using ceramic of aluminum nitride and the like has been developed in place of a metal heater.

In the ceramic heater as described above, the rigidity of the ceramic substrate itself is high. Accordingly, the ceramic heater has an advantage that warping and the like of the substrate can be prevented without making the substrate so thick.

As one example of such conventional technique, JP Kokai Hei 11-40330 discloses a heater in which an heating element is provided on the surface of nitride ceramic.

In addition, JP Kokai Hei 9-48669 discloses a heater in which blackened aluminum nitride is used.

Further, JP Kokai Hei 5-8140 discloses an electrostatic chuck in which nitrides such as aluminum nitride is used. JP Kokai Hei 9-48668 discloses carbon-containing aluminum nitride which has the Al—O—N structure.

DISCLOSURE OF THE INVENTION

However, the tests performed by the inventors of the present invention have revealed that ceramic particles tend to come off from the main faces and the side surfaces of the abovementioned aluminum nitride sintered body, and thus the generated free particles attach to the semiconductor wafer, in the case of the ceramic substrate in which the aluminum nitride sintered body is used, thereby causing short circuits or disconnection of the circuit and the like formed on the semiconductor wafer. Such short circuits or disconnection and the like may result in malfunction of the semiconductor. Further, as the generated free particles prevent the semiconductor wafer from closely attaching to the ceramic substrate, there is a problem that the semiconductor wafer is heated with an uneven temperature distribution thereof.

When a ceramic substrate having a structure in which ceramic particles are prevented from coming off is produced in order to avoid coming-off of the ceramic particles as described above, the volume proportion occupied by pores inside the ceramic substrate increases. As a result, in case: that conductors are provided adjacent to each other in the ceramic substrate in the direction parallel to the main faces thereof; or that the conductors exist in the ceramic substrate, (for instance, between adjacent resistance heating elements or between an electro static electrode and a resistance heating element), an electron flies and jumps in the pores which and thus short circuits may occur.

In general, a sintering aid is added to ceramic. Such a sintering aid normally exists at the ceramic grain boundary and develops voids therein. When any fracture occurs in such a ceramic substrate, the sectional view of the fracture exhibits intergranular fracture and thus the ceramic substrate exhibits deteriorated mechanical properties such as deteriorated bending strength at a high temperature.

In consideration of the abovementioned problems, the objective of the present invention is to provide an aluminum nitride sintered body, a ceramic substrate, a ceramic heater and an electrostatic chuck, which have excellent mechanical strength and in which coming-off of ceramic particles from the main faces and the side surfaces thereof and generation of free particles are prevented. Another object of the present invention is to provide a ceramic substrate for a semiconductor producing/examining device and an electrostatic chuck, in which short circuit is prevented from occurring between conductors provided adjacent to each other in a direction perpendicular and a direction parallel to the substrate main faces inside the ceramic substrate.

Specifically, a first aspect of the present invention provides an aluminum nitride sintered body containing sulfur.

In said aluminum nitride sintered body, the content of sulfur is preferably in a range of 0.05 to 200 ppm.

Further, it is preferable that said aluminum nitride sintered body further contains oxygen.

A second aspect of the present invention provides an aluminum nitride sintered body wherein said aluminum nitride exhibits a state of intragranular fracture at the time of fracture and the average grain diameter of a ceramic grain is 3 $\mu$m or less.

A third aspect of the present invention provides a ceramic substrate having a conductor formed inside thereof or on the surface thereof, wherein said ceramic substrate has been sintered such that a sectional view of fracture thereof exhibits intragranular fracture.

In said ceramic substrate, the average grain diameter of a ceramic grain is preferably 3 $\mu$m or less.

Further, it is preferable that said ceramic substrate comprises nitride ceramic and said nitride ceramic contains sulfur therein.

Further, in said ceramic substrate, the content of sulfur is preferably in a range of 0.05 to 200 ppm.

Further, it is preferable that said ceramic substrate contains oxygen.

The present invention includes a ceramic heater wherein the ceramic substrate of the third aspect of the present invention is used. The present invention further includes an electrostatic chuck wherein the ceramic substrate of the third aspect of the present invention is used.

A fourth aspect of the present invention provides a ceramic substrate having a conductor inside thereof or on the surface thereof, wherein the average grain diameter of the ceramic grain of the ceramic substrate is preferably 2 $\mu$m or less.

The present invention includes a ceramic heater wherein the ceramic substrate of the fourth aspect of the present invention is used. The present invention further includes an electrostatic chuck wherein the ceramic substrate of the fourth aspect is used.

A fifth aspect of the present invention provides a ceramic substrate which has a conductor formed inside thereof and is for a semiconductor producing/examining device, wherein: a ceramic layer including said conductor and the vicinity thereof and a ceramic layer located lower than the conductor exhibit a state of intergranular fracture at the time of fracture; and a ceramic layer other than abovementioned layers exhibits a state of intragranular fracture at the time of fracture.

A sixth aspect of the present invention provides an electrostatic chuck having an electrostatic electrode and a resistance heating element formed inside a ceramic substrate, wherein: a ceramic layer including the electrostatic electrode and the vicinities thereof and a ceramic layer located lower than said electrostatic electrode exhibits a state of intergranular at the time of fracture; and a ceramic layers other than abovementioned ceramic layers exhibit a state of intragranular fracture at the time of fracture.

| Explanation of Symbols | |
|---|---|
| 101 | Electrostatic chuck |
| 1, 43, 810, 91 | Ceramic substrate |
| 2, 22, 32a, 32b | Chuck positive electrostatic layer |
| 3, 23, 33a, 33b | Chuck negative electrostatic layer |
| 2a, 3a | Semicircular arc part |
| 2b, 3b | Comb teeth-shaped part |
| 4 | Ceramic dielectric film |
| 5, 49, 85 | Resistance heating element |
| 6, 18, 83 | External terminal |
| 9, 89, 99 | Silicon wafer |
| 10, 801 | Ceramic heater |
| 11, 811 | Bottomed hole |
| 12, 820 | Through hole |
| 16, 87 | Conductor filled through hole |
| 42 | Chuck top conductor layer |
| 45 | Guard electrode |
| 46 | Ground electrode |
| 47 | Groove |
| 48 | Air suction hole |
| 808 | Upper layer |
| 809 | Lower layer |
| 86, 96 | Lifter pin |
| 92 | Heating element |
| 93 | Terminal |
| 92a | Metal covering layer |

DETAILED DESCRIPTION OF THE INVENTION

The first aspect of the present invention provides an aluminum nitride sintered body containing sulfur.

The aluminum nitride sintered body according to the first aspect of the present invention contains sulfur. Accordingly, the adhesion property at the ceramic grain boundary is improved. As a result, coming-off of ceramic particles from the main faces or the side surface of the aluminum nitride sintered body can be prevented and thus contamination of the semiconductor wafer by free particles can be avoided.

The reason why the adhesion property of the ceramic grain boundary is improved by adding sulfur in the above-mentioned aluminum nitride sintered body is not clearly known. However, it is assumed that sulfur facilitates the liquid-phase sintering reaction of the nitride ceramic, or sulfur is reacted with oxygen or an element constituting ceramic (for instance, Al) to form a compound which firmly binds the ceramic grains to each other.

Figure 21:
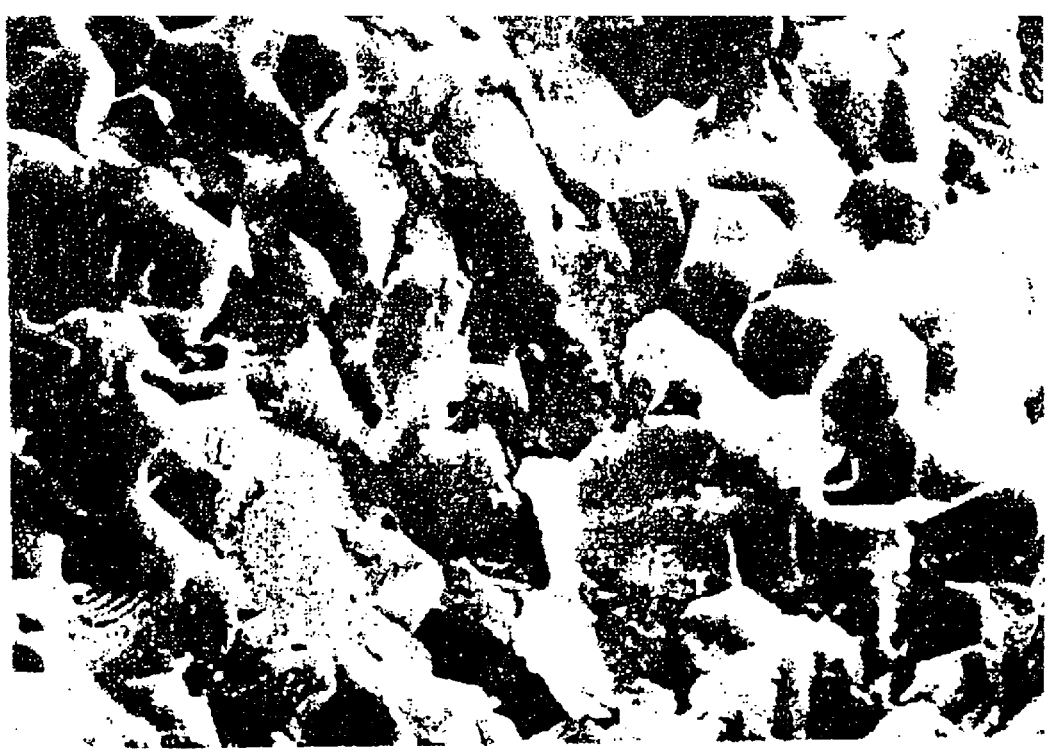
FIG. 21 is a photograph taken by a scanning electron microscope (SEM) which shows a sectional view of fracture of an aluminum nitride sintered body containing sulfur of the present invention.

FIG. 21 is a scanning electron microscope (SEM) photograph which shows a sectional view of fracture of the aluminum nitride sintered body containing sulfur. As shown in FIG. 21, the sectional view of fracture exhibits a state of intragranular fracture (a fracture phenomenon in which fracture occurs inside-grain, which is synonymous with "transgranular fracture").

The sectional view of fracture of the aluminum nitride sintered body according to the first aspect of the present invention exhibits the intragranular fracture as shown in FIG. 21. Accordingly, the aluminum nitride sintered body shows no apparent voids and presumably has high bending strength.

Figure 23:
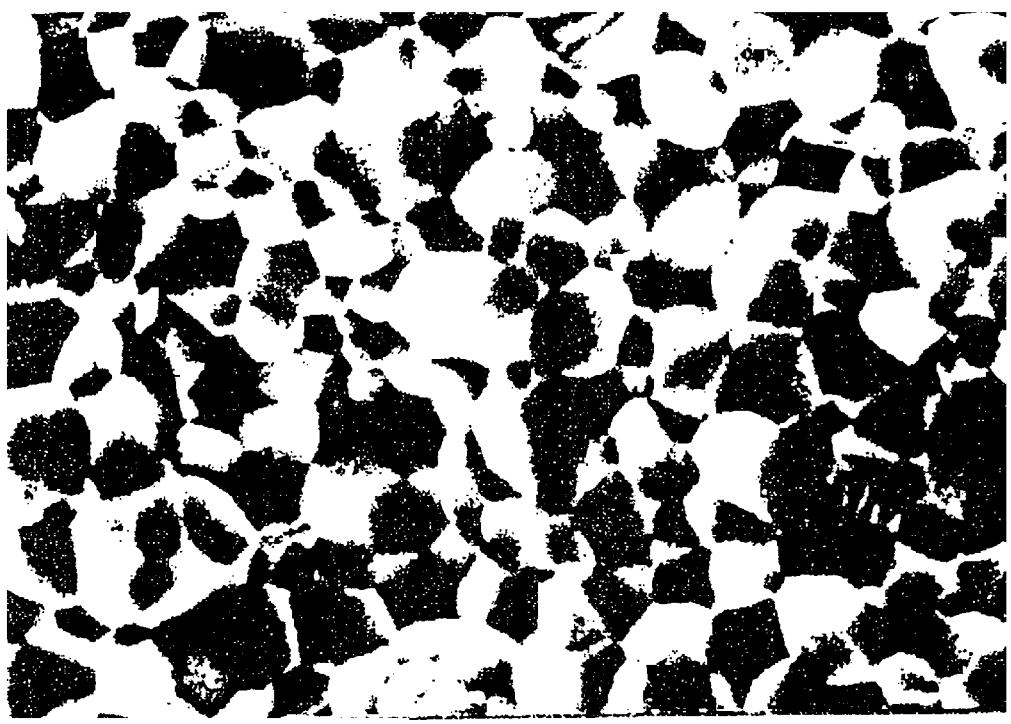
FIG. 23 is a SEM photograph which shows a sectional view of fracture of the conventional aluminum nitride sintered body.

On the other hand, FIG. 23 is a SEM photograph which shows a sectional view of fracture of the conventional aluminum nitride sintered body. As shown in FIG. 23, the sectional view of fracture exhibits a state of "intergranular" fracture (a phenomenon in which fracture occurs at the grain boundary), in which the binding force by which grains are bound to each other is not so large and thus particles tend to come off and generate free particles when some external or thermal stress is applied on the sintered body or a chemical force acts thereon. In the first aspect of the present invention, the problem thus described can be solved.

Further, in case that the aluminum nitride sintered body of the first aspect of the present invention contains sulfur and oxygen, it is assumed that, when the ceramic powder containing oxygen and sulfur is fired, sulfur and oxygen serve as catalysts; or sulfur and oxygen are reacted with Al or Si to form a compound which crosslinks between the grains, whereby the ceramic grains are firmly bound to each other. As a result, coming-off of the particles is prevented and generation of free particles is significantly suppressed.

The content of sulfur in the aluminum nitride sintered body of the first aspect of the present invention is preferably in a range of 0.05 to 20 ppm (in weight, the same for hereinafter) when measured by what is called the glow discharge-mass spectrum method (the GD-MS method). When the content of sulfur is less than 0.05 ppm, the effect of binding ceramic grains may not be obtained in a satisfactory manner. On the other hand, when the content of sulfur exceeds 200 ppm, the sintering property deteriorates and the binding of ceramic grains may be poor. Accordingly, the range of the sulfur content which is suitable for demonstrating the effect of the first aspect of the present invention is 0.05 to 200 ppm.

The sulfur content is particularly suitable when it is in a range of 0.1 to 100 ppm because, when the sulfur content is within this range, the sintering of aluminum nitride is not hindered and the sectional state of fracture of the ceramic can be adjusted to be the intragranular fracture. Sulfur may exist in the form of a sulfur atom, a sulfur ion or a sulfur compound in the sintered body. Accordingly, such a sulfur compound may be added to the raw material powder when the sintered body is produced. Examples of the sulfur compound include a thermoplastic resin such as polyether sulfone (PES), polyphenylene sulfide (PPS), polysulfone (PSF) and the like, an inorganic compound such as calcium sulfate, sodium sulfate, zinc sulfide, iron sulfide, calcium sulfide (CaS) and the like. These sulfur compounds may be used solely or as a combination of two or more kinds.

Further, it is preferable that the aluminum nitride sintered body contains oxygen. The content of oxygen is preferably in a range of 0.1 to 10 weight %. When the content of oxygen is less than 0.1 weight %, the sintering property deteriorates and voids are more likely to be generated at the grain boundary, whereby the bending strength of the aluminum nitride sintered body at a high temperature may be lowered. On the other hand, when the content of oxygen exceeds 10 weight %, the oxygen itself may become the void and drop the strength at a high temperature.

The content of oxygen described above is adjusted by heating the raw material powder in the air or oxygen or adding an oxide-type sintering aid.

As the sintering aid, an alkali metal oxide, an alkali earth metal oxide, a rare earth oxide may be used. Among these examples, $CaO$, $Na_2O$, $Li_2O$, $Rb_2O$ and $Y_2O_3$ are preferable. Alumina and/or silica may further be used. The content of the sintering aid is preferably in a range of 0.1 to 20 weight %.

However, it is not so preferable to use an oxide of a rare earth element too much. For example, when $Y_2O_3$, $Er_2O_3$ and the like is added too much, these compounds tend to cause the intergranular fracture. In case that $Y_2O_3$ is added as the sintering aid, the amount thereof to be added is preferably 1.0 parts by weight or less and more preferably 0.3 parts by weight or less with respect to 100 parts by weight of the ceramic raw material.

The porosity of the aluminum nitride sintered body is preferably 0, or no more than 5%. This is because, when the porosity exceeds 5%, the heat conductivity may be lowered or warp may be generated at a high temperature.

When no pore is present in the sintered body, the breakdown voltage at a high temperature becomes especially high. On the other hand, when pores are present in the sintered body, the fracture toughness value thereof becomes high. Accordingly, regarding which structure is to be selected, the choice should be made in consideration of the required property.

The reason why the fracture toughness value of the sintered body becomes high when pores are present therein is not clearly known, but it is assumed that the growth of cracks is probably stopped by the pores.

The abovementioned porosity is preferably measured by the Archimedes' method. This method includes the steps of: pulverizing the sintered body to obtain the specific gravity thereof; and calculating the porosity from the obtained true specific gravity and the apparent specific gravity.

In case that pores are present in the aluminum nitride sintered body, the pore diameter of the maximum pore is preferably 50 µm or less.

When the pore diameter of the maximum pore exceeds 50 µm, high breakdown voltage property may not be reliably obtained at a high temperature, in particular, at a temperature at 200° C. or higher.

The pore diameter of the maximum pore is preferably 10 Mm or less, because the degree of warp at a temperature of 200° C. or higher is reduced when the pore diameter is in this range.

The porosity or the pore diameter of the maximum pore is adjusted by changing the pressurizing duration, the applied pressure, the temperature during the sintering process or an additive such as SiC, BN and the like. SiC or BN serves to generate pores because these compounds inhibit sintering.

The measurement of the pore diameter of the maximum pore is performed by: preparing five samples and mirror-grinding the surface thereof; photographing the surface of each sample at ten sites by an electron microscope at the magnification rate of 2000 times to 5000 times; selecting the maximum pore diameter from each photograph; and regarding the average of the maximum pore diameter of the 50 shots as the pore diameter of the maximum pore.

Further, in the aluminum nitride sintered body of the first aspect of the present invention, Young's modulus in a temperature range of 25 to 800° C. is preferably 280 Gpa or more.

When Young's modulus is smaller than 280 GPa, the rigidity is so low that, when the aluminum nitride sintered body is shaped to a plate-shaped body, the degree of warp at the time of heating is hard to be reduced.

The aluminum nitride sintered body preferably contains carbon in an amount of 50 to 5000 ppm.

By incorporating carbon, the aluminum nitride sintered body can be blackened so that the radiation heat can be fully utilized when the aluminum nitride sintered body is used as a ceramic heater.

The carbon maybe amorphous or crystalline. When amorphous carbon is used, the drop in the volume resistivity at a high temperature can be prevented. When the crystalline carbon is used, the drop in the heat conductivity at a high temperature can be prevented. Accordingly, both crystalline carbon and amorphous carbon may be used together depending on the purpose. The content of carbon is preferably in a range of 200 to 2000 ppm.

The amorphous carbon can be obtained by firing a hydrocarbon composed only of C, H and O, preferably a saccharide, in the air. As the crystalline carbon, graphite powder and the like can be used.

Alternatively, carbon can be obtained by heat-decomposing an acrylic resin in an inactive atmosphere and thereafter heating and pressurizing the product. The degree of crystallinity or amorphousness can be adjusted by changing the acid value of the acrylic resin.

In case that the aluminum nitride sintered body of the first aspect of the present invention contains carbon therein, it is preferable that carbon is added so that the brightness of the aluminum nitride sintered body is N6 or less when evaluated as the value according to the definition of JIS Z 8721. The aluminum nitride sintered body having such brightness exhibits excellent heat radiation and excellently conceals the conductors and the like embedded therein.

Herein, the brightness N is defined as follows: the brightness of ideal black is made to 0; that of ideal white is made to 10; respective colors are divided into 10 parts in the manner that the brightness of the respective colors is recognized stepwise between the brightness of black and that of white at equal intensity intervals; and the resultant parts are indicated by symbols N0 to N10, respectively.

Actual brightness is measured by comparison with color chips corresponding to N0 to N10. One place of decimals in this case is made to 0 or 5.

A second aspect of the present invention provides an aluminum nitride sintered body which exhibits a state of intragranular fracture at the time of fracture and the average grain diameter of the ceramic grain is 3 µm or less.

The aluminum nitride sintered body of the second aspect of the present invention exhibits intragranular fracture at the sectional view of fracture thereof and is controlled so as to have the average grain diameter of the ceramic grain of 3 µm or less. Accordingly, in the aluminum nitride sintered body, coming-off of the particles is hardly observed and thus free particles are less likely to be generated on the silicon wafer and the like. Further, as there hardly exist any barriers between grains of the aluminum nitride sintered body, the strength of the sintered body at a high temperature becomes high.

By subjecting the aluminum nitride sintered body to fracture and then observing the sectional view of the fracture with an electron microscope at a magnification of 2000 to 5000 times, it can be confirmed whether the sectional view of fracture of the aluminum nitride sintered body of the second aspect of the present invention is intragranular fracture or not.

Here, the intragranular fracture of the second aspect of the present invention represents, similarly to the first aspect of the present invention, the case in which fracture occurs inside ceramic grains and not at the boundary between ceramic grains when the sectional view of fracture is observed, and is synonymous with the term "transgranular fracture".

The average grain diameter is obtained by: mirror-grinding the sintered body; thereafter measuring the length of the longer axis of a grain constituting the sintered body at arbitrary ten sites; and calculating the average of the ten lengths as the average grain diameter.

The average particle diameter of ceramic powder used when the aluminum nitride sintered body of the second aspect of the present invention is produced is preferably in a range of 0.2 to 1.5 µm. When the average particle diameter is smaller than 0.2 µm, the bulk density of the ceramic formed body drops too low to effect sintering poorly or abnormal grain growth may be observed. On the other hand, when the average particle diameter exceeds 1.5 µm, the grain diameter of the obtained sintered body exceeds 3 µm.

In order to improve the sintering property of ceramic particles, a sintering aid such as an alkali metal oxide, an alkali earth metal oxide, a rare earth oxide and the like is generally added. In the present invention, the amount of the sintering aid to be added is preferably 1.0 parts by weight or less and more preferably 0.3 parts by weight or less with respect to 100 parts by weight of the ceramic raw material. When the amount of the sintering aid to be added exceeds 1.0 parts by weight, the aluminum nitride sintered body obtained by sintering may exhibit a state of intergranular fracture, whereby the strength such as the bending strength at a high temperature of the produced aluminum nitride sintered body may be lowered.

Specific examples of the sintering aid include $CaO$, $Y_2O_3$, $Na_2O$, $Li_2O$, $Rb_2O$ and the like.

The aluminum nitride sintered body of the second aspect of the present invention exhibits a state of intragranular fracture at the time of fracture and the average grain diameter of the ceramic grain thereof is 3 µm or less.

The method of producing such an aluminum nitride sintered body is not particularly restricted, and the aluminum nitride sintered body can be produced by maintaining the firing temperature within a range of 1700 to 1800° C. during the firing process, after adding the sintering aid in the condition as described above. When the firing temperature is below 1700° C., the sintering of ceramic particles may not proceed in a sufficient manner. On the other hand, when the firing temperature exceeds 1800° C., the average grain diameter of the crystal grains constituting the aluminum nitride sintered body exceeds 3 µm and the sectional view of fracture may exhibit the intergranular fracture when the sintered body is fractured.

As described above, by setting the sintering temperature relatively low, the grain growth of the ceramic powder during the firing process can be suppressed and thus the average grain diameter of grains constituting the obtained aluminum nitride sintered body can be suppressed to 3 µm or less.

The aluminum nitride sintered body obtained by carrying out firing in the abovementioned condition preferably contains oxygen in an amount of 0.05 to 10 weight %. When the content of oxygen is less than 0.05 weight %, the sintering does not proceed and fracture occurs at the grain boundary, whereby voids are generated in the sintered body and the bending strength thereof at a high temperature drops. On the other hand, when the content of oxygen exceeds 10 weight %, oxygen and the like locally deposited at the grain boundary become voids, whereby the bending strength of the sintered body at a high temperature drops.

There may be cases in which the sintering aid, which has been added when the formed body containing the raw material powder is produced, hardly remains in the sintered body. For example, in case that 0.3 parts by weight or less of $Y_2O_3$ is added to 100 parts by weight of the ceramic raw material when the aluminum nitride sintered body is produced, $Y_2O_3$ is dispersed from the surface of the sintered body during the sintering process and scattered out from the surface, whereby Y2O3 hardly remains in the resulting sintered body.

In the aluminum nitride sintered body of the second aspect of the present invention, as the amount of impurities such as the sintering aid which are present at the grain boundary is very small, the grains constituting the aluminum nitride sintered body are firmly bound to each other. Accordingly, if a large force is applied on the aluminum nitride sintered body, fracture does not occur at the grain boundary but proceeds only at the crystal face at which the binding force between atoms in the grain is relatively weak.

The aluminum nitride sintered body of the second aspect of the present invention contains oxygen and, similarly to the first aspect of the present invention, has no pore, or if the aluminum nitride sintered body has any pore, it is preferable that the porosity is 5% or less and the pore diameter of the maximum pore is 50 µm or less. Further, it is preferable that the pore diameter of the maximum pore is 10 µm or less.

The content of carbon in the aluminum nitride sintered body and the brightness of the aluminum nitride sintered body according to the second aspect of the present invention are substantially the same as those of the first aspect of the present invention, and thus description thereof will be omitted.

The aluminum nitride sintered body of the first and second aspects of the present invention can be used for a ceramic substrate, a ceramic heater and an electrostatic chuck of the present invention described below, and is particularly suitable for a ceramic substrate, a ceramic heater and an electrostatic chuck employed for a semiconductor producing/examining device.

A third aspect of the present invention provides a ceramic substrate having a conductor formed inside thereof or on the surface thereof, wherein said ceramic substrate has been sintered such that a sectional view of fracture thereof exhibits intragranular fracture.

As the ceramic substrate of the third aspect of the present invention has been sintered such that a sectional view of fracture thereof exhibits intragranular fracture, the ceramic substrate produces little coming-off of particles and thus free particles are less likely to be generated. Further, as the ceramic substrate has little barriers between the grains thereof, the strength thereof at a high temperature becomes high.

The ceramic which exhibits intragranular fracture at the time of fracture has high rigidity and does not warp, whereby the ceramic is less likely to warp by its own weight even at a high temperature. Note that, in a large and thin substrate whose diameter is 200 mm or larger and whose thickness is 25 mm or thinner, the substrate is likely to warp due to its own weight at a high temperature. As a result, for example, a clearance is generated between the ceramic substrate and the semiconductor wafer or the distance between the ceramic substrate and the semiconductor wafer becomes uneven, thereby causing a problem that the semiconductor wafer cannot be heated evenly or the semiconductor wafer tends to be broken when a stress is applied thereon. In the present invention, as the degree of warp is small (100 µm or less) not only at the room temperature but also at a high temperature, the problem of heating property with evenness of a semiconductor wafer; or the problem that the semiconductor wafer tends to be broken when it is used for a wafer prober, can be solved.

The ceramic substrate of the present invention is preferably used in a temperature range of 100 to 800° C., because the ceramic substrate of the present invention especially suppresses warp and improves strength thereof at a high temperature. The ceramic substrate of the present invention is most preferably used at a temperature of 200° C. or higher.

In the third aspect of the present invention, a sintered body which has excellent adhesion property at the boundary of ceramic grains is formed by, for example: preparing a formed body with adding sulfur to the ceramic powder and then firing the formed body; or firstly oxidizing the surface of particles of the nitride ceramic raw material, adding an oxide thereto and then subjecting the mixture to forming and firing. When a sintered body formed in such a manner is fractured, a sectional view of fracture thereof exhibits the intragranular fracture.

The adhesion property at the boundary of the ceramic grain is improved by adding sulfur before sintering, probably because sulfur facilitates the liquid phase sintering reaction of the nitride ceramic or because sulfur is reacted with oxygen or an element constituting ceramic (for instance, Al in the case of aluminum nitride, Si in the case of silicon nitride), similarly to the first aspect of the present invention.

The average grain diameter of ceramic grains constituting the ceramic substrate of the third aspect of the present invention is preferably 3 µm or less. When the average grain diameter of the ceramic grains is in this range, the strength of the ceramic substrate can become further high and contamination of the silicone wafer and the like by free particles can be prevented. Here, the average grain diameter is obtained by: mirror-grinding the sintered body; thereafter measuring the length of the longer axis of a grain constituting the sintered body at arbitrary ten sites; and calculating the average of the ten lengths as the average grain diameter, similarly to the aluminum nitride sintered body of the second aspect of the present invention.

The ceramic substrate of the third aspect of the present invention comprises nitride ceramic which preferably contains sulfur therein.

The sulfur content in the abovementioned nitride ceramic, as measured by the GD-MS method, is preferably 0.05 to 200 ppm and more preferably 0.1 to 100 ppm, similarly to the first aspect of the present invention. Sulfur may exist in the form of a sulfur atom, a sulfur ion or a sulfur compound in the nitride ceramic. Accordingly, such a sulfur compound may be added to the raw material powder when the ceramic substrate is produced.

Examples of the sulfur compound include those listed in the first aspect of the present invention and the like.

The ceramic substrate of the third aspect of the present invention preferably contains oxygen. Here, the content of oxygen is preferably in a range of 0.05 to 10 weight % and more preferably in a range of 0.1 to 10 weight %. When the content of oxygen is less than 0.05 weight %, the sintering does not proceed and fracture occurs at the grain boundary, also voids are generated in the ceramic substrate thus the bending strength thereof at a high temperature drops. On the other hand, when the content of oxygen exceeds 10 weight %, oxygen and the like locally deposited at the grain boundary become voids, whereby the bending strength of the nitride ceramic at a high temperature drops.

The content of oxygen is adjusted by: heating the raw material powder in the air or oxygen; or adding an oxide-type sintering aid. Examples of the sintering aid include those listed as the sintering aid for the aluminum nitride sintered body of the present invention.

In case that the ceramic substrate of the third aspect of the present invention contains sulfur and oxygen, it is assumed that, when the ceramic powder containing oxygen and sulfur is fired, sulfur and oxygen serve as catalysts; or sulfur and oxygen are reacted with Al or Si to form a compound which crosslinks between the grains, whereby the ceramic grains are firmly bound to each other, as described in the first aspect of the present invention. As a result, coming-off of the particles is presumably prevented and generation of free particles is significantly suppressed.

As described above, the ceramic substrate of the third aspect of the present invention may comprise a sintered body obtained by: first oxidizing the surface of particles of the nitride ceramic raw material; adding oxides thereto; and then subjecting the mixture to forming and firing.

The reason why the sintered body which has excellent adhesion property at the boundary of the ceramic grains and exhibits intragranular fracture at the time of fracture is obtained by adding oxides before sintering, is probably because a sintered body in which the oxidized layer of the nitride ceramic is integrally combined with the added oxide is formed.

In this case, the oxide to be added is preferably the oxide of the element which constitutes the nitride ceramic, because such an oxide is substantially the same as the surface oxide layer of the nitride ceramic and very significantly facilitates the sintering process. In order to oxidize the surface of the nitride ceramic, it is preferable that the surface of the nitride ceramic is heated in oxygen or the air at a temperature of 500 to 1000° C. for 10 minutes to 3 hours.

It is preferable that the sintered body obtained by adding the abovementioned oxide to the raw material powder and subjecting the mixture to forming and sintering, contains Si and/or S.

The content of Si is preferably in a range of 0.05 to 50 ppm and the content of S is preferably in a range of 0.05 to 80 ppm. (each by weight) Si and S presumably serve to bind the oxidized layer of the nitride ceramic surface to the added oxide.

Other firing conditions will be described in detail below in the method of producing an electrostatic chuck.

In the ceramic substrate of the third aspect of the present invention, by subjecting the ceramic substrate to fracture and then observing the sectional view of the fracture of an electron microscope photograph taken at a magnification of 2000 to 5000 times, it can be confirmed whether the sectional view of fracture of the ceramic substrate exhibits intragranular fracture or not, similarly to the case of the aluminum nitride of the present invention.

The porosity of the ceramic substrate is preferably in a range of 0, or no more than 5%, similarly to the case of the aluminum nitride sintered body of the present invention. When the abovementioned porosity exceeds 5%, the heat conductivity may drop or warp may be generated at a high temperature.

When no pore is present in the ceramic substrate, the breakdown voltage at a high temperature becomes especially high. On the other hand, when pores are present in the ceramic substrate, the fracture toughness value thereof becomes high. Accordingly, regarding which structure is to be selected, the choice should be made in consideration of the required property.

In case that pores are present in the ceramic substrate, the pore diameter of the maximum pore is preferably 50 µm or less. When the pore diameter of the maximum pore exceeds 50 µm, high breakdown voltage property may not be reliably obtained at a high temperature, at a temperature at 200° C. or higher, in particular.

The pore diameter of the maximum pore is preferably 10 µm or less, because the degree of warp at a temperature of 200° C. or higher is reduced when the porosity is in this range.

The porosity or the pore diameter of the maximum pore is adjusted by changing the pressurizing duration, the applied pressure, the temperature during the sintering process or additive such as SiC, BN and the like. SiC or BN serves to generate pores because these compounds inhibit sintering.

The measurement of the pore diameter of the maximum pore and the measurement of the porosity are performed by the methods similar to those employed in the measurement of the pore diameter of the maximum pore or the measurement of the porosity of the aluminum nitride sintered body of the present invention.

The Young's modulus in a temperature range of 25 to 800° C. of the ceramic substrate of the third aspect of the present invention is preferably 280 Gpa or more, similarly to the case of the aluminum nitride sintered body of the first aspect of the present invention.

The ceramic substrate preferably contains carbon in an amount of 50 to 5000 ppm and more preferably in an amount of 200 to 2000 ppm, similarly to the case of the abovementioned aluminum nitride sintered body. The carbon may be amorphous or crystalline, similarly to the abovementioned aluminum nitride sintered body.

In case that the ceramic substrate of the third aspect of the present invention contains carbon therein, it is preferable that carbon is added so that the brightness of the ceramic substrate is N6 or lower when evaluated as the value according to the definition of JIS Z 8721. The ceramic substrate having such brightness exhibits excellent heat radiation and excellently conceals the conductors and the like embedded therein.

The ceramic substrate of the third aspect of the present invention preferably contains oxides. Examples of the oxide include alumina ($Al_2O_3$), rubidium oxide ($Rb_2O$), lithium oxide ($Li_2O$), calcium oxide (CaO), silica ($SiO_2$) and the like. The content of the oxide is preferably in a range of 0.1 to 20 weight %. In case that aluminum nitride is used as the ceramic material, alumina is especially preferable as the oxide. In case that silicon nitride is used as the ceramic material, silica is especially preferable as the oxide.

Use of an oxide of a rare earth element by a large amount is not so recommendable because if $Y_2O_3$, $Er_2O_3$ and the like, for example, is added at a large amount, the intergranular fracture is likely to occur. When $Y_2O_3$ is added as the sintering aid, the amount thereof to be added is preferably 1.0 parts by weight or less and more preferably 0.3 parts by weight or less with respect to 100 parts by weight of the ceramic material.

A ceramic heater and an electrostatic chuck using the abovementioned ceramic substrate of the third aspect of the present invention is also included in the present invention. The ceramic heater and the electrostatic chuck of the third aspect of the present invention have been sintered such that the sectional view of fracture thereof exhibits intragranular fracture, similarly to the case of the ceramic substrate of the third aspect of the present invention. Accordingly, particles are less likely to come off in the ceramic heater and the electrostatic chuck and thus free particles are less likely to be generated. Further, as there hardly exist any barriers between grains, the ceramic heater and the electrostatic chuck exhibit excellent strength at a high temperature.

A fourth aspect of the present invention provides a ceramic substrate having a resistance heating element formed inside thereof or on the surface thereof, wherein the average grain diameter of the ceramic grain of the ceramic substrate is 2 $\mu$m or less.

When an object to be heated such as a silicon wafer and the like is heated by raising the temperature of the ceramic substrate, free particles which come off from the ceramic substrate attach to the object to be heated such as the silicon wafer and the like. In case that the average grain diameter of the ceramic grains constituting the ceramic substrate is sufficiently small, the diameter of the free particles which come off is also small and these free particles do not cause a significant problem even if they attach to the object to be heated such as the silicon wafer and the like. However, in case that the ceramic grains is relatively large, the diameter of the free particles which come off is also large and these free particles tend to cause contamination if the free particles attach to the object to be heated such as the silicon wafer and the like, making the object to be heated such as the silicon wafer and the like contaminated and thus unusable.

However in the ceramic substrate of the present invention, the average grain diameter of the ceramic grains is adjusted so as to be 2 $\mu$m or less as described above. In this case, the ceramic substrate is likely to exhibit intragranular fracture at the time of fracture. Therefore, the ceramic particles thereof are less likely to come off and the average diameter of the free particles which come off is relatively small and is 2 $\mu$m or less.

Such small free particles are not likely to cause a serious problem if a little amount of the free particles attach to the silicon wafer. Thus, by using the ceramic substrate of the present invention, the object to be heated such as the silicon wafer and the like can be heated in a desirable manner.

In the present invention, when the ceramic particles are fired, the average grain diameter of the ceramic grains of the ceramic substrate can be controlled so as to be 2 $\mu$m or less by maintaining the firing temperature within a certain range.

The firing temperature during the ceramic substrate is produced is preferably in a range of 1600° C. or more and less than 1800° C. By carrying out the firing at a temperature within the abovementioned range, the ceramic particles can be sintered with suppressing the ceramic grain growth thereof.

A sintering aid such as yttria ($Y_2O_3$) is normally added to the materials in order to facilitate sintering of the ceramic particles. In the present invention, the amount of yttria to be added is preferably 1.0 parts by weight or less and more preferably 0.3 parts by weight or less with respect to 100 parts by weight of the ceramic raw material. The amount of the sintering aid to be added is to be restricted to such a range because the sintering aid stays normally at the grain boundary and forms voids, causing a drop in the strength (such as bending strength) of the ceramic substrate at a high temperature. When a ceramic sintered body is produced by sintering in such a manner, the sectional view of fracture thereof exhibits intragranular fracture.

When a ceramic substrate is sintered so that the sectional view of fracture thereof exhibits intragranular fracture, particles are less likely to come off and thus free particles are less likely to be generated, and there hardly exist any barriers between grains and thus the strength of the ceramic substrate at a high temperature rises.

In the fourth aspect of the present invention, it can be confirmed whether the sectional view of fracture of the sintered body is intragranular fracture or not by subjecting the sintered body to fracture and then observing the sectional view of the fracture with an electron microscope at a magnification of 2000 to 5000 times and the like, in a manner similar to that of the third aspect of the present invention.

The average particle diameter of the ceramic powder used during the sintering process is preferably in a range of 0.2 to 1.5 μm or so. When the average particle diameter of the ceramic powder is too small (smaller than 0.2 μm), the bulk density of the formed body drops so low that the sintering process may not proceed in a satisfactory manner or abnormal grain growth may occur. On the other hand, when the average particle diameter of the ceramic powder exceeds 1.5 μm, the grain diameter of the resulting sintered body exceeds 2 μm.

The ceramic substrate of the fourth aspect of the present invention, which is obtained by carrying out sintering in the abovementioned conditions, preferably contains oxygen by 0.05 to 10 weight %, similarly to the ceramic substrate of the third aspect of the present invention.

The ceramic substrate of the fourth aspect of the present invention has no pore or if it has any, it is preferable that the porosity is 5% or less and the pore diameter of the maximum pore is 50 μm or less, similarly to that of the third aspect.

When no pore is present in the sintered body, the breakdown voltage at a high temperature especially rises. On the other hand, when pores are present in the sintered body, the fracture toughness value thereof becomes high. Accordingly, regarding which structure is to be selected, the choice should be made in consideration of the required property.

The reason why the fracture toughness value of the sintered body becomes high when pores are present therein is not clearly known. It is assumed that the growth of cracks is stopped by the pores.

In the present invention, the pore diameter of the maximum pore is preferably 50 μm or less because, when the pore diameter of the maximum pore exceeds 50 μm, h high breakdown voltage property may not be reliably obtained at a high temperature, in particular, at a temperature at 200° C. or higher.

The pore diameter of the maximum pore is preferably 10 μm or less, because the degree of warp at a temperature of 200° C. or higher is reduced in this range.

The porosity or the pore diameter of the maximum pore is adjusted by changing the pressurizing duration, the applied pressure, the temperature during the sintering process or adding SiC, BN and the like. SiC or BN serves to generate pores because these compounds inhibit sintering.

The measurement of the pore diameter of the maximum pore and the measurement of the porosity are performed by the methods similar to those employed in the case of the ceramic substrate according to the third aspect of the present invention.

The ceramic heater and the electrostatic chuck using the abovementioned ceramic substrate of the fourth aspect of the present invention is also one of the present invention. The ceramic heater and the electrostatic chuck as the fourth aspect of the present invention are likely to exhibit intragranular fracture at the sectional view of fracture thereof, similarly to the ceramic substrate of the fourth aspect of the present invention, whereby the ceramic particles of the ceramic heater and the electrostatic chuck are less likely to come off and the average particle diameter of the free particles which-come off is relatively small, and 2 μm or less. Accordingly, the free particles of the ceramic heater and the electrostatic chuck of the present invention do not contaminate the silicon wafer and the like.

The third aspect of the present invention provides the ceramic substrate which is sintered so that the sectional view of fracture thereof exhibits intragranular fracture. The fourth aspect of the present invention provides the ceramic substrate in which the average grain diameter of the ceramic grain is 2 μm or less. The ceramic substrate of the third aspect and that of the fourth aspect have a feature in common that both ceramic substrates does not contaminate the silicon wafer and the like which are to be heated with the free particles thereof. Thus, in the descriptions hereinafter, the ceramic substrate of the third aspect of the present invention and that of the fourth aspect of the present invention will be described, both being referred to simply as "the ceramic substrate of the present invention" unless stated otherwise.

Thickness of the ceramic substrate of the present invention is preferably 50 mm or less.

When the thickness of the ceramic substrate exceeds 50 mm, the heat capacity of the ceramic substrate increases so much that the temperature following property thereof deteriorates due to the large heat capacity, especially when the ceramic substrate is heated or cooled by a temperature controlling means.

The thickness of the ceramic substrate is more preferably 20 mm or less. When the thickness of the ceramic substrate exceeds 20 mm, the heat capacity thereof is still not small enough, whereby the temperature controlling property of the ceramic substrate is likely to deteriorate and the temperature distribution on the face on which the semiconductor wafer is put (which face will be referred to as "the wafer-putting face") is likely to be uneven.

Thickness of the ceramic substrate preferably exceeds 1.5 mm and more preferably 5 mm or more.

It is preferable that the diameter of the ceramic substrate of the present invention exceeds 200 mm. It is especially preferable that the diameter of the ceramic substrate is 12 inches (300 mm) or more because this larger size will be a main stream in the semiconductor wafer of the next generation.

Although the type of the ceramic material constituting the ceramic substrate of the present invention is not particularly restricted, nitride ceramic or carbide ceramic are preferable. Examples of the nitride ceramic include metal nitride ceramics such as aluminum nitride, silicon nitride, boron nitride, titanium nitride and the like. Examples of the carbide ceramics include silicon carbide, titanium carbide, zirconium carbide, tantalum carbide, tungsten carbide and the like. As the ceramic material, alumina, silica, beryllia and the like may be used. Among these examples, the aluminum nitride described above is especially preferable because the heat conductivity thereof is the highest, that is 180 W/m·K.

The ceramic substrate of the present invention can be used at a temperature of 150° C. or higher, preferably at a temperature of 200° C. or higher.

In the ceramic substrate of the present invention, the semiconductor wafer may be put in a state in which the semiconductor wafer is in contact with the wafer-putting face of the ceramic substrate, or may be retained by a support pin and the like so that the semiconductor wafer is distanced from the ceramic substrate with a constant space therebetween.

The ceramic substrate of the present invention is suitable for using as a ceramic substrate for a semiconductor producing/examining device employed for producing/examining a semiconductor. Specific example of such a device include an electrostatic chuck, a wafer prober, a hot plate (a ceramic heater), a susceptor and the like.

In case that a heating element as a conductor is formed inside thereof or on the surface of the ceramic substrate of the present invention, the ceramic substrate functions as a ceramic heater.

In case that an electrostatic electrode as a conductor is formed inside the ceramic substrate of the present invention and a RF electrode or a heating element as a conductor is formed under the electrostatic electrode, the ceramic substrate functions as an electrostatic chuck.

Further, in case that a chuck top conductor layer as a conductor is formed on the surface of the ceramic substrate of the present invention and a guard electrode and a ground electrode as conductors are formed inside the ceramic substrate, the ceramic substrate functions as a chuck top plate for a wafer prober (will be referred to simply as a wafer prober hereinafter)

Further, in the descriptions hereinafter, the ceramic a substrate having the resistance heating element formed therein is referred to as "the ceramic heater of the present invention" and the ceramic substrate having the electrostatic electrode and the like formed therein will be referred to as "the electrostatic chuck of the present invention".

In the ceramic heater of the present invention, the heating element may be a metal layer whose thickness is in a range of 0.1 to 100 μm or so, or may be a heating wire.

In the ceramic heater of the present invention, the heating element is preferably provided at a position which is within 60% of the thickness of the ceramic substrate, as measured from the opposite face of the wafer-putting face, so that a substantial distance is maintained between the heating element and the heating face and thus the distribution of the temperature at the heating face is reliably made even.

Figure 1:
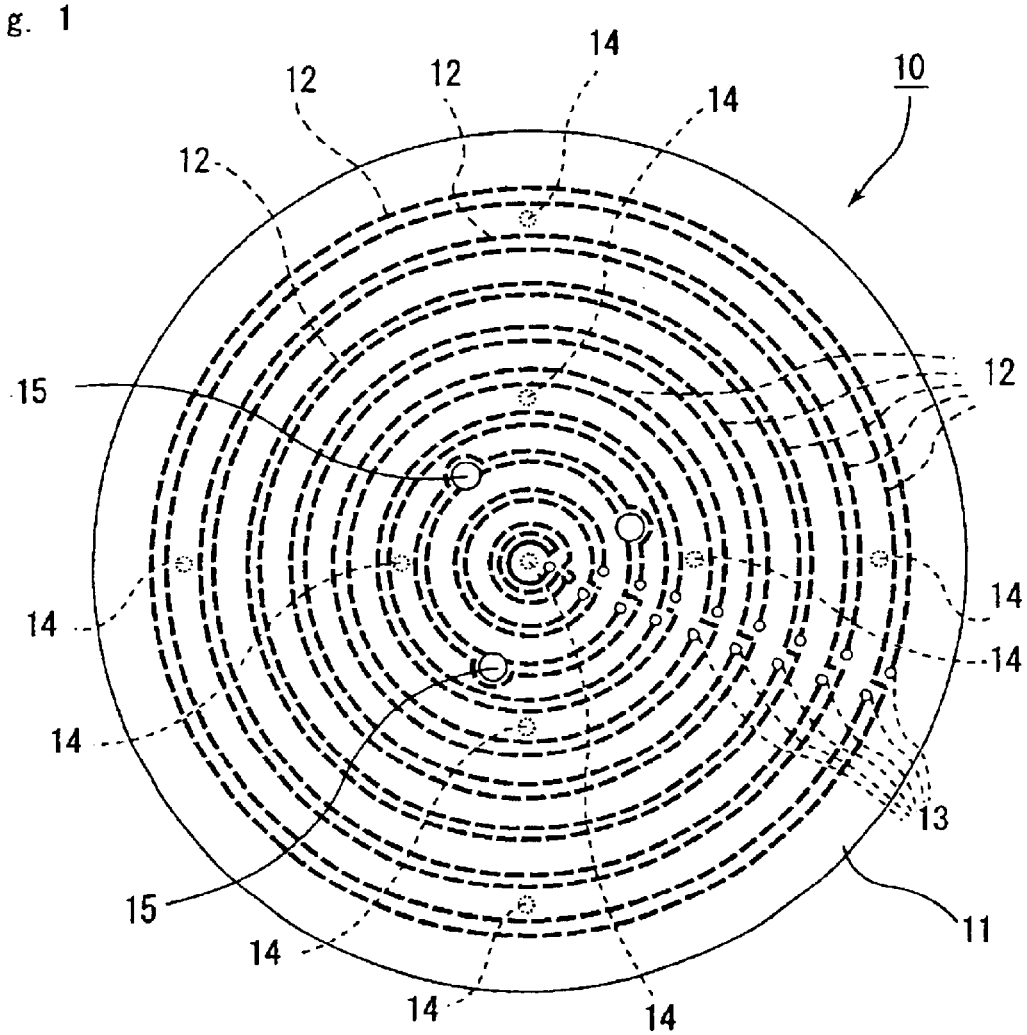
FIG. 1 is a plain view which schematically shows one example of a ceramic heater of the present invention.
Figure 2:
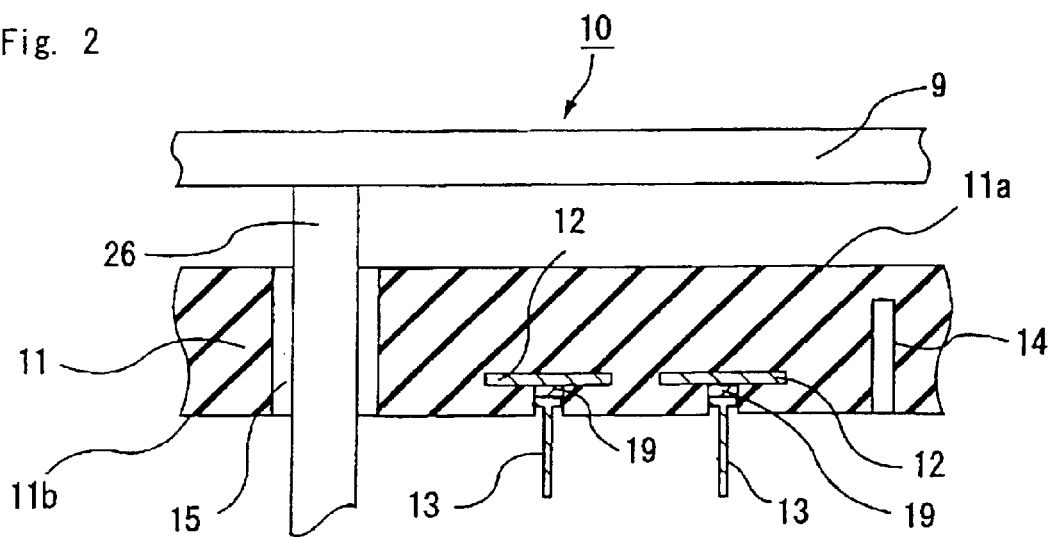
FIG. 2 is a partially-enlarged sectional view of the ceramic heater shown in FIG. 1.

FIG. 1 is a plain view which schematically shows one example of a ceramic heater of the present invention and FIG. 2 is a partially-enlarged sectional view of the ceramic heater shown in FIG. 1.

The ceramic substrate 11 is formed so as to have a disk-shape. A resistance heating element 12 as a temperature controlling means is formed inside the ceramic substrate 11 so as to have a pattern of concentric circles. In the resistance heating element 12, each of a pair of two adjacent concentric circles are connected, as a set of circuit, to form one line; and an external terminal 13 as the input/output terminal is connected to each end portion of the circuit through a conductor filled through hole 19.

Further, as shown in FIG. 2, a through hole 15 is formed in the ceramic substrate 11. A lifter pin 26 is passed through the through hole 15, so that the lifter pin 26 supports a silicon wafer 9.

By moving the lifter pin 26 in the vertical direction, the silicon wafer 9 can be received from a carrier, or the silicon wafer 9 can be put on a heating face 11a of the ceramic substrate 11 so that the silicon wafer 9 is heated, or the silicon wafer 9 can be supported in a state in which the silicon wafer 9 is distanced by the length of 50 to 2000 μm from the heating face 11a, for heating the silicon wafer 9. A bottomed hole 14 in which a temperature-measuring element such as a thermocouple is inserted is formed in the bottom face 11b of the ceramic substrate 11. When the resistance heating element 12 is energized, the ceramic substrate 11 is heated and thus the object to be heated such as a silicon wafer and the like can be heated.

Figure 3:
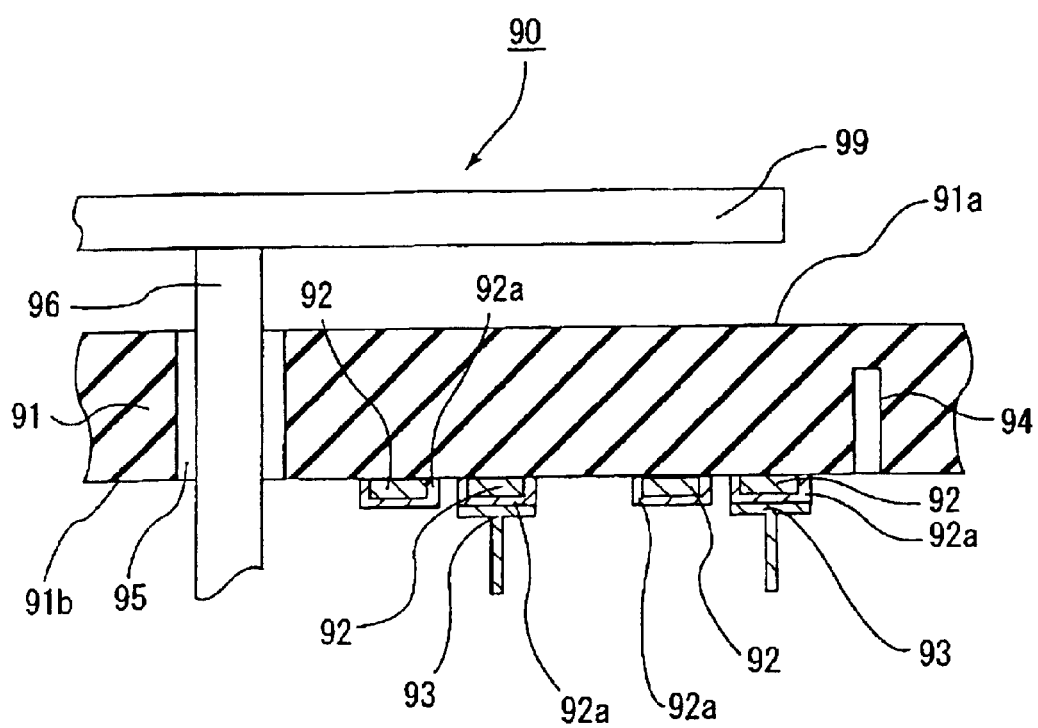
FIG. 3 is a partially-enlarged sectional view which schematically shows another embodiment of the ceramic heater of the present invention.

In the ceramic heater of the present invention, the resistance heating element may be provided inside the ceramic substrate as shown in FIG. 2 or on the bottom face of the ceramic substrate as shown in FIG. 3.

FIG. 3 is a partially-enlarged sectional view which schematically shows another embodiment of the ceramic heater of the present invention.

Also, in the ceramic heater 90, a lifter pin 96 is passed through a through hole 95, so that the lifter pin 96 supports a silicon wafer 99. By moving the lifter pin 96 in the vertical direction, the silicon wafer 99 can be received from a carrier, or the silicon wafer 99 can be put on the ceramic substrate 91, or the silicon wafer 99 can be supported such that the silicon wafer 99 is heated with being supported. A resistance heating element 92 is formed on the bottom face 91b of the ceramic substrate 91. A metal covering layer 92a is provided on the surface of the resistance heating element 92.

A bottomed hole 94 is formed in the ceramic substrate 91. A thermocouple (not shown) is inserted into the bottomed hole 94. The silicon wafer 99 is heated at the side of the wafer-heating face 91a.

The ceramic heater of the third aspect of the present invention exhibits intragranular fracture at the sectional view of fracture thereof when the ceramic substrate constituting the ceramic heater is fractured. That is, the binding force between grains is strong and very few particles come off from the ceramic heater, whereby attachment of free particles to the silicon wafer is prevented.

In the ceramic heater of the fourth aspect of the present invention, the average grain diameter of the ceramic grains of the ceramic substrate constituting the ceramic heater is adjusted so as to be 2 μm or less. In this case, the ceramic substrate is likely to exhibit intragranular fracture at the time of fracture, whereby the ceramic particles thereof are less likely to come off and the average particle diameter of the free particles which come off is relatively small, that is, 2 μm or less. Therefore, if these free particles attach to the silicon wafer, the free particles are not likely to cause a serious problem. Hence, the silicon wafer can be heated in a desirable manner.

Figure 4:
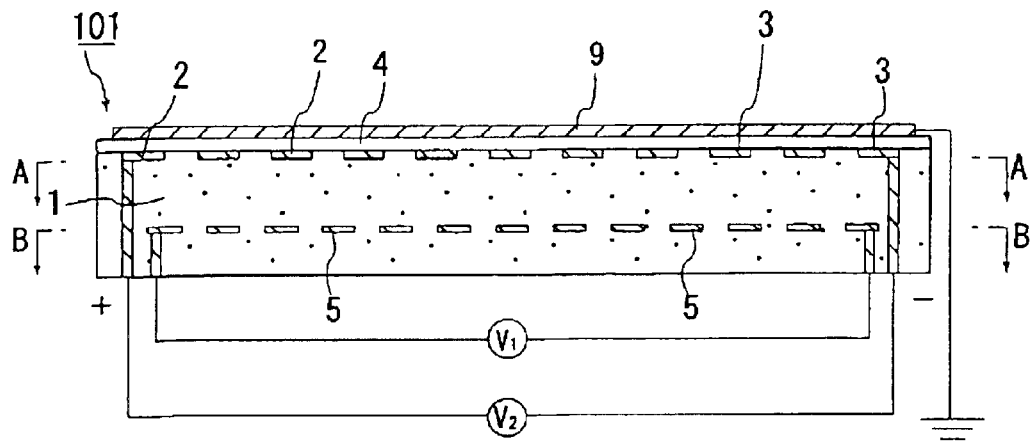
FIG. 4 is a sectional view which schematically shows one example of an electrostatic chuck of the present invention.
Figure 5:
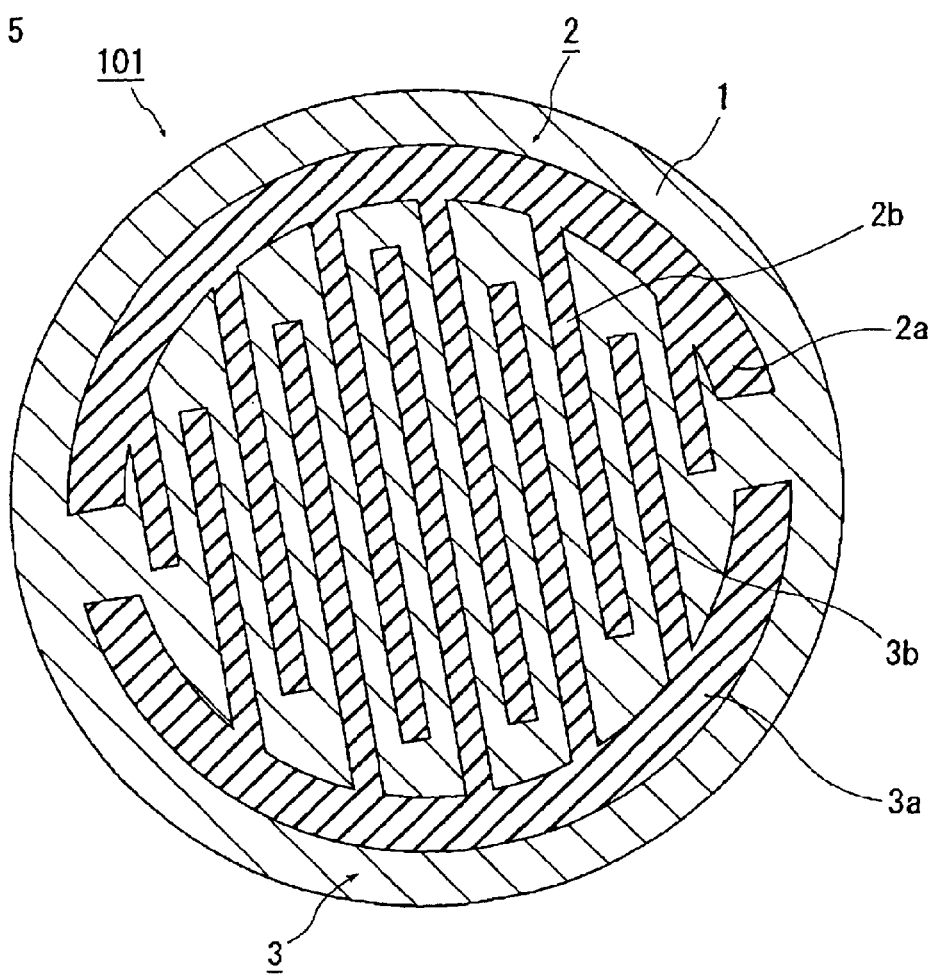
FIG. 5 is a sectional view when the electrostatic chuck shown in FIG. 4 is cut along the line A—A.
Figure 6:
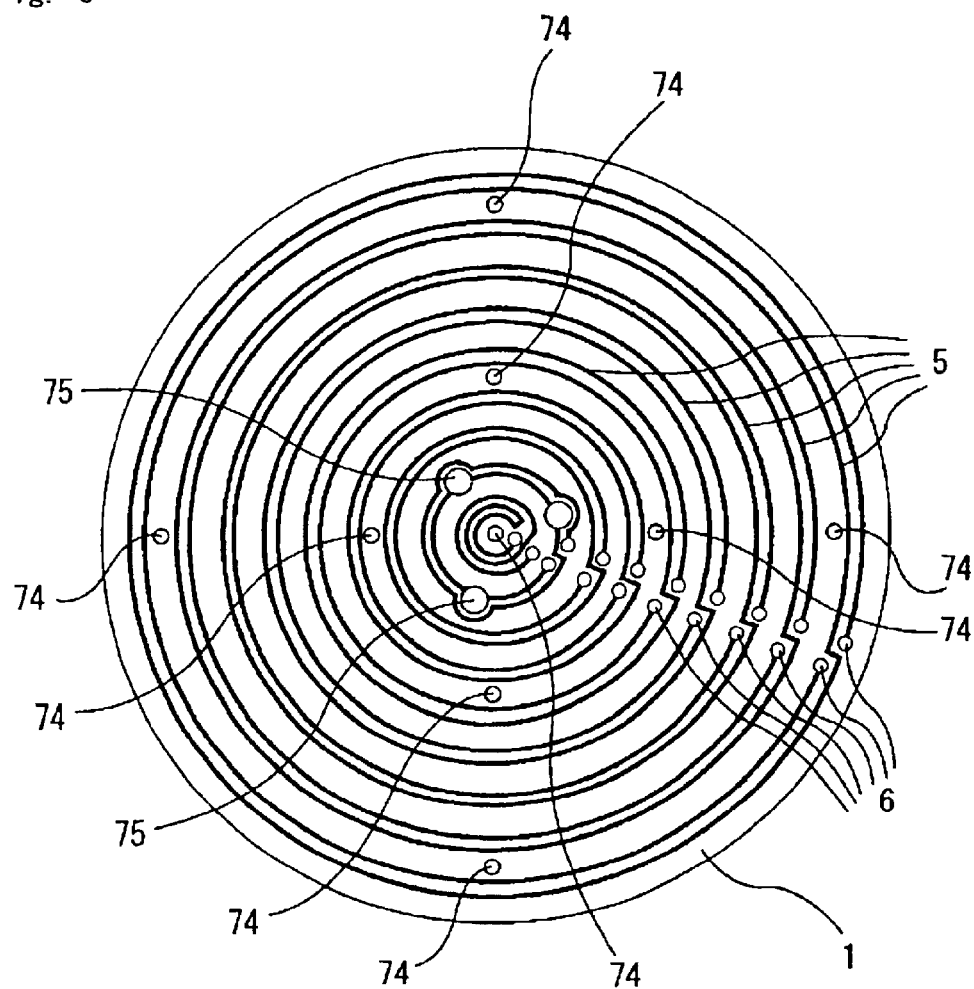
FIG. 6 is a sectional view when the electrostatic chuck shown in FIG. 4 is cut along the line B—B.

FIG. 4 is a sectional view which schematically shows one example of an electrostatic chuck of the present invention. FIG. 5 is a sectional view of the electrostatic chuck shown in FIG. 4 when the electrostatic chuck is cut along the line A—A. FIG. 6 is a sectional view of the electrostatic chuck shown in FIG. 4 when the electrostatic chuck is cut along the line B—B.

In the electrostatic chuck 101, an electrostatic electrode layer comprising a chuck positive electrostatic layer 2 and a chuck negative electrostatic layer 3 is embedded inside the ceramic substrate 1 whose shape, as viewed from the above, presents a circular shape. The silicon wafer 9 is put on the electrostatic chuck 101 and grounded.

A ceramic layer which is formed on the electrostatic electrode layer so as to cover the electrostatic electrode layer functions as a dielectric film for attracting the silicon wafer. Thus, this ceramic layer will be referred to as the ceramic dielectric film 4 hereinafter.

As shown in FIG. 5, the chuck positive electrostatic layer 2 has a semicircular arc part 2a and a comb teeth-shaped part 2b. Likewise, the chuck negative electrostatic layer 3 has a semicircular arc part 3a and a comb teeth-shaped part 3b. The chuck positive electrostatic layer 2 and the chuck negative electrostatic layer 3 are arranged so that the two electrostatic layers face each other and the comb teeth-shaped portion 2b and the comb teeth-shaped portion 3b thereof cross each other as shown in FIG. 5. The chuck positive electrostatic layer 2 and the chuck negative electrostatic layer 3 are connected to the positive side and the negative side of a direct current electric power, respectively, so that a direct current voltage $V_2$ is applied thereto.

In addition, a resistance heating element 5 which has concentric circles-shape, as viewed from the above, as shown in FIG. 6 and serves for controlling the temperature of the silicon wafer 9 is provided inside the ceramic substrate 1. An external terminal 6 is fixed and connected to each end of the resistance heating element 5 such that a voltage $V_1$ is applied thereto. As shown in FIG. 6, a bottomed hole 74 for fitting a temperature-measuring element and a through hole 75 for passing through a lifter pin (not shown) for supporting and moving the silicon wafer 9 in the vertical direction are formed in the ceramic substrate 1, although these holes are not shown in FIGS. 4 and 5. The resistance heating element 5 may be formed at the bottom face of the ceramic substrate. An RF electrode may be embedded in the ceramic substrate 1, based on the necessity.

When the electrostatic chuck 101 is to function, the direct voltage $V_2$ is applied to the chuck positive electrostatic layer 2 and the chuck negative electrostatic layer 3. As a result, due to the electrostatic action effected between the chuck positive electrostatic layer 2 and the chuck negative electrostatic layer 3, the silicon wafer 9 is attracted to the electrodes through the ceramic dielectric film 4 and fixed thereon. After the silicon wafer 9 is fixed on the electrostatic chuck 101 in such a manner, the silicon wafer 9 is subjected to various types of processing such as CVD and the like.

In the third aspect of the present invention, the ceramic substrate 1 constituting the electrostatic chuck exhibits intragranular fracture when the ceramic substrate 1 is fractured and thus has a strong binding force between the grains thereof. Accordingly, by subjecting the surface of the ceramic dielectric film 4 to grinding and the like, an extremely flat surface can be formed and thus the chuck force of the silicon wafer can be significantly increased. Further, as very few particles come off from the ceramic substrate 1, attachment of free particles to the silicon wafer can be prevented.

In the fourth aspect of the present invention, the average grain diameter of the ceramic grain of the ceramic substrate 1 constituting the electrostatic chuck is adjusted so as to be 2 $\mu$m or less. In this case, the ceramic substrate 1 is likely to exhibit intragranular fracture and thus the binding force between the grains thereof is strong. Accordingly, by subjecting the surface of the ceramic dielectric film 4 to grinding and the like, an extremely flat surface can be formed and thus the chuck force of the silicon wafer can be significantly increased. Further, as the ceramic particles of the ceramic substrate 1 are less likely to come off and the average particle diameter of the free particles which come off is small and, that is, 2 $\mu$m or less, even if these free particles attach to the silicon wafer, the free particles are less likely to cause a serious problem.

The electrostatic chuck described above are provided with the electrostatic electrode layer and the resistance heating element and has a structure as shown in FIGS. 4 to 6. Hereafter, each of the members which constitute the electrostatic chuck but have not been described in the above-mentioned description of the ceramic substrate will be described in detail.

The ceramic dielectric film 4 on the electrostatic electrode is preferably composed of the same material as that of the other portions of the ceramic substrate, so that a green sheet and the like can be produced by the same process. In this case, after laminating these layers, the ceramic substrate can be produced by a single sintering process.

The ceramic dielectric film preferably contains carbon, similarly to the case of the other portions of the ceramic substrate, so that the electrostatic electrode can be concealed and the radiation heat can be utilized.

The ceramic dielectric film preferably contains an alkali metal oxide and an alkali earth metal oxide. The alkali metal and an alkali earth metal oxide serve as a sintering aid and facilitate formation of a dielectric film of a high density.

The thickness of the ceramic dielectric film is preferably in a range of 5 to 1500 $\mu$m. When the thickness of the ceramic dielectric film is less than 5 $\mu$m, a sufficient breakdown voltage is not obtained because the film is too thin, whereby the ceramic dielectric film may be subjected to dielectric breakdown when the silicon wafer is put on the ceramic dielectric film and adsorbed. On the other hand, when the thickness of the ceramic dielectric film exceeds 1500 $\mu$m, the silicon wafer is distanced so far from the electrostatic electrode that the capability of adsorbing the silicon wafer deteriorates. More preferably, the thickness of the ceramic dielectric film is in a range of 50 to 1500 $\mu$m.

The porosity of the ceramic dielectric film is preferably 5% or less and the pore diameter of the maximum pore is preferably 50 $\mu$m or less. When the porosity exceeds 5%, the number of the pore increases and the diameter of pore becomes too large, whereby pores are more likely to be interconnected with each other. In the ceramic dielectric film having such a structure, the breakdown voltage tends to drop too low. Whereas, when the pore diameter of the maximum pore exceeds 50 $\mu$m, the high breakdown voltage may not be reliably obtained at a high temperature, although the oxides are present at the grain boundary. The porosity is preferably in a range of 0.01 to 3% and the pore diameter of the maximum pore is preferably in a range of 0.1 to 10 $\mu$m.

Examples of the electrostatic electrode formed inside the ceramic substrate include a sintered body made of a metal or conductive ceramic, a metal foil and the like. As the metal sintered body, a metal sintered body which comprises at least one kind selected from tungsten and molybdenum is preferable. Regarding the metal foil, the metal foil also preferably comprises the same material as that of the metal sintered body. The reason for this is that these metals exhibit relatively good resistance to oxidation and have sufficient conductivity to function as an electrode. As the conductive ceramic, at least one kind selected from carbides of: tungsten; and molybdenum is preferably used.

Figure 13:
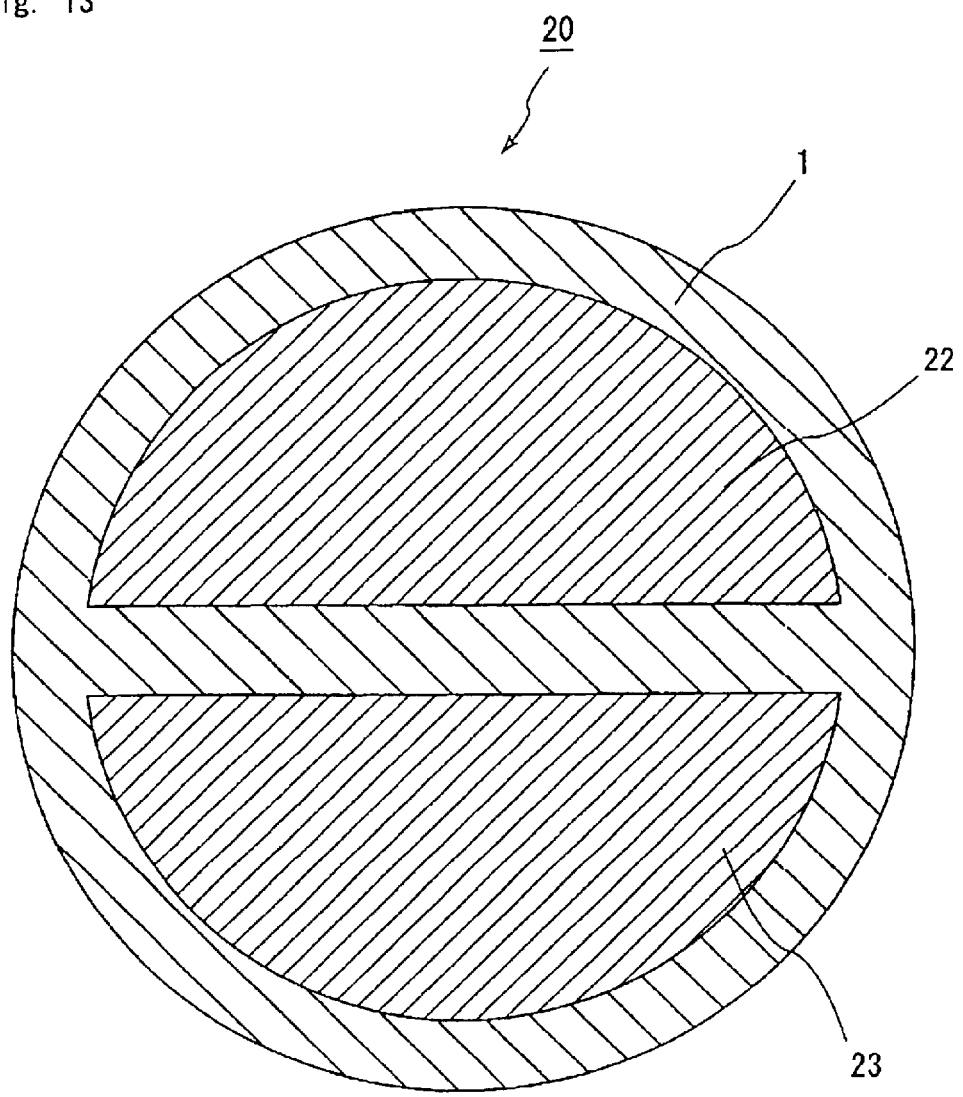
FIG. 13 is a horizontal, sectional view schematically showing a shape of electrostatic electrodes which constitute an electrostatic chuck of the present invention.
Figure 14:
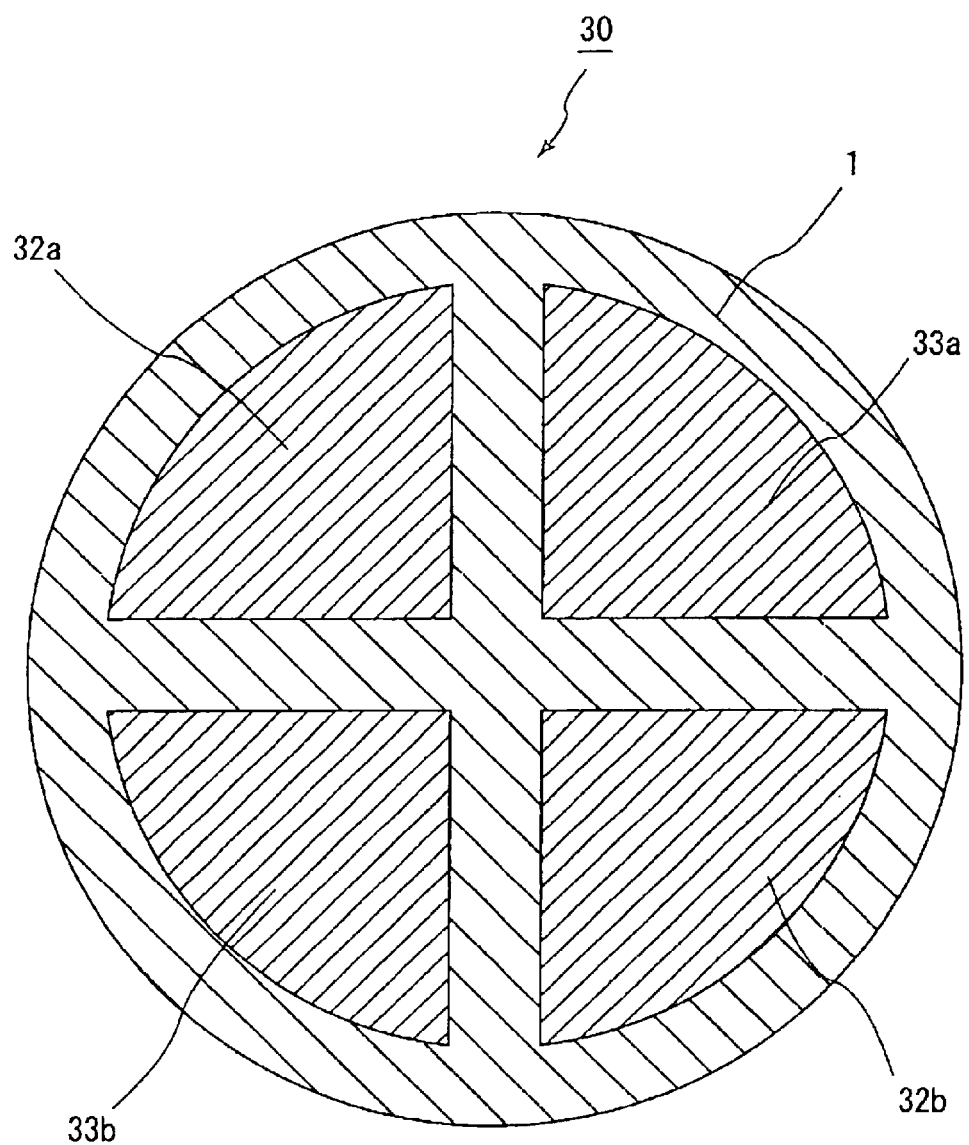
FIG. 14 is a horizontal, sectional view schematically showing a shape of electrostatic electrodes which constitute an electrostatic chuck of the present invention.

FIG. 13 and FIG. 14 are horizontal, sectional views each schematically showing a shape of an electrostatic electrode in another electrostatic chuck of the present invention. In an electrostatic chuck 20 shown in FIG. 13, a chuck positive electrostatic layer 22 and a chuck negative electrostatic layer 23 each having a semicircular shape are formed inside the ceramic substrate 1. In an electrostatic chuck shown in FIG. 14, chuck positive electrostatic layers 32a, 32b and chuck negative electrostatic layers 33a, 33b each having a shape obtained by dividing the circle in four are formed inside the ceramic substrate 1.

The two chuck positive electrostatic layers 22a, 22b and the two chuck negative electrostatic layers 33a, 33b are formed to cross each other.

In case that the electrodes are formed so as to have a shape of a divided circle and the like, the number of division is not particularly restricted and may be five or larger. The shape of each divided portion is not restricted to a sector form, either.

Figure 7:
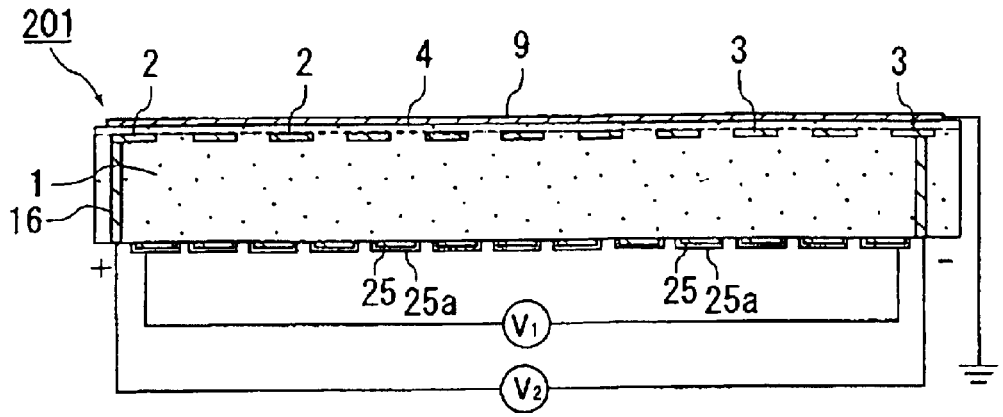
FIG. 7 is a sectional view which schematically shows one example of an electrostatic chuck of the present invention.
Figure 8:
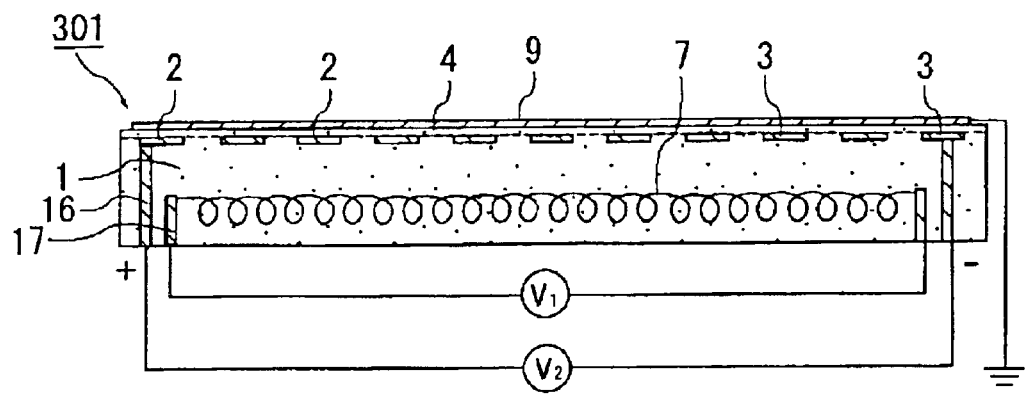
FIG. 8 is a sectional view which schematically shows one example of an electrostatic chuck of the present invention.
Figure 9:
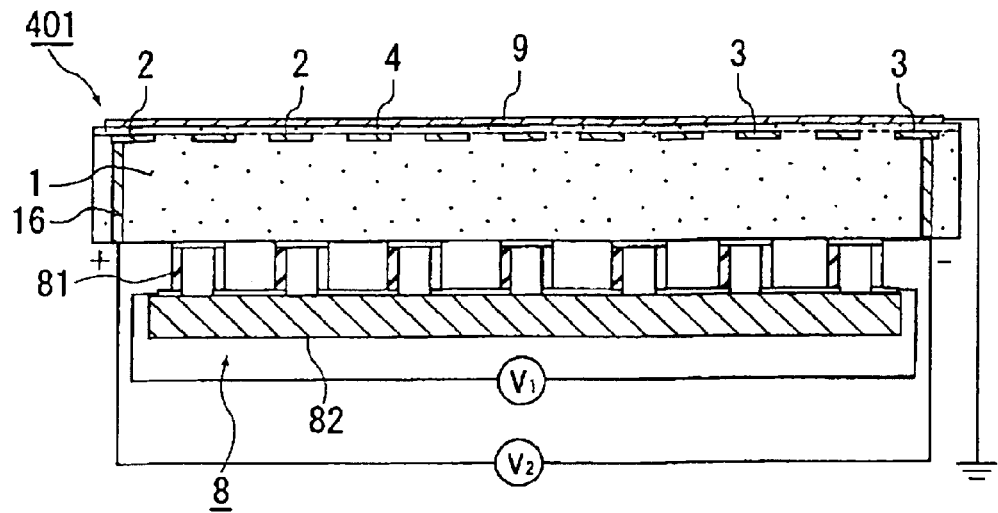
FIG. 9 is a sectional view which schematically shows one example of an electrostatic chuck of the present invention.

Examples of the electrostatic chuck of the present invention include: an electrostatic chuck 101 having a structure in which, as shown in FIG. 4, the chuck positive electrostatic layer 2 and the chuck negative electrostatic layer 3 are formed between the ceramic substrate 1 and the ceramic dielectric film 4, and the resistance heating element 5 is provided inside the ceramic substrate 1; an electrostatic chuck 201 having a structure in which, as shown in FIG. 7, the chuck positive electrostatic layer 2 and the chuck negative electrostatic layer 3 are formed between the ceramic substrate 1 and the ceramic dielectric film 4, and the resistance heating element 25 is provided at the bottom face of the ceramic substrate 1; an electrostatic chuck 301 having a structure in which, as shown in FIG. 8, the chuck positive electrostatic layer 2 and the chuck negative electrostatic layer 3 are formed between the ceramic substrate 1 and the ceramic dielectric film 4, and a metal wire 7 as a resistance heating element is embedded inside the ceramic substrate 1; and an electrostatic chuck 401 having a structure in which, as shown in FIG. 9, the chuck positive electrostatic layer 2 and the chuck negative electrostatic layer 3 are formed between the ceramic substrate 1 and the ceramic dielectric film 4, and a Peltier device consisting of a thermoelectric-element 81 and a ceramic plate 82 is formed at the bottom face of the ceramic substrate 1; and the like.

As shown in FIG. 9, in case that the Peltier device is used as the temperature controlling mean, either heating or cooling can be performed by the same element by changing the flow direction of the current, which is advantageous.

The Peltier device 8 is formed by connecting p-type and n-type thermoelectric-elements 81 in series and attaching these thermoelectric-elements 81 to the ceramic plate 82 and the like, as shown in FIG. 9. Examples of the Peltier device include the silicon/germanium-type Peltier device, the bismuth/antimony-type Peltier device, the lead/tellurium-type Peltier device and the like.

In the present invention, as shown in FIGS. 4 to 9, the chuck positive electrostatic layer 2 and the chuck negative electrostatic layer 3 are provided between the ceramic substrate 1 and the ceramic dielectric film 4, and the resistance heating element 5 and the metal wire 7 are formed inside the ceramic substrate 1. As a result, connecting units (conductor filled through holes) 16, 17 for connecting these with the external terminals, are required, respectively. The conductor filled through holes 16, 17 are formed by filling a metal having a high melting point such as tungsten paste and molybdenum paste or a conductive ceramic such as tungsten carbide and molybdenum carbide. Further, connecting units (conductor filled through holes) 16, 17 are necessary. The conductor filled through holes 16, 17 are formed by filling a conductive ceramic such as tungsten carbide and molybdenum carbide. Here, the diameter of the connecting units (conductor filled through holes) 16, 17 is preferably in a range of 0.1 to 10 mm, because when the diameter of the connecting units is within this range, not only occurrence of disconnection of the wires but also generation of cracks or strains can be prevented. External terminals 6, 18 are connected thereto by using the conductor filled through holes as connection pads. (reference to FIG. 10(*d*)). Such connection is performed by using solder or brazing material. As the brazing material, silver braze, palladium braze, aluminum braze and gold braze are preferable. As the gold braze, Au—Ni alloy is preferable because Au—Ni alloy exhibits excellent adhesion property with tungsten.

The ratio of Au/Ni is preferably [81.5 to 82.5 (weight %)]/[18.5 to 17.5 (weight %)].

The thickness of the Au—Ni layer is preferably in a range of 0.1 to 50 μm, because a reliable connection is obtained when the thickness of the Au—Ni layer is within this range. In the case of Au—Cu alloy, the alloy exhibits deterioration when used in a high vacuum of $10^{-6}$ to $10^{-5}$ Pa in a high temperature range of 500 to 1000° C. On the other hand, the Au—Ni alloy does not exhibit such a deterioration in such a severe condition, which is advantageous. The content of the impurity elements contained in the Au—Ni alloy is preferably less than 1 parts by weight when the whole weight of the Au—Ni alloy is expressed as 100 parts by weight.

In the ceramic substrate of the present invention, a thermocouple may be embedded in the bottomed hole of the ceramic substrate, according to the necessity. In this case, the temperature thereof can be measured by the thermocouple, so that the temperature of the resistance heating element can be controlled by changing the voltage and the current flow on the basis of the obtained data.

The size of the connecting portion of the metal wire of the thermocouple is preferably the same as or larger than the strand diameter of each metal wire, but 0.5 mm or less. The heat capacity of the connecting portion is made small by such a structure, whereby the temperature is converted correctly and rapidly into the current value. As a result, the temperature controlling property is improved, whereby the temperature distribution on the heating face of the wafer is made small.

Examples of the abovementioned thermocouple include the K-type, the R-type, the B-type, the S-type, the E-type, the J-type and the T-type thermocouples, as are listed in JIS-C-1602 (1980).

Figure 15:
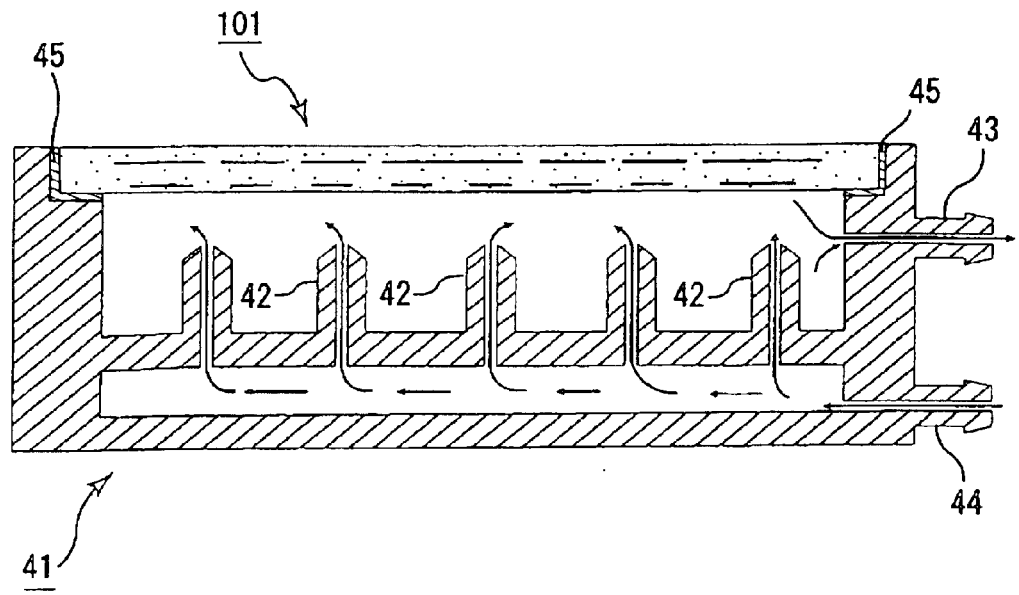
FIG. 15 is a sectional view which schematically shows a state in which the electrostatic chuck of the present invention is fitted in a supporting case.

FIG. 15 is a sectional view which schematically shows a supporting case 41 in which the electrostatic chuck having a structure as described above is fitted.

The supporting case 41 is designed such that the electrostatic chuck 101 is fitted therein through a heat insulator 45. In the supporting case 41, a coolant outlet 42 is formed such that the coolant introduced from a coolant inlet 44 is discharged outside from an inhalation duct 43 by passing through the coolant outlets 42. By the action of the coolant, the electrostatic chuck 101 can be cooled.

The resistance heating element may be provided inside the ceramic substrate as shown in FIG. 4 or may be provided at the bottom face of the ceramic substrate as shown in FIG. 7. In case that the resistance heating element is provided, an opening for blowing a coolant such as air and the like as a cooling means may be provided in the supporting case in which the electrostatic chuck is fitted.

Examples of the resistance heating element include a sintered body of metal or conductive ceramic, a metal foil, a metal wire and the like. As the metal sintered body, at least one kind of element selected from tungsten and molybdenum is preferable, because these metals are relatively less likely to be oxidized and have a sufficient resistance value for generating heat.

As the conductive ceramic, at least one kind selected from carbides of: tungsten; and molybdenum is preferably used.

Further, in case that the resistance heating element is formed at the bottom face of the ceramic substrate, it is preferable to use rare metal (gold, silver, palladium, platinum) or nickel as the metal sintered body. Specifically, silver, silver-palladium and the like can be preferably used.

The shape of the metal particles used for producing the metal sintered body may be either spherical or scaly. In the case in which these metal particles are used, both spherical particles and scaly particles may be used in a mixed manner.

A metal oxide may be added to the metal sintered body. The metal oxide is used in order to let the metal particles adhere to the ceramic substrate. The reason why the metal oxide improves the adhesion of the metal particles to the ceramic substrate is not clearly known. A thin oxidized film is formed on the surface of the metal particle, and an oxidized film is also formed on the surface of the ceramic substrate, regardless of whether the ceramic substrate is oxide ceramic or non-oxide ceramic. It is thus assumed that the oxidized film of the metal particle and that of the ceramic substrate are sintered and integrated together byway of the metal oxide so that metal particles adhere to the ceramic substrate.

As the metal oxide, at least one kind of compound selected from the group consisting of lead oxide, zinc oxide, silica, boron oxide ($B_2O_3$), alumina, yttria and titania is preferably used, because these oxides can improve adhesion of the metal particles to the ceramic substrate without increasing the resistance value of the resistance heating element too much.

The content of the metal oxide is preferably in a range of 0.1 or more and less than 10 parts by weight with respect to 100 parts by weight of the metal particles.

By using the metal oxide within the abovementioned range, the adhesion between the metal particles and the ceramic substrate can be improved without increasing the resistance value too much.

The proportion of lead oxide, zinc oxide, silica, boron oxide ($B_2O_3$), alumina, yttria and titania are preferably 1 to 10 parts by weight for lead oxide, 1 to 30 parts by weight for silica, 5 to 50 parts by weight for boron oxide, 20 to 70 parts by weight for zinc oxide, 1 to 10 parts by weight for alumina, 1 to 50 parts by weight for yttria and 1 to 50 parts by weight for titania, with respect to the whole weight of the metal oxides expressed as 100 parts by weight. It is preferable that the contents of the metal oxides are adjusted in the manner that the total sum of the metal oxides does not exceed 100 parts by weight, because these metal oxides can especially improve adhesion thereof to the ceramic substrate when being used in such a range.

In case that the resistance heating element is provided at the bottom face of the ceramic substrate, the surface of the resistance heating element is preferably covered with a metal layer. As the resistance heating element is a sintered body of metal particles, the resistance heating element is easily oxidized if it is exposed in the air, and the resistance value thereof changes due to the oxidization. By covering the surface of the resistance heating element with a metal layer, such oxidization can be prevented.

The thickness of the metal layer is preferably in a range of 0.1 to 10 $\mu$m. When the thickness of the metal layer is within this range, the oxidization of the resistance heating element can be prevented without changing the resistance value of the resistance heating element too much.

The metal used for the metal layer of covering is not particularly limited, as long as the metal is not oxidized. Specific examples thereof include at least one element selected from the group consisting of gold, silver, palladium, platinum and nickel. Among these examples, nickel is more preferable. The resistance heating element requires a terminal for connecting itself to the power source, and this terminal is mounted to the resistance heating element by using solder. Nickel effectively prevents the thermal diffusion of solder. As the terminal for connection, a terminal pin made of kovar can be used.

In case that the resistance heating element is formed inside the ceramic substrate, the surface of the resistance heating element is not oxidized and thus no covering by the metal layer is required. When the resistance heating element is formed inside the ceramic substrate, a portion of the surface of the resistance heating element may be exposed outside.

Preferable examples of the metal foil used as the resistance heating element include a resistance heating element produced by a pattern-forming such as etching and the like of nickel foil or stainless foil.

The metal foils which have been subjected to the pattern-forming may be put together by a resin film and the like.

Example of the metal wire include a tungsten wire, a molybdenum wire and the like.

In case that: conductors are provided on the surface and inside the ceramic substrate, respectively; and the conductor provided inside the ceramic substrate is at least one of a guard electrode or a ground electrode, the ceramic substrate functions as a wafer prober.

Figure 16:
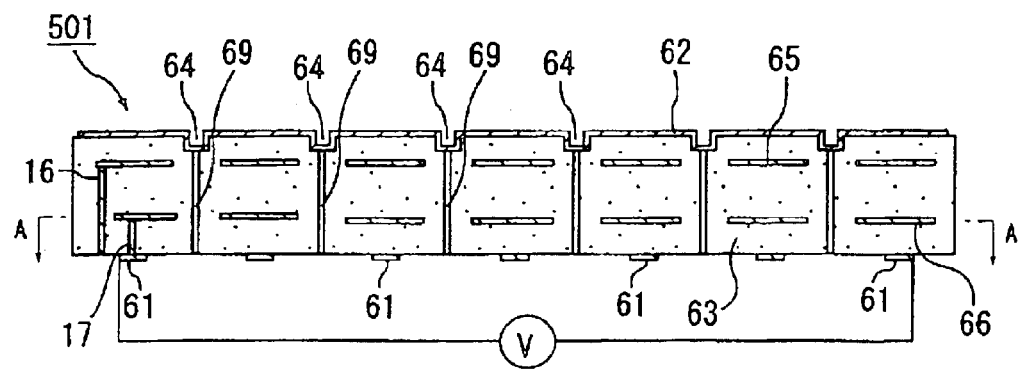
FIG. 16 is a sectional view which schematically shows a wafer prober as one embodiment of the ceramic substrate of the present invention.
Figure 17:
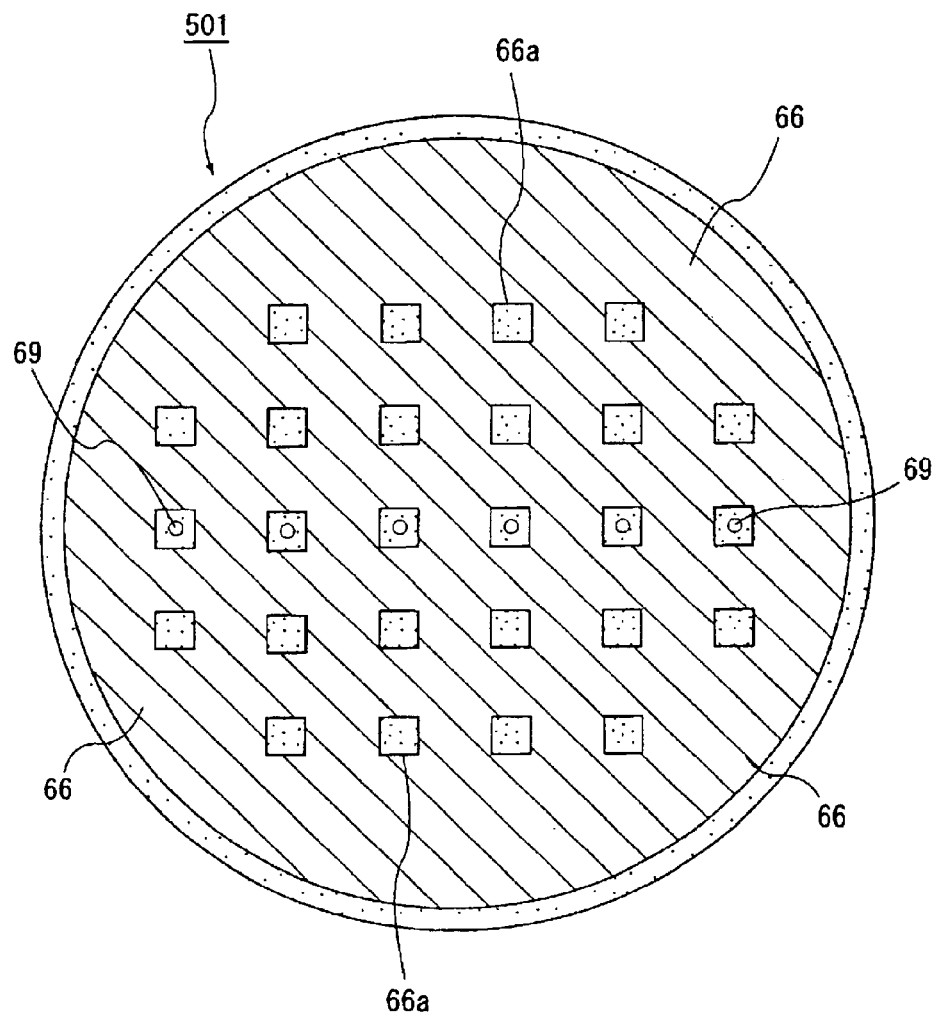
FIG. 17 is a sectional view which schematically shows a ground electrode of the wafer prober shown in FIG. 16.

FIG. 16 is a sectional view which schematically shows one example of the wafer prober as one embodiment of the ceramic substrate of the present invention. FIG. 17 is a sectional view along A—A line of the wafer prober shown in FIG. 16.

In a wafer prober 501, grooves 64 of concentric circles as viewed from the above are formed on the surface of the ceramic substrate 63 having the circular shape as viewed from the above, a plurality of suction holes 69 for sucking the silicon wafer are formed at a portion of the grooves 64, and a chuck top conductor layer 62 in a circular shape for connecting the electrode of the silicon wafer is formed on most part of the ceramic substrate 63 including a portion of the groove 64.

On the other hand, a heating element 61 in the shape of a concentric-circles as viewed from the above, as shown in FIG. 6 is provided at the bottom face of the ceramic substrate 63, so that the temperature of the silicon wafer can be controlled by the heating element 61. External terminals (not shown) are fixed and connected to both ends of the heating element 61. Guard electrodes 65 and ground electrodes 66 in the shape of lattice as viewed from the above, as shown in FIG. 16, are provided inside the ceramic substrate 63, so that stray capacitor and noises can be eliminated by the guard electrodes and the ground electrodes. As the material of the guard electrodes 65 and the ground electrodes 66, the same material as that of the electrostatic electrode can be used.

The thickness of the chuck top conductor 62 is preferably in a range of 1 to 20 $\mu$m. When the thickness of the chuck top conductor 62 is less than 1 $\mu$m, the resistance value of the chuck top conductor is too high to work as an electrode. On the other hand, when the thickness of the chuck top conductor 62 exceeds 20 $\mu$m, the chuck top conductor is likely to separate due to the stress the conductor itself has.

Examples of the metal to be used for the chuck top conductor 62 include at least one kind of metal selected from the group consisting of copper, titanium, chromium, nickel, rare metal (gold, silver, platinum etc.), high-melting point metals such as tungsten and molybdenum and the like.

In a wafer prober having such a structure as described above, a continuity test can be carried out by: setting a silicon wafer on which an integrated circuit has been formed, on the wafer prober; bringing a probe card having a tester pin into contact with the silicon wafer, by pushing the probe card on the silicon wafer; and applying a voltage while heating and cooling the silicon wafer.

According to the third aspect of the present invention, the binding force between the grains of the ceramic substrate 63 constituting the wafer prober is significantly strong and the particles are prevented from coming off, whereby attachment of free particles to the silicon wafer which is put on the wafer prober can be prevented.

According to the fourth aspect of the present invention, the average grain diameter of the ceramic grains of the ceramic substrate 63 constituting the wafer prober is adjusted so as to be 2 μm or less. In this case, the ceramic substrate 63 is likely to exhibit intragranular fracture, the ceramic particles are less likely to come off and the average particle diameter of the particles which come off is 2 μm or less, whereby attachment of the free particles to the silicon wafer is not likely to cause a serious problem.

Next, a method of producing the ceramic substrate of the present invention will be described.

A method of producing the ceramic heater (reference to FIGS. 1, 2) of the present invention in which a resistance heating element is formed inside the ceramic substrate, will be described hereinafter with reference to FIGS. 12(a) to (d).

(1) Production Process of the Ceramic Substrate

The powder of ceramic such as nitride ceramic and the like whose average particle diameter is 0.2 to 1.5 μm is mixed with a binder, a solvent and the like, thereby to prepare a paste. By using the paste, a green sheet is produced.

As the abovementioned ceramic powder, aluminum nitride and the like, for example, can be used. A sintering aid such as yttria and the like, a compound containing Na, Ca and the like may be added to the ceramic powder, according to the necessity.

When yttria is added, the amount thereof to be added is preferably 1.0 parts by weight or less and more preferably 0.3 parts by weight or less with respect to 100 parts by weight of the raw material powder.

As the binder, at least one kind of binder selected from the group consisting of an acrylic binder, an ethyl cellulose, a butyl cellosolve and polyvinylal is preferably used.

As the solvent, at least one kind of solvent selected from α-terpineol and glycol is preferably used.

Sulfur or a sulfur compound may be added when the abovementioned ceramic powder is mixed with the binder and the solvent.

As the sulfur compound, an organic compound such as the abovementioned thermoplastic resin and the like or an inorganic compound such as calcium sulfate and the like may be used. Use of the organic compound is advantageous because the organic compound itself serves as a binder. A method of bringing the plate or powder of the abovementioned inorganic compound into contact with the sintered body and heating the components at 1500 to 1900° C., thereby heat-diffusing the inorganic compound thereto, may be employed, based on the necessity.

By forming the paste obtained as a result of mixing the abovementioned components to a sheet-like form according to the doctor blade method, a green sheet 60 is produced.

The thickness of the green sheet 60 is preferably in a range of 0.1 to 5 mm.

Next, in the obtained green sheet 60, a portion which will be the through hole 15 in which a lifter pin 26 for transferring the object to be heated such as a silicone wafer and the like is inserted, a portion which will be as the bottomed hole 14 in which the temperature measuring element such as thermocouple and the like is embedded, a portion which will be a conductor filled through hole 19 for connecting the resistance heating element 12 with the external terminal 13, are formed, based on the necessity. This process may be carried out after forming the green sheet lamination described below.

(2) Process of Printing Conductor Containing Paste on the Green Sheet

The metal paste or the conductor containing paste containing the conductive ceramic for forming the resistance heating element is printed on the green sheet 60, to form the conductor containing paste layer 620. A filled layer of a conductor containing paste 68 for the conductor filled through hole 19 is formed at the through hole.

Metal particles or conductive ceramic particles are contained in the conductor containing paste.

The average particle diameter of tungsten particles or molybdenum particles is preferably in a range of 0.1 to 5 μm. When the average particle diameter thereof is smaller than 0.1 μm or exceeds 5 μm, the conductor containing paste can no longer be easily printed on the green sheet.

Examples of such conductor containing paste include a composite (paste) which is obtained by mixing: 85 to 87 parts by weight of metal particles or conductive ceramic particles; 1.5 to 10 parts by weight of at least one kind of binder selected from the group consisting of an acrylic binder, an ethyl cellulose, a butyl cellosolve and polyvinylal; 1.5 to 10 parts by weight of at least one kind of solvent selected from x-terpineol and glycol.

(3) Process of Laminating the Green Sheets

A green sheet 60 on which the conductor containing paste has not been printed is laminated on, above and under a green sheet 60 on which the conductor containing paste has been printed (reference to FIG. 12(a)).

Here, the green sheets are laminated so that the green sheet 60 on which the conductor containing paste has been printed is positioned within the distance of 60% of the green sheet lamination as measured from the bottom face thereof.

Specifically, the number of the green sheets laminated above the green sheet 60 on which the conductor containing paste has been printed is preferably in a range of 20 to 50 sheets and the number of the green sheets laminated under the green sheet 60 on which the conductor containing paste has been printed is preferably in a range of 5 to 20 sheets.

(4) Firing Process of the Green Sheet Lamination

Figure 12:
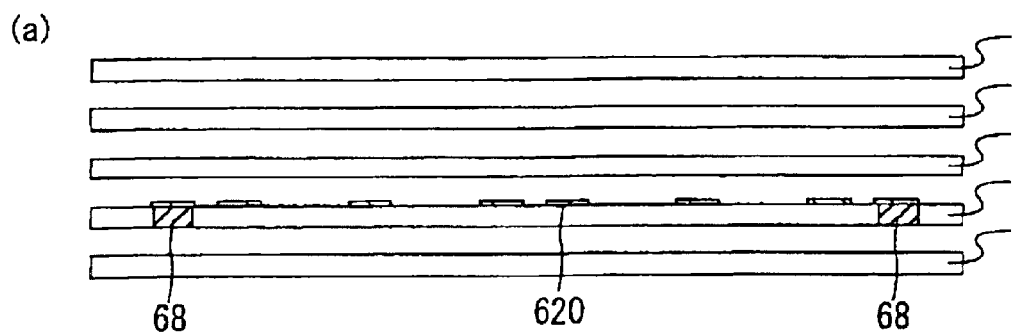
FIGS. 12 (a) to (d) are sectional views which schematically show a part of a production process of a ceramic substrate of the present invention.
Figure 12:
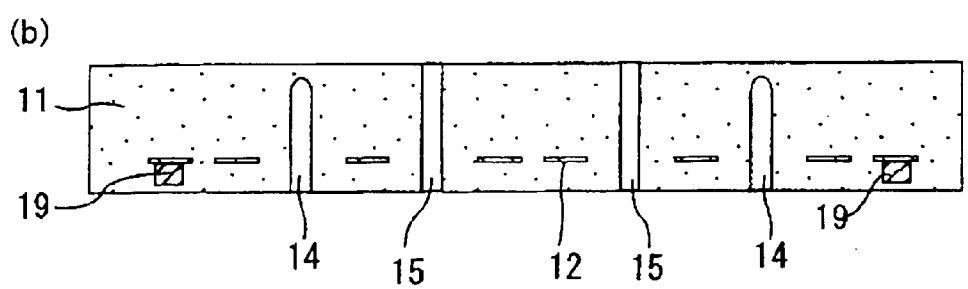
Figure 12:
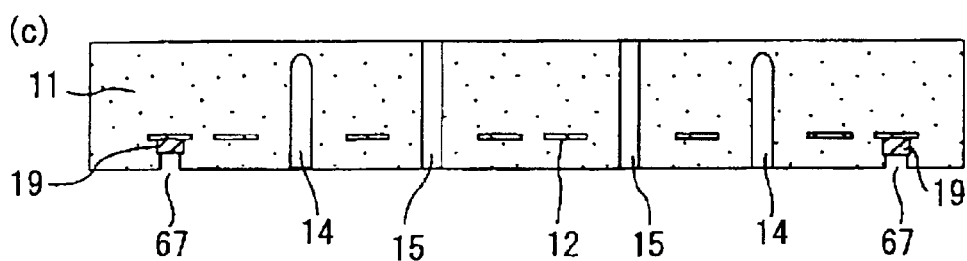
Figure 12:
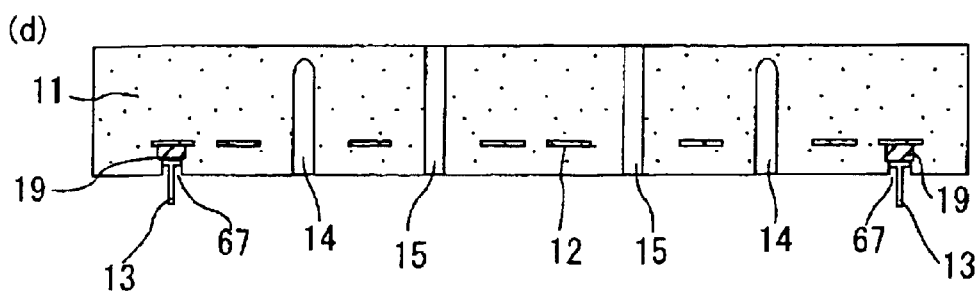

The green sheet lamination is subjected to heating and pressurizing, so that the ceramic powder in the green sheet and the metal and the like in the conductor containing paste in the green sheet lamination are sintered (reference to FIG. 12 (b)).

For example, in the nitride ceramic, the heating temperature is preferably in a range of 1000 to 2000° C., more preferably 1600° C. or more and less than 1800° C. and further preferably in a range of 1700 to 1750° C. The pressure for pressurizing is preferably within a range of 10 to 25 MPa. Heating is carried out in an inert gas atmosphere. As the inert gas, argon, nitrogen and the like, for example, may be used.

By changing the abovementioned factors including the amount of sulfur to be added, the content of oxygen, the amount of yttria to be added, and the condition of the heating and pressurizing of the green sheet lamination and the like, the state of the sectional view of fracture of the ceramic substrate and the average grain diameter of the ceramic grains can be adjusted.

In short, by producing the ceramic substrate 11 as described above, the ceramic substrate according to the third aspect of the present invention, which exhibits the state of intragranular fracture at the time of fracture, can be obtained. Further, the ceramic substrate according to the fourth aspect of the present invention in which the average grain diameter of the ceramic grains is 2 μm or less can be obtained.

Formation of the bottomed hole 14 in which the temperature measuring element is fitted, the through hole 15 which the lifter pin is passed through and the blind hole 67 at which the conductor filled through hole 19 is exposed, are generally carried out after the sintering process (reference to FIG. 12(c)). The through hole 15 and the bottomed hole 14 can be formed, after the grinding of the substrate surface, by blast treatment such as sand blasting and the like.

(5) Attaching of the Terminals and the Like

Solder paste and the like is applied to the exposed portion of the conductor filled through hole 19 and then the external terminal 13 is inserted into the blind hole 67 for obtaining connection with the resistance heating element 12 inside the ceramic substrate. By conducting heating and reflowing, the external terminal 13 is connected to the resistance heating element 12 (reference to FIG. 12(d)).

Further, a thermocouple as the temperature measuring element (not shown) and the like is inserted into the bottomed hole 14 and the bottomed hole 14 is sealed with a heat resistant resin and the like such as polyimide, whereby the production of the ceramic heater 10 is completed.

Next, a method of producing the ceramic heater (reference to FIG. 3) of the present invention in which a resistance heating element is formed at the bottom face of the ceramic substrate, will be described hereinafter with reference to FIGS. 11(a) to (d).

(1) Production Process of the Ceramic Substrate

The powder of ceramic such as aluminum nitride whose average particle diameter is 0.2 to 1.5 $\mu$m is mixed, according to necessity, with a sintering aid such as yttria ($Y_2O_3$), a compound containing Na, Ca, a binder and the like, to prepare a slurry. This slurry is processed so as to be in a granular state by a spray dry method and the like. The obtained granules are filled in a mold and the like and pressed to form a plate shape, whereby a formed body (green) is produced.

When yttria is added, the amount thereof to be added is preferably 1.0 parts by weight or less and more preferably 0.3 parts by weight or less with respect to 100 parts by weight of the raw material powder.

Sulfur or a sulfur compound may be added when the abovementioned ceramic powder is mixed with the binder and other materials.

The ceramic substrate can also be produced by the CVD method, in addition to the abovementioned sintering method. Specifically, the ceramic substrate can be obtained by: forming a thick film on the base material; and cutting the base material.

For example, a SiC substrate can be obtained by: heat-decomposing halogenated organic silane in a reducing gas atmosphere at a temperature of 1000 to 1500° C. such that SiC is accumulated on a graphite base material; and removing the base material by cutting. The SiC substrate obtained in such a manner has extremely fine grains whose average grain diameter is 0.5 to 1 m. Examples of the raw material gas include $CH_3SiCl_3/H_2$; $(CH_3)_2SiCl_2/H_2$; $(CH_3)_3SiCl/H_2$; $(CH_3)_4Si/H_2$; $CH_3SiHCl_2/H_2$; $SiCl_4$, $CH_3/H_2$; $SiCl_4$, $C_3H_8/H_2$; $SiCl_4$, $C_6H_{14}/H_2$ and the like. The carrier gas may be hydrogen, argon and the like. The flow rate is for instance, 2 to 3.5 L/minute.

Next, in the obtained formed body, a portion which will be the through hole 95 which a lifter pin 96 for transferring the object to be heated such as a silicon wafer 99 and the like is passed through, a portion which will be the bottomed hole 94 in which the temperature measuring element such as a thermocouple and the like is embedded, and the like are formed based on the necessity.

Next, the obtained formed body is heated and fired to conduct sintering, whereby a plate-shaped body made of ceramic is produced. Thereafter, by processing the plate-shaped body to a predetermined form, the ceramic substrate 91 is produced (reference to FIG. 11(a)). The plate-shaped body may be processed so as to have a form which allows the product to be used right after the firing process without conducting any further treatment. For example, by carrying out heating and firing with pressurizing from the upper and the lower sides, a ceramic substrate 91 having no pore can be produced. Regarding the heating and firing, for example, for the nitride ceramic, the firing temperature is preferably in a range of 1000 to 2000° C., more preferably is 1600° C. or more and less than 1800° C. and further preferably in a range of 1700° C. to 1750° C. The pressure for pressurizing is preferably within a range of 10 to 25 MPa.

By changing the abovementioned factors including the amount of sulfur to be added, the content of oxygen, the amount of yttria to be added, and the condition of the heating and pressurizing of the formed body and the like, the state of the sectional view of fracture of the ceramic substrate and the average grain diameter of the ceramic grains can be adjusted.

In short, by producing the ceramic substrate 91 with adjusting the conditions as described above, the ceramic substrate according to the third aspect of the present invention, which exhibits the state of intragranular fracture at the time fracture, can be obtained. Further, the ceramic substrate according to the fourth aspect of the present invention in which the average grain diameter of the ceramic grains is 2 $\mu$m or less can be obtained in such a manner.

Formation of the through hole 95 and the bottomed hole 94 in which the temperature measuring element is inserted is generally carried out after the firing process. The through hole 95 and the like can be formed, after the grinding of the substrate surface, by blast treatment such as sand blasting with SiC particles and the like.

(2) Process of Printing the Conductor Containing Paste on the Ceramic Substrate

A conductor containing paste is generally a fluid having high viscosity, comprising metal particles, a resin and a solvent. By printing, by screen printing and the like, this conductor containing paste on a portion of the ceramic substrate at which portion the resistance heating element is to be provided, a conductor containing paste layer is formed. As the resistance heating element is required to make the temperature of the ceramic substrate as a whole even, it is preferable that the resistance heating element is printed so as to have a pattern having a concentric circles shape as shown in FIG. 1.

It is preferable that the conductor containing paste layer is formed such that the section of the resistance heating element 92 after sintering has a square and flat section.

(3) Firing of the Conductor Containing Paste

The conductor containing paste layer printed on the bottom face of the ceramic substrate 91 is heated and fired, thus the resin and the solvent are removed and the metal particles are sintered and baked on the bottom face of the ceramic substrate 91, whereby the resistance heating element 92 is formed (reference to FIG. 11(b)). The temperature of the heating and sintering process is preferably in a range of 500 to 1000° C.

When the abovementioned metal oxide is added to the conductor containing paste, the metal particles, the ceramic substrate and the metal oxide are sintered together and integrated, whereby adhesion between the resistance heating element and the ceramic substrate is improved.

(4) Formation of the Metal Covering Layer

A metal covering layer 92a is generally provided on the surface of the resistance heating element 92, so that oxidization of the resistance heating element 92 is prevented (reference to FIG. 11(c)). The metal covering layer 92a can be formed by electrolytic plating, electroless plating, spattering and the like. Among these methods, electroless plating is the most preferable in terms of high productivity.

(5) Attaching of the Terminals and the Like

Terminals (external terminals 93) for making connection to the power source are attached to the end portions of the pattern of the resistance heating element 92 through a solder layer (not shown) (reference to FIG. 11(d)). A thermocouple is inserted in the bottomed hole 94 and the bottomed hole 94 is sealed by using a heat resistant resin and the like, such as polyimide, whereby the production of the ceramic heater 90 is completed.

Next, one example of the method of producing the electrostatic chuck of the present invention will be described with reference to the sectional views shown in FIGS. 10(a) to (d).

(1) First, a Green Sheet 50 is Obtained by Mixing Powder of Ceramic Such as Carbide Ceramic and the Like with a Binder and a Solvent As the ceramic powder, for example, aluminum nitride powder containing oxygen and the like, which is obtained by firing aluminum nitride powder in an oxidizing atmosphere, can be used.

A sintering aid such as alumina and silica and the like, as well as a catalyst, may be added to the ceramic powder, based on the necessity.

Further, when the ceramic powder is mixed with the binder and the solvent, sulfur or a sulfur compound may be added thereto, similarly to the case of the abovementioned ceramic substrate.

The green sheet/green sheets 50' comprising one or a few of green sheet, which is laminated on the green sheet having the electro static electrode layer printed body 51 formed thereon, is the layer which will be the ceramic dielectric film 4. Accordingly, the green sheet 50' may have a different composition from that of the ceramic substrate based on necessity.

In general, it is preferable that the raw material of the ceramic dielectric film 4 and that of the ceramic substrate 1 are the same because then the ceramic dielectric film 4 and the ceramic substrate 1 can share the same sintering conditions since the ceramic dielectric film and the ceramic substrate are usually sintered together. However, in case that the material of the ceramic dielectric film 4 is different from that of the ceramic substrate 1, it is acceptable that the ceramic substrate is produced first, the electrostatic electrode layer is formed thereon and the ceramic dielectric film is formed further thereon.

As the binder, at least one kind of binder selected from the group consisting of an acrylic binder, an ethyl cellulose, a butyl cellosolve and polyvinylal is preferably used.

As the solvent, at least one kind of solvent selected from α-terpineol and glycol is preferably used.

The paste obtained by mixing the abovementioned components is formed into a sheet shape by the doctor blade method, whereby the green sheet 50 is produced.

A through hole which a lifter pin of the silicon wafer is passed through and a concave portion in which thermocouple is embedded may be formed in the green sheet 50, based on the necessity. The through hole and the concave portion can be formed by punching and the like.

The thickness of the green sheet 50 is preferably in a range of 0.1 to 5 mm.

Next, the conductor containing paste is filled in the through hole of the green sheet 50, whereby conductor filled through hole printed bodies 53, 54 are obtained. The conductor containing paste which will be the electrostatic electrode layer or the resistance heating element is printed on the green sheet 50.

The printing is performed in consideration of the shrinking rate of the green sheet 50 so that a desirable aspect ratio is obtained, where by the electro static electrode layer printed body 51 and the resistance heating element layer printed body 52 are obtained.

The printed body is formed by printing the conductor containing paste containing conductive ceramic, metal particles and the like.

As the conductive ceramic particles contained in the conductor containing paste, a carbide of: tungsten; or molybdenum is the most preferable because such a carbide is less likely to be oxidized and the heat conductivity thereof is less likely to drop, as compared with other materials.

Examples of the metal particle include particles of tungsten, molybdenum, platinum, nickel and the like.

The average particle diameter of the conductive ceramic particles and the metal particles is preferably in a range of 0.1 to 5 μm. If the particle size is too large or small, it is difficult to conduct printing with such a conductor containing paste.

As such a conductor containing paste, a conductor containing paste which is prepared by mixing: 85 to 97 parts by weight of metal particles or conductive ceramic particles; 1.5 to 10 parts by weight of at least one kind of binder selected from the group consisting of an acrylic binder, an ethyl cellulose, a butyl cellosolve and polyvinyl alcohol; 1.5 to 10 parts by weight of at least one kind of solvent selected from α-terpineol, glycol, ethyl alcohol and butanol, is most preferably used.

The conductor containing paste is filled in the hole formed by punching and the like, whereby the conductor filled through hole printed bodies 53, 54 are obtained.

Next, as shown in FIG. 10(a), a green sheet 50 having the printed bodies 51, 52, 53, 54 is laminated with the green sheet 50'. The green sheet 50' which does not have the printed body is laminated on the side on which the resistance heating element is formed, this is for preventing the end face of the conductor filled through hole from being exposed. Thus, the end face is prevented from being oxidized during firing when the resistance heating element is formed. If the firing is to be performed when the resistance heating element is formed in a state that the end face of the conductor filled through hole is exposed, a metal such as nickel which is less likely to be oxidized needs to be provided thereon by spattering. More preferably, the end face may be covered by a gold braze of Au—Ni.

(2) Next, as Shown in FIG. 10(b), the Lamination is Subjected to Heating and Pressurizing, Whereby the Green Sheet and the Conductor Containing Paste are Sintered The heating temperature is preferably in a range of 1000 to 2000° C., more preferably 1600° C. or more and less than 1800° C. and further preferably in a range of 1700 to 1750° C. The pressurizing is preferably within a range of 10 to 25 MPa (100 to 250 kgf/cm$^2$) The heating and pressurizing are applied in an inert gas atmosphere. As the inert gas, argon, nitrogen and the like, for example, may be used.

By changing the abovementioned factors including the amount of sulfur to be added, the content of oxygen, the amount of yttria to be added, and the condition for heating and pressurizing the formed body, the state of the sectional view of fracture of the ceramic substrate and the average grain diameter of the ceramic grains can be adjusted, similarly to the case of the ceramic heater 10.

By this process, the conductor filled through holes 16, 17, the chuck positive electrostatic layer 2, the chuck negative electrostatic layer 3, the resistance heating element 5 and the like are formed.

(3) Next, as Shown in FIG. 10(c), Blind Holes 35, 36 for Connecting External Terminals are Formed It is preferable that at least a portion of the inner walls of the blind holes 35, 36 are made conductive and the conductive inner walls are connected to the chuck positive electrostatic layer 2, the chuck negative electrostatic layer 3, the resistance heating element 5 and the like.

(4) Finally, as Shown in FIG. 10(d), the External Terminals 6, 18 are Provided to the Blind Holes 35, 36 Through Gold Braze In addition, a bottomed hole may be formed so that thermocouple can be embedded therein, based on the necessity.

As solder, alloys of silver-lead, lead-tin, bismuth-tin and the like can be used. The thickness of the solder is preferably in a range of 0.1 to 50 μm. When the thickness of the solder is within this range, connection by the solder is reliably ensured in a sufficient manner.

In the abovementioned example, the electrostatic chuck 101 (reference to FIG. 4) has been described. In case that the electrostatic chuck 201 (reference to FIG. 7) is to be produced, a ceramic plate having an electrostatic electrode layer is firstly produced, the conductor containing paste is printed on the bottom face of the ceramic plate, then the sintering is conducted to form a resistance heating element 25, and thereafter a metal covering layer 25a is formed by electroless plating and the like. In case that the electrostatic chuck 301 (reference to FIG. 8) is to be produced, a metal foil as the electrostatic electrode and a metal wire as the resistance heating element are embedded in the ceramic powder and then sintering is conducted.

In case that the electrostatic chuck 401 (reference to FIG. 9) is to be produced, a ceramic plate having an electrostatic electrode layer is produced and then a Peltier device 8 is joined on the ceramic plate through a flame sprayed metal layer.

Further, in case that a wafer prober is to be produced, a ceramic plate having a resistance heating element embedded therein is firstly produced similarly to the case of the electrostatic chuck, for example, thereafter grooves are formed on the surface of the ceramic substrate, and then spattering and plating and the like are applied on the surface portion where the groove has been formed, whereby a metal layer is formed.

The aluminum nitride sintered body of the first and the second aspects of the present invention, as well as the ceramic substrate of the present invention, can be applied to a hot plate (ceramic heater), an electrostatic chuck, a wafer prober, a susceptor and the like for producing/examining a semiconductor.

The fifth aspect of the present invention provides a ceramic substrate having a conductor formed inside thereof, for a semiconductor producing/examining device,
wherein:
a ceramic layer including said conductor and the vicinity thereof and a ceramic layer located lower than said conductor exhibit a state of intergranular fracture at the time of fracture; and
a ceramic layer other than abovementioned ceramic layers exhibits a state of intragranular fracture at the time of fracture.

Specifically, in the ceramic substrate of the fifth aspect of the present invention, a layer including the conductor inside the ceramic substrate and the vicinity thereof and a ceramic layer located under said conductor (these layers maybe referred to as "the lower layer" hereinafter) are produced as layers which have relatively small number of pores inside thereof and exhibit a state of intergranular fracture at the time of fracture, because these layers are vulnerable to short circuit. A ceramic layer other than abovementioned ceramic layers, that is, the ceramic layers in which coming-off of the ceramic particles thereof may cause failure in the object to be processed (these ceramic layers may be referred to as "the upper layer" hereinafter), is formed to be layers which exhibit a state of intragranular fracture at the time of fracture. As a result, coming-off of the particles: from the face of the ceramic substrate on which the object to be treated is set and heated (which face will be referred to as the heating face hereinafter); and from the vicinity of the surface, is prevented and thus attachment of the free particles to the material being treated is prevented, whereby occurrence of short circuit between the conductors inside the ceramic substrate can be prevented.

Here, the abovementioned "intragranular fracture" represents the case in which the sectional view of fracture exhibits fracture inside the ceramic grains, but not at the boundary between the ceramic grains. In short, the intragranular fracture is synonymous with transgranular fracture. On the other hand, the intergranular fracture represents the case in which the sectional view of fracture exhibits fracture at the boundary of ceramic grains.

According to the ceramic substrate of the fifth aspect of the present invention, in the upper layer of the ceramic substrate, a very small amount of impurity elements such as rare earth element, which serves as a sintering aid, is added to the raw material powder; or an oxide such as $Al_2O_3$, CaO and the like is used as the sintering aid: whereby the grains constituting the ceramic are firmly bound to each other. As a result, the upper layer has a structure which exhibits a state of intragranular fracture at the time of fracture, whereby coming-off of the ceramic particles is prevented. On the other hand, in the lower layer of the ceramic substrate, for instance, the content of the impurity elements such as the rare earth elements is increased and sintering is facilitated, so that the number of the pores is decreased and the occurrence of short circuit between the conductors inside the ceramic substrate is prevented. When the content of the impurity elements such as the rare earth elements is increased, the lower layer exhibits an intergranular fracture at the time of fracture.

As described above, the upper layer of the ceramic substrate according to the fifth aspect of the present invention has a structure which exhibits a state of intragranular fracture at the time of fracture. In a layer having such a structure, grains are firmly bound to each other. Therefore, when a large force is applied thereon, fracture occurs at a certain crystal face inside the grain at which the binding force is weaker than that between the grains. Thus, as the binding force between the grains is significantly strong, the particles (free particles) are not likely to come off from the surface of such a layer, whereby a possibility that free particles attach to the semiconductor wafer and the like which is being treated and cause short circuit, disconnection of the circuit or other failures, is significantly reduced. Further, when the semiconductor wafer and the like is heated, free particles are not likely to come off and thus not likely to disturb adhesion between the semiconductor wafer and the ceramic plate, whereby the semiconductor wafer can be heated evenly. The upper layer tends to have a larger number of pores than the lower layer. As a result, the object to be treated such as the semiconductor wafer and the like can be easily set/removed, which may be rather advantageous.

On the other hand, the lower layer of the ceramic substrate according to the fifth aspect of the present invention is produced by adding a relatively large amount of impurities such as rare earth elements (the sintering aid) so that sintering is facilitated. As a result, the lower layer exhibits a state of intergranular fracture at the time of fracture. In the layer formed in such a manner, the rate of pore inside the ceramic substrate is relatively small, whereby short circuit due to the pores is less likely to occur between the conductors arranged in parallel with the main face of the ceramic substrate (for instance, between the positive electrostatic electrode and the negative electrostatic electrode) and between the conductors arranged in perpendicular to the main face of the ceramic substrate (for instance, between the electrostatic electrode and the resistance heating element).

When the ceramic substrate of the fifth aspect of the present invention is the ceramic substrate having the electrostatic electrode and the resistance heating element formed inside the ceramic substrate, the ceramic substrate functions as an electrostatic chuck.

In the ceramic substrate of the fifth aspect of the present invention, whether the sectional view of fracture exhibits the intragranular fracture or the transgranular fracture is determined on the basis of electron microscope photographs taken at a magnification of 2000 to 5000 times. When fracture occurs at the grain boundary, the sectional view of fracture looks complicated and the configuration of grains is observed on the surface, the fracture is regarded as the intergranular fracture. On the other hand, when fracture occurs inside grains and the sectional view of fracture is relatively flat, the fracture is regarded as the intragranular fracture.

The sixth aspect of the present invention provides the electrostatic chuck having an electrostatic electrode and a resistance heating element formed inside a ceramic substrate thereof, wherein:
  a ceramic layer including the conductor and the vicinity thereof and a ceramic layer located lower than the conductor exhibit a state of intergranular fracture at the time of fracture; and
  a ceramic layer other than abovementioned ceramic layers exhibits a state of intragranular fracture at the time of fracture.

In the electrostatic chuck of the sixth aspect of the present invention, the upper layer serves as the dielectric film and the object to be processed such as a semiconductor wafer and the like which has been put on the electrostatic chuck is attracted to the heating face due to the Coulomb force by the electrostatic chuck. The dielectric film is a layer having a structure which exhibits a state of intragranular fracture at the time of fracture. As the grains constituting this layer are firmly bound to each other, the ceramic particles are not likely to come off from the surface of the layer. Accordingly, free particles are not likely to come off from the surface of the dielectric film and thus not likely to attach to the object to be treated, whereby poor adhesion between the object to be treated and the electrostatic chuck can be prevented.

On the other hand, the lower ceramic layer (comprising the layer which includes the electrostatic electrode and the vicinities thereof, and the ceramic layer located under the electrostatic electrode) exhibits a state of intergranular fracture at the time of fracture and a relatively small rate of pore therein, whereby short circuits: between the electrostatic electrodes: between the resistance heating elements; or between the electrostatic electrode and the resistance heating element at the lower layer can be prevented. Further, in case that a RF electrode is present, short circuit between the electrostatic electrode and the RF electrode and between the RF electrode and the resistance heating element can be prevented as well.

In the electrostatic chuck of the sixth aspect of the present invention, whether the sectional view of fracture exhibits the intragranular fracture or the intergranular fracture is determined in the manner same as that of the fifth aspect of the present invention.

The ceramic substrate of the fifth aspect of the present invention functions as the electrostatic chuck of the sixth aspect of the present invention, when the conductors formed inside the ceramic substrate are the electrostatic electrode and the resistance heating element. Accordingly, the electrostatic chuck of the sixth aspect of the present invention, which is one embodiment of the ceramic substrate of the fifth aspect of the present invention, will be mainly described hereinafter.

The structure of the electrostatic chuck of the sixth aspect of the present invention is substantially the same as that of the electrostatic chuck described by using FIGS. 4 to 6 in the context of the ceramic substrate of the third and fourth aspects of the present invention, except that the ceramic substrate in a disk-shape thereof comprises two layers, which are the upper layer and the lower layer, having a different sectional view of fracture from each other. Accordingly, the detailed description of the structure thereof will be omitted.

Each of the members which constitute the electrostatic chuck of the sixth aspect of the present invention, as well as other embodiments of the electrostatic chuck of the sixth aspect of the present invention will be described in detail, one by one, hereinafter.

The ceramic substrate which constitutes the electrostatic chuck of the sixth aspect of the present invention is structured such that elements other than the elements constituting the ceramic substrate, (for instance, boron, sodium, calcium, silicon, oxygen or impurity elements such as rare earth elements as the sintering aid described below) are present in a small amount in the upper layer there of and thus a state of intragranular fracture is exhibited when the ceramic constituting the upper layer is fractured. On the other hand, the lower layer of the ceramic substrate is structured such that elements other than the elements constituting the ceramic substrate are locally present in a small amount at the boundary of ceramic grains and thus a state of intergranular fracture is exhibited when the ceramic constituting the upper layer is fractured.

The ceramic substrate is constituted of the upper layer and the lower layer as described above. However, the ceramic materials which constitute these layers are basically the same except that, for example, the contents of impurities such as the rare earth elements are different.

The main component of the ceramic material which constitutes the ceramic substrate is not particularly restricted. Examples thereof include a nitride ceramic, a carbide ceramic, an oxide ceramic and the like.

Examples of the nitride ceramic include metal nitride ceramics such as aluminum nitride, silicon nitride, boron nitride, titanium nitride and the like.

Examples of the carbide ceramics include metal carbide ceramic such as silicon carbide, zirconium carbide, titanium carbide, tantalum carbide, tungsten carbide and the like.

Examples of the oxide ceramic include metal oxide ceramic such as alumina, zirconia, cordierite, mullite and the like.

These ceramics may be used solely or in combination of two or more of them.

Among these examples, nitride ceramic and carbide ceramic are more preferable than oxide ceramic, because the heat conductivity of the nitride and carbide ceramics are higher than that of the oxide ceramic.

Among the abovementioned examples of the nitride ceramic, the aluminum nitride is the most preferable because the heat conductivity thereof is the highest, that is, 180 W/m·K.

The average particle diameter of the ceramic powder as the raw material used during the production process of the ceramic substrate which comprises the abovementioned components is preferably in a range of 0.2 to 1.5 µm. When the average particle diameter of the ceramic powder is too small, that is, smaller than 0.2 µm, the bulk density of the formed body drops so low that the sintering process may not proceed in a satisfactory manner or abnormal grain growth may occur. On the other hand, when the average particle diameter of the ceramic powder exceeds 1.5 µm, the grain diameter of the ceramic grains after being sintered becomes too large, whereby the upper layer exhibits the state of intergranular fracture and the lower layer experiences deteriorated bending strength and fracture toughness value.

The impurities such as the abovementioned rare earth elements are generally added in order to enhance the sintering property at the time of firing the ceramic powder as the raw material. For example, in case yttria is added as the impurity, the amount of yttria to be added when the green sheet for the upper layer of the ceramic substrate is produced, is preferably 1.0 parts by weight or less with respect to 100 parts by weight of the ceramic powder as the raw material. If the content of yttria exceeds 1.0 parts by weight, the upper layer tends to exhibit the state of intergranular fracture when the ceramic constituting the upper layer is fractured, whereby the ceramic particles are likely to come off and free particles will appear on the object to be treated such as semiconductor wafer and the like. The amount of yttria to be added is more preferably 0.5 parts by weight or less with respect to 100 parts by weight of the ceramic powder as the raw material.

On the other hand, in the lower layer of the ceramic substrate, the amount of yttria to be added is preferably in a range of 1.0 to 20 parts by weight with respect to 100 parts by weight of the ceramic powder as the raw material. When the content of yttria is less than 1.0 parts by weight, the sectional view of the lower layer exhibits the state of intragranular fracture and a large number of pores are present inside the lower layer due to the insufficient sintering of the ceramic powder, whereby short circuit may occur when electrons jump and fly in the pores. On the other hand, when the content of yttria exceeds 20 parts by weight, the strength and the heat conductivity of the sintered ceramic substrate may drop.

It is preferable that the average grain diameter of the ceramic grains constituting the upper layer of the ceramic substrate is adjusted so as to be 2 µm or less and the average grain diameter of the ceramic grains constituting the lower layer of the ceramic substrate is adjusted so as to be within a range of 2 to 10 µm. This is because: by setting the average grain diameter of the ceramic grains in such ranges, the upper layer of the ceramic substrate exhibits the state of intragranular fracture and the lower layer exhibits the state of intergranular fracture.

The abovementioned average grain diameter of the ceramic grains is measured as follows.

First, five samples are prepared. Ten sites are photographed by an electron microscope for each sample. The grain diameter of one grain is obtained by taking the average of the largest diameter and the smallest diameter thereof. In the same way, the grain diameter is obtained for other grains in the image. The average grain diameter of one image is obtained by taking the grain diameters of the grains in the image.

Next, the average grain diameter is obtained likewise for other images. The average grain diameter of the ceramic grains of the ceramic substrate is obtained by taking the average of the average grain diameters of all of the images (photograghs).

The method of producing a ceramic substrate having the abovementioned average grain diameter is not particularly restricted. Such a ceramic substrate can be produced, for example, by adding 0.5 weight % or less of the sintering aid (yttria) in the abovementioned conditions and then subjecting the product to the firing process by maintaining the firing temperature of 1600° C. or more and less than 1800° C. If the firing temperature is less than 1600° C., the sintering of the ceramic particle may not proceed in a satisfactory manner. On the other hand, if the firing temperature is 1800° C. or higher, the average grain diameter of the ceramic grains tends to exceed 2 µm in the upper layer of the ceramic substrate and the same average grain diameter tends to exceed 10 µm in the lower layer of the ceramic substrate.

The yttria added to the ceramic powder during the production process of the green sheet for the upper layer may hardly remain in the resulting sintered body. For example, when 0.5 weight % or less of yttria is added to the ceramic powder during the production process of the aluminum nitride sintered body, yttria is diffused toward the outside of the substrate and scattered from the surface during the sintering process, whereby little yttria remains in the sintered body.

In the upper layer, the amount of impurities such as the sintering aid which are present at the grain boundary is very small. As a result, the ceramic grains constituting the upper layer are firmly bound to each other. Accordingly, if a relatively large force is applied on the upper layer, fracture does not occur at the grain boundary but proceeds at the crystal face at which binding force between atoms in the grain is relatively weak.

The upper layer of the ceramic substrate can be formed by using the ceramic powder which has been fired in an oxidizing atmosphere. In this case, it is preferable that the ceramic powder as the raw material is heated in oxygen or the air at a temperature in a range of 500 to 1000° C.

The thickness of the upper layer of the ceramic substrate is preferably in a range of 5 to 5000 µm. This is substantially the same thickness as the ceramic dielectric film of the electrostatic chuck of the sixth aspect of the present invention. However, it is acceptable that a layer having a thickness of 2 to 2000 µm or so and having the same composition as that of the lower layer exists between the upper layer and the electrostatic electrode, because there may be a case in which occurrence of short circuit between the positive and negative electrodes of the electrostatic electrode need to be prevented. Accordingly, if there is no possibility of such short circuit occurring, the upper layer may exist in the vicinity of the electrostatic electrode, that is the area in the range of 5 to 5000 µm under the electrostatic electrode. The portion other than the upper layer, of the ceramic substrate is the lower layer of the ceramic substrate. In the lower layer portion, the resistance heating element formed in the ceramic substrate or the resistance heating element and the electrostatic electrode are embedded.

The upper layer preferably contains oxygen in an amount of 0.05 to 10 weight %. When the upper layer contains oxygen in such an amount, the binding force between the grains increases. Preferable examples of the method of making the upper layer containing oxygen include: the method including the steps of firing powder of aluminum nitride in an oxidizing atmosphere, thereby providing oxygen (alumina) on the surface of the powder and then sintering the powder; the method including the steps of firing powder of aluminum nitride in an oxidizing atmosphere, thereby providing oxygen (alumina) on the surface of the powder, adding powder of CaO thereto and then firing the powder; the method including the steps of adding powder of CaO to powder of aluminum nitride and then firing the mixture in an oxidizing atmosphere. When the content of oxygen is less than 0.05 weight %, the sintering does not proceed and fracture occurs at the grain boundary and voids are generated in the sintered body, whereby the bending strength of the sintered body at a high temperature drops. On the other hand, when the content of oxygen exceeds 10 weight %, oxygen and the like locally deposited at the grain boundary becomes voids, whereby the bending strength of the sintered body at a high temperature deteriorates.

In the upper layer, it is preferable that the pore diameter of the maximum pore is 50 $\mu$m or less and the porosity is 5% or less. When the pore diameter of the maximum pore exceeds 50 $\mu$m, high breakdown voltage property may not be reliably obtained at a high temperature, that is, at a temperature at 200° C. or higher in particular. The pore diameter of the maximum pore is preferably 10 $\mu$m or less, because the degree of warp at a temperature of 200° C. or higher is reduced when the pore diameter is in this range.

As mentioned above, the upper layer, which is the ceramic dielectric film, may have pores therein to some extent, because such presence of opened pores on the surface of the ceramic dielectric film is rather advantageous in terms of smooth dechucking of the object to be treated such as silicon wafer and the like.

On the other hand, it is preferable that the lower layer contains no pore. If the lower layer contains some pores, the porosity is preferably 5% or less and the pore diameter of the maximum pore is preferably 50 $\mu$m or less. When the abovementioned porosity exceeds 5%, electrons jump and fly in these pores, whereby sufficient insulation cannot be reliably ensured: between the electrostatic electrodes; between the resistance heating elements; or between the electrostatic electrode and the resistance heating element formed at the lower layer.

The upper layer and the lower layer of the ceramic substrate constituting the electrostatic chuck of the sixth aspect of the present invention have different porosity from each other. The porosity is preferably 5% or less and the pore diameter of the maximum pore is preferably 50 $\mu$m or less in the ceramic substrate as a whole.

When the porosity exceeds 5%, the number of the pores in the ceramic substrate increases and the diameter of pore becomes too large, whereby pores are more likely to interconnected with each other. In the ceramic dielectric film having such a structure, the breakdown voltage tends to drop too low.

Further, when the pore diameter of the maximum pore exceeds 50 $\mu$m, the ratio of the pore diameter with respect to the thickness of the ceramic substrate increases and the proportion of pores which interconnected with each other also increases, whereby the breakdown voltage may drop.

The porosity is more preferably 0, or 3% or less and the pore diameter of the maximum pore is more preferably 0, or 10 $\mu$m or less.

The measurement of the pore diameter of the maximum pore and the measurement of the porosity can be performed by the same methods as those employed in the measurement of the pore diameter of the maximum pore and the measurement of the porosity of the aluminum nitride sintered body of the first aspect of the present invention.

Next, the properties of the ceramic substrate as a whole comprising the abovementioned upper and lower layers will be described.

In the abovementioned ceramic substrate, it is preferable that the brightness thereof is N6 or less when evaluated as the value according to the definition of JIS Z 8721. The ceramic substrate having such brightness exhibits excellent heat radiation and covering-up properties. In such a ceramic substrate, accurate measurement of temperature on the surface thereof can be performed by a thermoviewer. The definition of "N" of brightness is omitted because it has been described in the context of the aluminum nitride sintered body of the first aspect of the present invention.

A ceramic substrate having such properties as described above can be obtained by adding carbon to the ceramic substrate so that the carbon content therein is in a range of 100 to 5000 ppm. The carbon may be amorphous or crystalline. When amorphous carbon is used, the drop in the volume resistivity of the ceramic substrate at a high temperature can be suppressed. When the crystalline carbon is used, the drop in the heat conductivity of the ceramic substrate at a high temperature can be suppressed. Accordingly, types of carbon may be selected in an appropriate manner, depending on the objective for which the ceramic substrate is employed.

Specific examples of the amorphous carbon and the crystalline carbon include those listed in the context of the aluminum nitride sintered body of the first aspect of the present invention.

The thickness of the ceramic substrate is preferably 20 mm or less. When the thickness of the ceramic substrate exceeds 20 mm, the heat capacity thereof may be too large, whereby the temperature following property of the ceramic substrate is likely to deteriorate due to the large heat capacity when the ceramic substrate is heated or cooled. The thickness of the ceramic substrate is preferably 0.5 mm or more. If the thickness of the ceramic substrate is less than 0.5 mm, the strength of the ceramic substrate itself is dropped, whereby the ceramic substrate is more likely to be broken. More preferably, the thickness of the ceramic substrate exceeds 1.5 mm, and 5 mm or less. If the thickness of the ceramic substrate is more than 5 mm, the heat-transfer property thereof deteriorates, whereby the heating efficiency tends to be lowered. On the other hand, if the thickness of the ceramic substrate is 1.5 mm or less, the heat transferred in the ceramic substrate is not diffused in the sufficient manner, whereby the heating face may not be heated evenly or the strength of the ceramic substrate may be dropped, resulting in breakage.

It is preferable that the diameter of the ceramic substrate of the present invention is larger than 190 mm. It is especially preferable that the diameter of the ceramic substrate is 12 inches (300 mm) or more because this larger size will be a main stream in the semiconductor wafer of the next generation.

It is preferable that the abovementioned ceramic substrate has a disc-like shape, because the object to be adsorbed and heated such as a silicon wafer by the ceramic substrate normally has a circular shape.

According to the electrostatic chuck of the sixth aspect of the present invention, a thermocouple may be embedded in the ceramic substrate, similarly to the case of the ceramic substrate of the third and fourth aspects of the present invention, based on the necessity. The temperature of the ceramic substrate (the electrostatic chuck) can be measured by the thermocouple, and then the temperature of the ceramic substrate can be controlled by changing the voltage and current strength on the basis of the measured data.

The size of the connecting portion of the metal wire of the abovementioned thermocouple and the abovementioned thermocouple may be the same as those described in the third and fourth aspects of the ceramic substrate of the present invention.

Further, the electrostatic electrode of the electrostatic chuck of the sixth aspect of the present invention may be formed as the electrostatic electrode in which the semicircular chuck positive electrostatic layer and the semicircular chuck negative electrostatic layer are provided inside the ceramic substrate, as described with reference to FIG. 13 in or as the electrostatic electrode in which the quartered circle-shaped, two chuck positive electrostatic layers and two chuck negative electrostatic layer are provided in the ceramic substrate so that the positive electrostatic layers intersect with the negative electrostatic layers, as described with reference to FIG. 14 as these electrostatic electrodes have been described in the context of the ceramic substrate of the third and fourth aspects of the present invention.

The electrostatic chuck of the sixth aspect of the present invention may be provided with a RF electrode.

In case that the electrodes are formed so as to have a shape of a divided circle and the like, the number of division is not particularly restricted and may be five or more. The shape of each divided portion is not restricted to a sector form, either.

These electrostatic electrodes are formed in the lower layer of the ceramic substrate as described above. Accordingly, connecting units (conductor filled through holes) for connecting these electrostatic electrodes to the external terminals are required, similarly to the case of the ceramic substrate of the third and fourth aspects of the present invention. Regarding the material and shape of the conductor filled through holes and the method of connecting the conductor filled through hole as the connection pad to the external terminals, the materials and method same as those employed for the ceramic substrate of the third and fourth aspects of the present invention can be used.

Examples of the resistance heating element formed in the lower layer of the ceramic substrate include: the one with a pattern wherein, each of a pair of two adjacent concentric circles are connected, as a set of circuit, to form one line, as described with reference to FIG. 6 in the context of the third and fourth aspects of the present invention; a resistance heating element having a spiral pattern; a resistance heating element having a pattern of eccentric circles; and a resistance heating element having a pattern of winding lines. Among these examples, that with the concentric circles-like pattern as shown in FIG. 6 or that with a pattern obtained by combining the concentric circles and the shape of winding lines, are preferable, in terms of achieving even distribution of the temperature of the ceramic substrate as a whole.

As the abovementioned material of the resistance heating element, the material similar to that employed for the ceramic substrate of the third and fourth aspects of the present invention can be used.

A plurality of the abovementioned resistance heating elements may be provided. In this case, it is preferable that the patterns at respective layers are formed so that the patterns complement each other, whereby any portion of the heating face is covered by one of these patterns or layers without leaving any uncovered portion when viewed from the above. For example, a structure having a staggered arrangement may be used.

It is preferable that the resistance heating element is provided at a position which is within 60% of the ceramic substrate thickness as measured from the bottom face of the ceramic substrate, so that heat is well dissipated before reaching the heating face and the distribution of the temperature at the heating face is reliably made even.

The thickness of the resistance heating element is preferably in a range of 1 to 50 $\mu$m and the width thereof is preferably in a range of 5 to 20 $\mu$m.

The shape of the section of the resistance heating element may be either rectangular or oval, but preferably flat. The resistance heating element having a flat sectional shape can easily release heat toward the heating face, whereby uneven distribution of the temperature at the heating face can be prevented.

The aspect ratio of a section of the resistance heating element (the width of the resistance heating element/the thickness of the resistance heating element) is preferably in a range 200 to 5000.

The resistance heating element is formed in the lower layer of the ceramic substrate as described above. Accordingly, conductor filled through holes for connecting the resistance heating element to the external terminals are required, similarly to the case of the electrostatic electrode described above. As the conductor filled through holes, the abovementioned conductor filled through holes similar to those employed for connecting the electrostatic electrodes can be used.

The resistance heating element may be formed at the bottom face of the ceramic substrate. In this case, the resistance heating element is formed at the bottom face of the ceramic substrate preferably by a method including the steps of: applying the conductor containing paste containing metal particles and the like for a resistance heating element, as described above, to the bottom face of the ceramic substrate, thereby to form a conductor containing paste layer having a predetermined pattern; and baking the conductor containing paste on the ceramic substrate, so that the metal particles and the like are sintered on the bottom face of the ceramic substrate. It is assumed that the sintering of the metal is sufficient as long as the metal particles are fused and adhered to each other and the metal particles and ceramic are fused and adhered to each other.

The conductor containing paste is not particularly limited. It is preferable that the conductor containing paste contains a resin, a solvent, a thickener and the like, in addition to the abovementioned metal particles or the conductive ceramic.

Examples of the resin include an epoxy resin, a phenol resin and the like. Examples of the solvent include isopropyl alcohol and the like. Examples of the thickener include cellulose and the like.

When the resistance heating element is formed at the bottom face of the ceramic substrate, the thickness of the resistance heating element is preferably in a range of 1 to 30 $\mu$m and more preferably in a range of 1 to 10 $\mu$m. The width of the resistance heating element is preferably in a range of 0.1 to 20 mm and more preferably in a range of 0.1 to 5 mm.

The aspect ratio thereof is preferably in a range of 10 to 200. The aspect ratio in a case where the resistance heating element is formed at the bottom face of the ceramic substrate is larger than the aspect ratio in a case where the resistance heating element is formed inside the ceramic substrate. When the resistance heating element is formed inside the ceramic substrate, the distance between the heating face and the resistance heating element is short and the temperature distribution at the ceramic substrate surface is not even. Therefore, when the resistance heating element is formed inside the ceramic substrate, the resistance heating element itself must be formed to be flat.

The surface of the resistance heating element as described above is preferably covered by a metal covering layer. The metal covering layer prevents the surface of the resistance heating element from being oxidized and thus the resistance value thereof from being changed.

Examples of the temperature control means in the electrostatic chuck of the sixth aspect of the present invention include, in addition to the abovementioned resistance heating element, the Peltier device described with reference to FIG. 9 in the context of the ceramic substrate of the third and fourth aspects of the present invention.

The electrostatic chuck having the structure as described above of the sixth aspect of the present invention can be provided in a supporting case similar to that described with reference to FIG. 15 in the context of the third and fourth aspects of the present invention.

The supporting case according to the electrostatic chuck of the sixth aspect of the present invention may be structured such that the electrostatic chuck, which has been put on the upper surface of the supporting case, is fixed to the supporting case by the fixing member like a bolt and the like.

So far, the electrostatic chuck of the sixth aspect of the present invention as one embodiment of the ceramic substrate for a semiconductor producing/examining device of the fifth aspect of the present invention has been described in the abovementioned example. If the conductor which is formed inside the ceramic substrate for a semiconductor producing/examining device of the fifth aspect of the present invention is comprising only the resistance heating element, the ceramic substrate described above functions as a ceramic heater.

Figure 18:
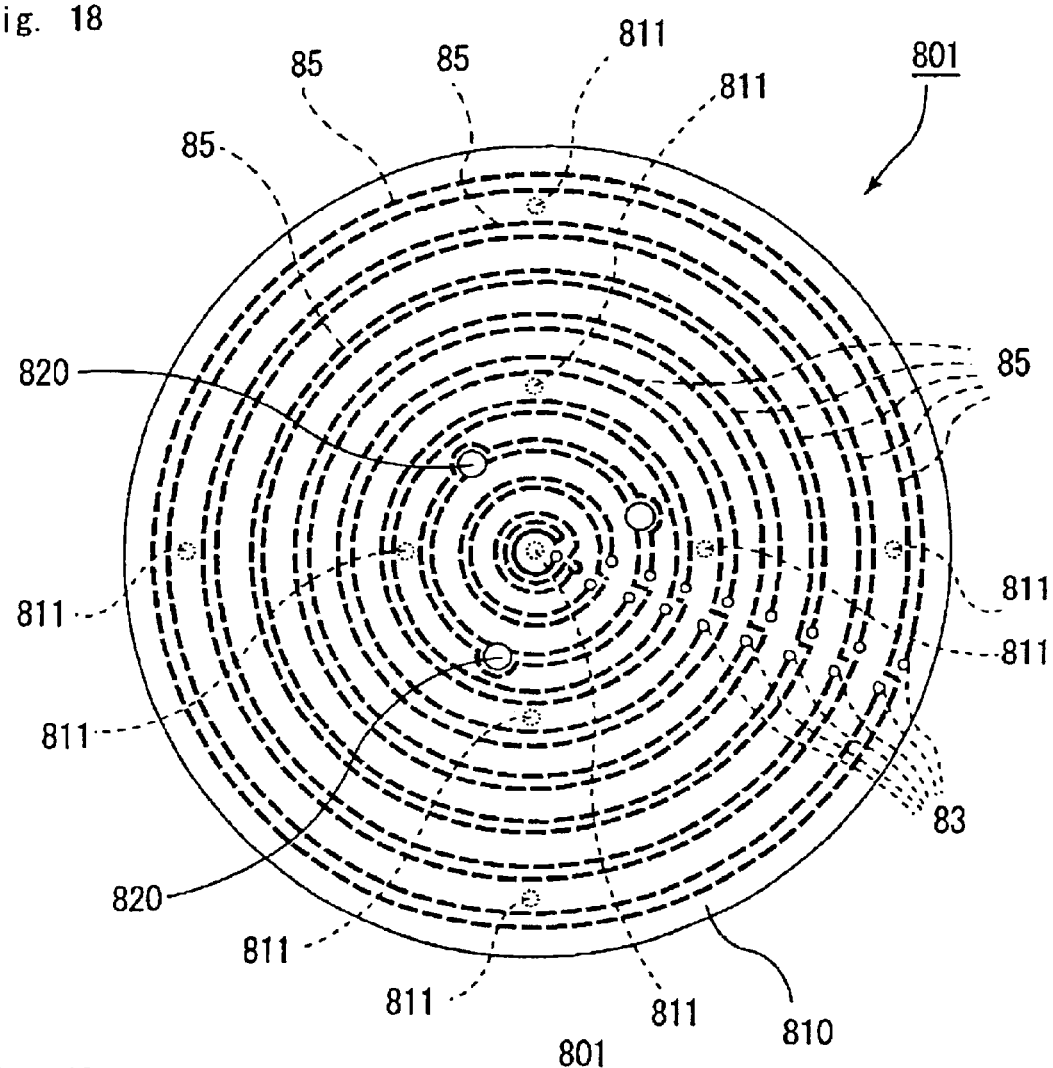
FIG. 18 is a plain view which schematically shows one example of a ceramic heater as one embodiment of a ceramic substrate for a semiconductor producing/examining device according to the fifth aspect of the present invention.
Figure 19:
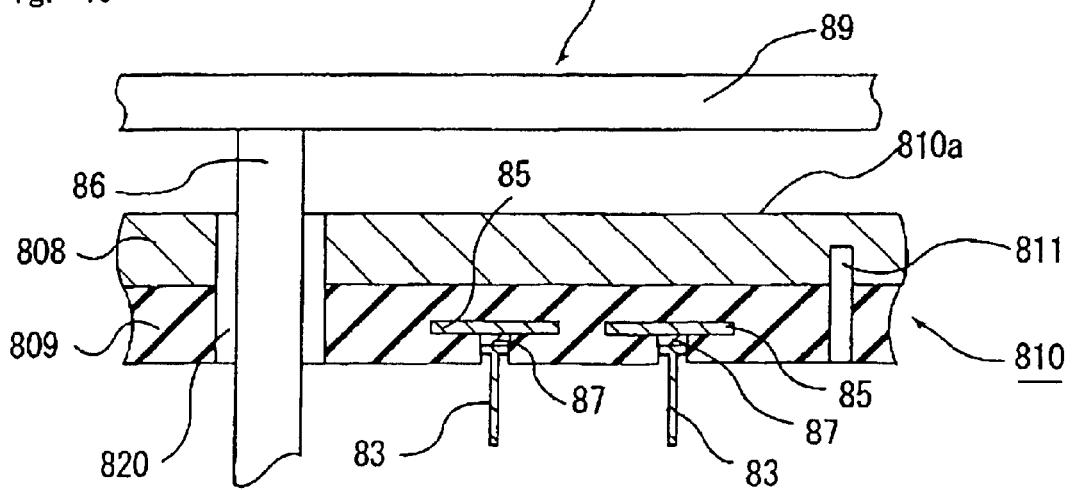
FIG. 19 is a partially-enlarged sectional view of the ceramic heater shown in FIG. 18.

FIG. 18 is a bottom face view which schematically shows a ceramic heater as one example of a ceramic substrate for a semiconductor producing/examining device according to the fifth aspect of the present invention. FIG. 19 is a partially-enlarged sectional view which schematically shows a portion of the ceramic heater shown in FIG. 18.

As shown in FIG. 18, the ceramic substrate 810 which constitutes the ceramic heater 801 is formed so as to have a disc-like shape. A plurality of resistance heating elements 85 are formed inside the ceramic substrate 810. The arrangement of the circuits of these resistance heating elements is designed such that the temperature distribution at the heating face 810a is made even.

The ceramic substrate 810 is divided to the upper layer 808 which exhibits the state of intragranular fracture at the time of fracture and the lower layer 809 which exhibits the state of intergranular fracture at the time of fracture, at the boundary located slightly upward of the resistance heating element 85, as shown in FIG. 19.

A conductor filled through hole 87 is formed right under the end portion of the resistance heating element 85. A blind hole is formed such that the conductor filled through hole 87 is exposed outside. An external terminal 83 for input/output is inserted in the blind hole, so that the external terminal 83 can connect the resistance heating element 85 with the power source by way of the conductor filled through hole 87. A socket and the like equipped with lines is connected to the external terminal 83 for keeping connection to the power source, although not shown in FIG. 19.

A bottomed hole 811 in which a temperature-measuring element is inserted is formed in the ceramic substrate 810.

A through hole 820 in which a lifter pin 86 is inserted is formed in the vicinity of the center of the ceramic substrate.

The lifter pin 86 is structured so that the lifter pin 86 can be moved in the vertical direction in a state that a silicon wafer 89 is set thereon. By using such a function, the lifter pin 86 can transfer the silicon wafer 89 to a carrier (not shown) or receive the silicon wafer 89 from the carrier. In addition, by the action of the lifter pin 86, the silicon wafer 89 can be put on the heating face 810a of the ceramic substrate 810 so that the silicon wafer 89 is heated, or the silicon wafer 89 can be supported in a state that the silicon wafer 89 is distanced by the length of 50 to 2000 $\mu$m from the heating face 810a, for heating the silicon wafer 89.

Alternatively, it is acceptable that the silicon wafer is heated in a state that the silicon wafer 89 is distanced by the length of 50 to 2000 $\mu$mm from the heating face 810a, by: forming a through hole or a concave portion in the ceramic substrate 810; inserting a lifter pin or a supporting pin having a tip end shaped in a form of spire or semisphere, into the through hole or the concave portion; fixedly holding the lifter pin or the supporting pin in a state that the lifter pin or the supporting pin is slightly projected from the ceramic substrate 810; and supporting the silicon wafer by the lifter pin or the supporting pin in that state.

In the ceramic heater 801, the upper layer 808 has a structure which exhibits a state of intragranular fracture at the time of fracture. Grains constituting the upper layer are firmly bound to each other, whereby the ceramic particles are not likely to come off from the heating face. As free particles are not likely to come off from the upper layer 808, attachment of free particles to the object to be treated such as a silicon wafer 89 and the like and, failure of adhesion between the object to be treated such as a silicon wafer 89 and the like and the heating face 810a of the ceramic substrate 810 can be reliably prevented.

On the other hand, the lower layer 809 (which comprises the layer including the resistance heating element 85 and the vicinities thereof and the layers located under the resistance heating element 85) exhibits a state of intergranular fracture at the time of fracture and has a relatively low pore rate, whereby occurrence of short circuit between the resistance heating elements 85 can be prevented. In case that the RF electrode is present, the RF electrode is also formed in the lower layer 809 so that occurrence of short circuit between the resistance heating element 85 and the RF electrode can be prevented.

In case that: the chuck top conductor layer is formed on the surface of the ceramic substrate for the semiconductor producing/examining device of the fifth aspect of the present invention; a guard electrode is formed as the conductor layer formed inside the ceramic substrate; and a ground electrode is formed as another conductor layer under the guard electrode, the ceramic substrate for the a semiconductor producing/examining device of the fifth aspect of the present invention functions as a ceramic plate for a wafer prober.

In this case, similarly to the abovementioned case, by designing the upper portion of the ceramic substrate as a layer having a structure which exhibits a state of intragranular fracture at the time of fracture, the ceramic particles are prevented from coming off from the surface thereof, whereby attachment of free particles to the object to be treated and adhesion failure between the object to be treated and the heating face of the ceramic substrate can be reliably prevented. Further, by designing the region which includes the chuck top conductor layer, the guard electrode and the ground electrode as a layer having structure which exhibits a state of intergranular fracture at the time of fracture, occurrence of short circuit among the chuck top conductor layer, the guard electrode and the ground electrode, as well as occurrence of short circuit between the conductors adjacent to each other in the horizontal direction, can be prevented.

Next, one example of the method of producing the electrostatic chuck of the sixth aspect of the present invention will be described with reference to the sectional views shown in FIGS. 20(a) to (d).

(1) First, by Mixing Powder of Ceramic Such as Nitride Ceramic, Carbide Ceramic with a Binder and a Solvent, a Green Sheet 55 for the Upper Layer and a Green Sheet 500 for the Lower Layer are Obtained Into the ceramic powder for the upper layer, the sintering aid such as yttria or carbon and the like may be added at the abovementioned ratio. Alternatively, aluminum nitride powder containing oxygen, which has been obtained by firing aluminum nitride in an oxidizing atmosphere, may be used as the ceramic powder for the upper layer. Also, the sintering aid such as yttria or carbon and the like may also be added at the abovementioned ratio to the ceramic powder for the lower layer as well.

The green sheet 500 for the lower layer and the green sheet 55 for the upper layer, which are laminated right on the green sheet 500 on which the electrostatic electrode layer printed body 56 is formed, which will be described later, are layers which will serve as a ceramic dielectric film 504.

As the binder, at least one kind of binder selected from the group consisting of an acrylic binder, an ethyl cellulose, a butyl cellosolve and polyvinyl alcohol is preferably used.

As the solvent, at least one kind of solvent selected from α-terpineol and glycol is preferably used.

The green sheets 500 and 55 are produced by forming the paste obtained as a result of mixing the abovementioned components to a sheet form according to the doctor blade method and the like.

At the position where a through hole which a supporting pin of the silicon wafer is passed through, a concave portion in which thermocouple is embedded, a portion at which a conductor filled through hole is to be formed and the like may be formed as a through hole in the green sheet 500, based on the necessity. The through hole can be formed by punching and the like.

The thickness of the green sheet 500 is preferably in a range of 0.1 to 5 mm.

Next, the conductor containing paste is filled in the through hole of the green sheet 500, whereby conductor filled through hole printed bodies 58, 59 are formed. The conductor containing paste which will serve as the electrostatic electrode layer or the resistance heating element is then printed on the green sheet 500.

The printing is performed in consideration of the shrinking rate of the green sheet 500, so that a desirable aspect ratio is obtained whereby the electrostatic electrode layer printed body 56 and the resistance heating element layer printed body 57 are obtained. The printed body is formed by printing the conductor containing paste containing conductive ceramic, metal particles and the like on the green sheet.

As the conductive ceramic particles contained in the conductor containing paste, a carbide of: tungsten; or molybdenum is the most preferable because such a carbide is less likely to be oxidized and the heat conductivity thereof is less likely to drop, as compared with other materials.

Examples of the metal particle contained in the conductor containing paste include particles of tungsten, molybdenum, platinum, nickel and the like.

The average particle diameter of the conductive ceramic particles and the metal particles is preferably in a range of 0.1 to 5 μm. If the particle size is too large or too small, it is difficult to conduct printing with such a conductor containing paste.

As such a conductor containing paste, a conductor containing paste which is prepared by mixing: 85 to 97 parts by weight of metal particles or conductive ceramic particles; 1.5 to 10 parts by weight of at least one kind of binder selected from the group consisting of an acrylic binder, an ethyl cellulose, a butyl cellosolve and polyvinyl alcohol; and 1.5 to 10 parts by weight of at least one kind of solvent selected from α-terpineol, glycol, ethyl alcohol and butanl, is most preferably used.

Next, as shown in FIG. 20(a), a green sheet 500 for the lower layer having the printed bodies 56, 57, 58, 59 is laminated with the green sheet 500 and the green sheet 55 for the upper layer. The green sheet 500 which does not have the printed body at the side on which the resistance heating element is formed is laminated, so that the end face of the conductor filled through hole is not exposed. Thus, the end face is prevented from being oxidized during firing when the resistance heating element is formed. If the firing is to be performed, when the resistance heating element is formed, in a state in which the end face of the conductor filled through hole is exposed, a metal such as nickel which is less likely to be oxidized needs to be formed to the end face by spattering. More preferably, the end face may be covered by a gold braze (Au—Ni).

(2) Next, as Shown in FIG. 20(b), the Lamination is Subjected to Heating and Pressurizing, Whereby the Green Sheet and the Conductor Containing Paste are Sintered The heating temperature is preferably in a range of 1600 to 1800° C. The pressure for pressurizing is preferably within a range of 10 to 20 MPa (100 to 200 kgf/cm$^2$). The heating and pressurizing are applied in an inert gas atmosphere. As the inert gas, argon, nitrogen and the like, for example, may be used. By this process, a ceramic substrate 510 having the conductor filled through holes 516, 517, the chuck positive electrostatic layer 502, the chuck negative electrostatic layer 503, the resistance heating element 505 and the like therein is formed.

(3) Next, as Shown in FIG. 20(c), Blind Holes 511, 512 for Connecting External Terminals are Formed It is preferable that at least a portion of the inner walls of the blind holes 511, 512 are made conductive and the conductive inner walls are connected to the chuck positive electrostatic layer 502, the chuck negative electrostatic layer 503, the resistance heating element 505and the like.

(4) Finally, as Shown in FIG. 20(d), the External Terminals 518, 519 are Provided to the Blind Holes 511, 512 Through a Solder Layer (not shown). In addition, a bottomed hole may be formed so that a thermocouple can be embedded therein, based on the necessity.

As solder, alloys of silver-lead, lead-tin, bismuth-tin and the like can be used. The thickness of the solder layer is preferably in a range of 0.1 to 50 μm. When the thickness of the solder layer is within this range, connection by the solder is reliably secured in a sufficient manner. The connection of the external terminals 518, 519 to the blinded holes 511, 512 may be connected by using gold braze.

In case that: the conductor is provided on the surface and inside of the ceramic substrate for the a semiconductor producing/examining device of the fifth aspect of the present invention; the conductor provided on the surface of the ceramic substrate is a chuck top conductor layer; and the conductor provided inside the ceramic substrate is at least one of a guard electrode and a ground electrode, the abovementioned ceramic substrate functions as a wafer prober.

Also, in case that the dielectric film and the abovementioned conductor in the vicinity of the upper surface are not provided and the conductor is formed as a heating element, the electrostatic chuck of the sixth aspect of the present invention functions as a hot plate.

The present invention will be further described in detail according to the following examples. Note that the present invention is not restricted by the examples in any manner.

BEST MODE FOR CARRYING OUT THE INVENTION

EXAMPLES 1–7

Figure 11:
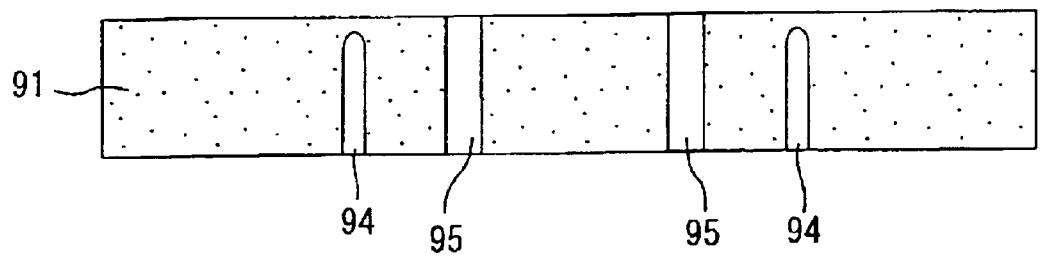
FIGS. 11(a) to (d) are sectional views which schematically show a part of a production process of a ceramic substrate of the present invention.
Figure 11:
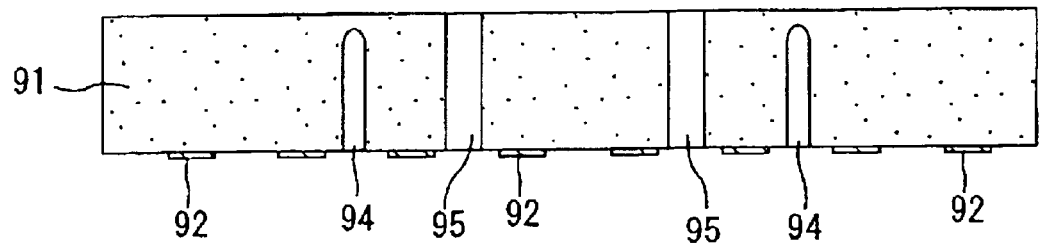
Figure 11:
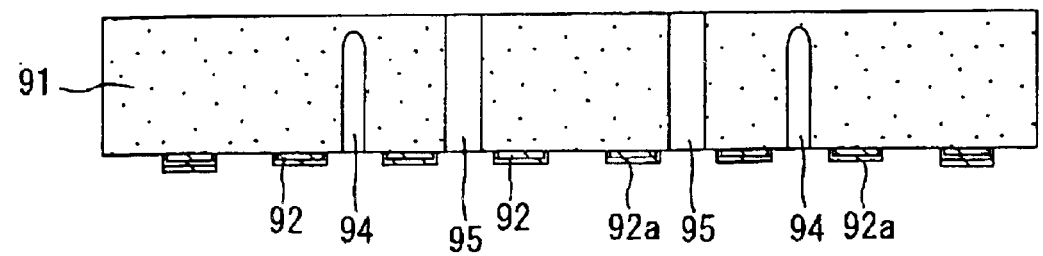
Figure 11:
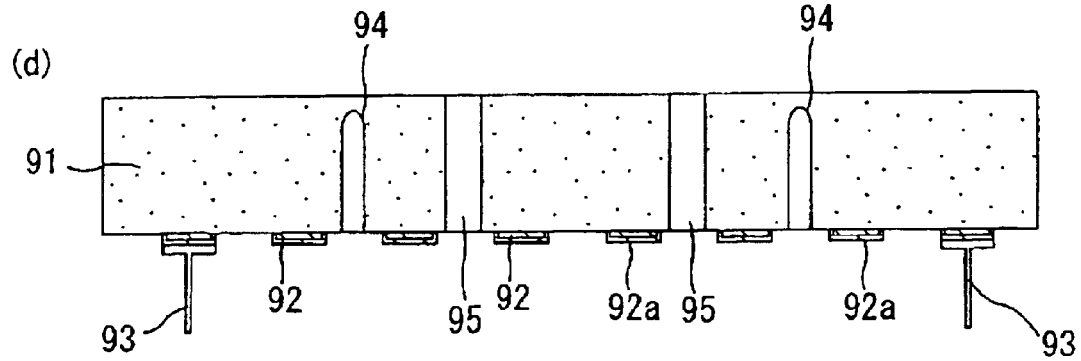

Production of a Ceramic Heater Having a Resistance Heating Element Formed at the External Portion Thereof (Reference to FIG. 3 and 11)

(1) A composition containing: 100 parts by weight of aluminum nitride powder (the average particle diameter: 1.1 $\mu$m, produced by Tokuyama Co.); 5 parts by weight (example 1), 10 parts by weight (example 2), 20 parts by weight (example 3), 30 parts by weight (example 4), 42 parts by weight (example 5), 42 parts by weight (example 6), 86 parts by weight (example 7) of alumna; $1.17\times10^{-4}$ parts by weight (example 1), $4.7\times10^{-4}$ parts by weight (example 2), $2.3\times10^{-3}$ parts by weight (example 3), 0.023 parts by weight (example 4), 0.07 parts by weight (example 5), 0.12 parts by weight (example 6), 0.19 parts by weight (example 7) of CaS; 120 parts by weight of acrylic binder; and alcohol was prepared. By spray drying the obtained composition, seven types of granular powder were produced.

(2) The granular powder was filled in a mold and formed so as to have a plate-like shape, whereby a formed body (green) was obtained. The formed body was subjected to drilling, whereby a portion which was to serve as a through hole 95 which a lifter pin of a semiconductor wafer was passed through, a portion which was to serve as a bottomed hole in which a thermocouple was embedded (diameter: 1.1 mm, depth: 2 mm) 94 were formed.

(3) The formed body which had been subjected to the processing treatment was then hot-pressed for 3 hours at 1800° C. under a pressure of 20 MPa (200 kgf/cm$^2$), whereby an aluminum nitride plate-shaped body of 3 mm thickness was obtained.

Next, a disc-shaped body having a diameter of 210 mm was cut out from the plate-shaped body, whereby a plate-shaped body made of ceramic (a ceramic substrate) 91 was obtained (reference to FIG. 11(a)).

(4) A conductor containing paste was printed on the ceramic substrate obtained in the abovementioned (3) by screen printing. The printing pattern was a concentric circles-like pattern.

As the conductor containing paste, SOLVEST PS603D manufactured by Tokuriki Kagaku Kenkyujo, which is used for forming a plated through hole of a printed circuit board, was employed.

The conductor containing paste was a silver-lead paste containing 7.5 parts by weight of a metal oxide with respect to 100 parts by weight of silver. The metal oxide comprises lead oxide (5% by weight); zinc oxide (55% by weight); silica (10% by weight); boron oxide (25% by weight); and alumina (5% by weight). The average particle diameter of the silver particles was 4.5 $\mu$m and the shape of the silver particles was scaly.

(5) Next, the ceramic substrate 91 on which the conductor containing paste had been printed was heated at 780° C. and fired so that the silver and lead in the conductor containing paste were sintered and baked on the ceramic substrate 91, whereby the heating element 92 was formed (reference to FIG. 11(b)). The thickness of the silver-lead heating element was 5 $\mu$m, the width thereof was 2.4 mm and the sheet resistivity was 7.7 m$\Omega$/□.

(6) The heater plate 11 which had been produced in the abovementioned (5) was immersed in an electroless nickel plating bath containing aqueous solutions of nickel sulfate (80 g/l) sodium hypophosphite (24 g/l), sodium acetate (12 g/l), boric acid (8 g/l) and ammonium chloride (6 g/l), so that a metal covering layer (a nickel layer) 92a having a thickness of 1 $\mu$m was deposited on the surface of the silver-lead heating element 92 (reference to FIG. 11(c)).

(7) A Ni—Au brazing material was formed by screen printing at the portion at which a terminal was to be provided to obtain the connection to the power source.

Next, an external terminal 93 made of kovar was mounted on the Ni—Au brazing material. A thermocouple (not shown) for controlling the temperature was inserted to the bottomed hole. Thereafter, the external terminal 93 was connected (more specifically, fused and adhered by heating at 1030° C.) thereto with gold brazing (81.7 Au—18.3 Ni), whereby a ceramic heater 90 as shown in FIG. 3 was obtained (reference to FIG. 11(d)).

Test Examples 1 to 3

A ceramic heater 90 was obtained in a manner similar to that of example 1, except that alumina was added such that the content thereof reached the amount shown in Table 1 and CaS was also added such that the ion contents thereof reach the amount shown in Table 1.

For each of the ceramic heaters of the present examples 1 to 7 and the test examples 1 to 3, the content of alumina, the content of oxygen, the content of sulfur, the bending strength and the number of free particles of the ceramic substrate 91 were measured by the method described below and the sectional view of fracture was observed. The results are shown in Table 1.

(1) Measurement of Strength

The measurement of strength was carried out by using an Instron type testing machine (4507 type, load cell being 500 kgf) in the air in which the humidity was 400° C., in the following conditions: the cross head rate being 0.5 mm/minute; the span distance (L) being 30 mm; the thickness of the test piece being 3.06 mm; and the width of the test piece being 4.03 mm. The three-point bending strengths σ (kgf/mm$^2$) was calculated by using the following calculation formula (1). In Table 1, the unit of the three-point bending strength has been converted to MPa.

$$\sigma = 3PL/2\, wt^2 \tag{1}$$

In the abovementioned calculation formula (1), P represents the maximum load (kgf) when the test piece was fractured, L represents the distance between the downstream fulcra (30 mm), t represents the thickness of the test piece (mm) and w represents the width of the test piece (mm).

The results are shown in Table 1.

(2) The Content of Oxygen

Each of the samples which had been sintered in the same conditions as those of the ceramic substrates according to the examples and test examples was pulverized in a tungsten motar. Thereafter, 0.01 g of each sample was collected and analyzed by an oxygen/nitrogen determinator (TC-136 model, made by LECO company) in the conditions of the sample heating temperature of 2200° C. and the heating duration of 30 seconds.

(3) The Content of Sulfur

The glow discharge-mass spectrum method (GD-MS method) was employed. The actual analysis was performed by "SHIVA TECHNOLOGIES, INC" in the United States (phone number: 315-699-5332, FAX number: 315-699-0349).

(4) Sectional View of Fracture

The sectional view of fracture was observed by an electron microscope at a magnification of 2000 times. When 50% or more of the field of the electron microscope photograph at a magnification of 2000 times exhibited intragranular fracture, the type of fracture of the sample was determined as intragranular fracture. Also, even though less than 50% of the field of the electron microscope photograph at a magnification of 2000 times exhibited intragranular fracture, if intragranular fracture was observed at at least some portions, the type of fracture of the sample was determined as partial intragranular fracture.

(5) Measurement of the Number of the Free Particles

A silicon wafer was put on each of the ceramic heaters of examples 1 to 7 and the test examples 1 to 3 and heated till the temperature of the silicon wafer reached 400° C. Thereafter, ten sites at the silicon wafer surface were observed by an electron microscope for each of the samples. The number of the free particles whose diameter exceeded 0.2 μm was counted and the number of free particles/cm was calculated.

On the other hand, when the content of oxygen is too much, it was also difficult to bring most portions of the sectional view of fracture of the ceramic substrate to a state of intragranular fracture.

The number of the free particles generated in examples 1 to 7 was 40/cm$^2$ or less.

EXAMPLE 8

Production of a Ceramic Heater Having a Resistance Heating Element Formed at the External Portion Thereof (Reference to FIG. 3 and FIG. 11)

(1) A composition containing: 100 parts by weight of aluminum nitride powder (the average particle diameter: 0.6 μm); 0.3 parts by weight of yttria (the average particle diameter: 0.4 μm); 12 parts by weight of acrylic binder; and alcohol was prepared. By spray drying the obtained composition, granular powder was produced.

(2) Next, the granular powder was filled in a mold and formed so as to have a plate-like shape, whereby a formed body (green) was obtained.

(3) The formed body which had been subjected to the processing treatment was then hot-pressed for 3 hours at 1700° C. under a pressure of 20 MPa, whereby an aluminum nitride plate-shaped body of 3 mm thickness was obtained.

Next, a disc-shaped body having a diameter of 210 mm was cut out from the plate-shaped body, whereby a plate-

TABLE 1

| | Content of alumina (wt %) | Content of oxygen (wt %) | Content of sulfur (ppm) | Sectional view of fracture | Bending strength (MPa) | The Number of free particles (particles/cm$^2$) |
|---|---|---|---|---|---|---|
| Examples | | | | | | |
| 1 | 0.5 | 0.5 | 0.05 | Partial intragranular fracture | 400 | 32 |
| 2 | 1.0 | 0.8 | 0.2 | Partial intragranular fracture | 400 | 28 |
| 3 | 2.0 | 1.2 | 1.0 | Intragranular fracture | 410 | 20 |
| 4 | 3.0 | 1.4 | 10 | Intragranular fracture | 420 | 18 |
| 5 | 4.0 | 1.6 | 30 | Intragranular fracture | 440 | 15 |
| 6 | 4.0 | 1.6 | 50 | Intragranular fracture | 420 | 20 |
| 7 | 8.0 | 3.0 | 80 | Partial intragranular fracture | 400 | 35 |
| Test examples | | | | | | |
| 1 | 0 | <0.1 | 10 | Partial intragranular fracture | 380 | 38 |
| 2 | 15.0 | 0.5 | 30 | Partial intragranular fracture | 380 | 40 |
| 3 | 4.0 | 1.6 | 0 | Intergranular fracture | 350 | 200 |

As is obvious from Table 1, when the content of sulfur was too small, it was difficult to adjust the sectional view of fracture of the ceramic substrate to a state of intragranular fracture. It is assumed that this phenomenon is caused because the effect of binding the grains drops when the content of sulfur small.

shaped body made of ceramic (a ceramic substrate 91) was obtained. The formed body was subjected to drilling, whereby a portion which was to serve as a through hole 95 which a lifter pin 96 for a semiconductor wafer was passed through, a portion which was to serve as a bottomed hole 94 in which thermocouple was embedded (diameter: 1.1 mm, depth: 2 mm) were formed (reference to FIG. 11(a)).

(4) A conductor containing paste was printed on the plate-shaped body obtained in the abovementioned (3) by screen printing. The printing pattern was a concentric circles-like pattern.

As the conductor containing paste, SOLVEST PS603D manufactured by Tokuriki Kagaku Kenkyujo, which is used for forming a plated through hole of a printed circuit board, was employed in a manner similar to that of examples 1 to 7.

(5) Next, the ceramic substrate 91 on which the conductor containing paste had been printed was heated at 780° C. and fired so that the silver and lead contained in the conductor containing paste were sintered and baked on the ceramic substrate 91, whereby the heating element 92 was formed (reference to FIG. 11(b)). The thickness of the silver-lead resistance heating element was 5 µm, the width thereof was 2.4 mm and the sheet resistivity was 7.7 mΩ/□.

(6) The ceramic substrate 91 produced in the abovementioned (5) was immersed in an electroless nickel plating bath containing aqueous solutions similar to those of examples 1 to 7, whereby a metal covering layer (a nickel layer) 92a having a thickness of 1 µm was deposited on the surface of the silver-lead resistance heating element 92 (reference to FIG. 11(c)).

(7) An Ag—Sn solder paste (manufactured by Tanaka Kikinzoku Kogyo Co.) was printed by screen printing at the portion at which an external terminal 93 was to be provided so that the connection to the power source was reliably obtained, whereby the solder layer was formed.

Next, an external terminal 93 made of kovar was mounted on the solder layer and heating and reflowing of the solder layer was conducted at 700° C., whereby the external terminal 93 was mounted on the surface of the resistance heating element 92 (reference to FIG. 11(d)).

(8) The thermocouple (not shown) for controlling the temperature was sealed with polyimide, whereby a ceramic heater 90 was obtained.

EXAMPLE 9

Production of a Ceramic Heater Having a Resistance Heating Element Inside Thereof (Reference to FIG. 1, FIG. 2 and FIG. 12)

(1) A paste was produced by mixing: 100 parts by weight of aluminum nitride powder (manufactured by Tokuyama Co., the average particle diameter: 0.6 m); 0.2 parts by weight of yttria (the average particle diameter: 0.4 µm); 11.5 parts by weight of acrylic binder; 0.5 parts by weight of a dispersant; and 53 parts by weight of alcohol comprising 1-butanol and ethanol. By using the obtained paste and performing the forming process according to the doctor blade method, a green sheet 60 having a thickness of 0.47 mm was obtained.

(2) Next, the green sheet was dried for five hours at 80° C. Thereafter, a portion which was to serve as a conductor filled through hole for connecting the resistance heating element and a terminal pin was formed by punching.

(3) A conductor containing paste A was prepared by mixing: 100 parts by weight of tungsten carbide particles whose average particle diameter was 1 µm; 3.0 parts by weight of an acrylic binder; 3.5 parts by weight of α-terpineol; 0.3 parts by weight of a dispersant.

A conductor containing paste B was prepared by mixing: 100 parts by weight of tungsten particles whose average particle diameter was 3 µm; 1.9 parts by weight of an acrylic binder; 3.7 parts by weight of α-terpineol; 0.2 parts by weight of a dispersant.

The conductor containing paste A was printed on the green sheet 60 by screen printing, whereby a resistance heating element printed body was formed. The printing pattern was a concentric circles-like pattern as shown in FIG. 1. The conductor containing paste B was filled in the through hole for the conductor filled through hole provided for obtaining connection to the external terminals, whereby a conductor filled through hole printed body was formed.

The green sheet 60 which had been subjected to the abovementioned treatment was laminated with 37 sheets provided at the upper side thereof (on the heating face thereof); and 13 sheets provided at the lower side thereof: of the green sheet 60 on which the tungsten paste had not been printed, at 130° C. and at a pressure of 8 MPa (80 kgf/cm$^2$) (reference to FIG. 12(a)).

(4) Next, the obtained lamination was degreased in nitrogen gas at 600° C. for 5 hours and then hot-pressed for 3 hours at 1750° C. and at a pressure of 15 MPa (150 kgf/cm$^2$), whereby a plate-shaped body of aluminum nitride having a thickness of 3 mm was obtained. This plate-shaped body of aluminum nitride was cut out so as to have a disc-like shape having a diameter of 215 mm, whereby a ceramic substrate having a conductor whose thickness was 6 µm and width was 10 mm inside thereof was obtained.

Thereafter, the formed body was subjected to drilling, whereby a through hole 15 which a lifter pin was passed through and a bottomed hole 14(diameter: 1.2 mm, depth: 2.0 mm) were formed (reference to FIG. 12(b)).

(5) Next, a blind hole 67 was formed by hollowing out a portion on the through hole for the conductor filled through hole (reference to FIG. 12(c)). An external terminal 13 made of kovar was connected to the blind hole 67 by using a gold brazing of Ni—Au and conducting heating and reflowing at 700° C. (reference to FIG. 12(d)). A plurality of thermocouples (not shown) for controlling the temperature was embedded in the bottomed hole 14, whereby the production of a ceramic heater 10 having a resistance heating element 12 as a conductor inside thereof was completed.

EXAMPLE 10

Production of a Ceramic Heater Containing No Yttria (1) A paste was produced by mixing: 100 parts by weight of aluminum nitride powder (manufactured by Tokuyama Co., the average particle diameter: 0.6 µm); 11.5 parts by weight of acrylic binder; 0.5 parts by weight of a dispersant; and 53 parts by weight of alcohol comprising 1-butanol and ethanol. By using the obtained paste and performing the forming process according to the doctor blade method, a green sheet having a thickness of 0.47 mm was obtained.

(2) Next, the green sheet was dried for five hours at 80° C. Thereafter, a portion which was to serve as a conductor filled through hole for connecting the resistance heating element to the external terminal was formed by punching.

(3) The conductor containing paste A and the conductor containing paste B were prepared in a manner similar to that of example 9.

The conductor containing paste A was printed on the green sheet by screen printing, whereby a resistance heating element printed body was formed. The printing pattern was a concentric circles-like pattern as shown in FIG. 1. The conductor containing paste B was filled in the through hole for the conductor filled through hole provided for obtaining connection to the external terminals.

The green sheet which had been subjected to the abovementioned treatment was laminated with 37 sheets provided at the upper side thereof (on the heating face thereof); and 13 sheets provided at the lower side thereof: both are the green sheets on which the conductor containing paste had not been printed, at 130° C. and at a pressure of 8 MPa (80 kgf/cm$^2$).

(4) Next, the obtained lamination was degreased in nitrogen gas at 600° C. for 5 hours and then hot-pressed for 3 hours at 1750° C. and at a pressure of 15 MPa (150 kgf/cm$^2$), whereby a plate-shaped body of aluminum nitride having a thickness of 3 mm was obtained. This plate-shaped body of aluminum nitride was cut out so as to have a disc-like shape having a diameter of 215 mm, whereby a ceramic substrate having a conductor whose thickness was 6 μm and width was 10 mm inside thereof was obtained.

Thereafter, The formed body was subjected to drilling, whereby a through hole which a lifter pin was passed through and a bottomed hole (diameter: 1.2 mm, depth: 2 mm) were formed.

(5) Next, a blind hole was formed by hollowing out a portion of the through hole for the conductor filled through hole. An external terminal made of kovar was connected to the blind hole by using gold brazing of Ni—Au and conducting heating and reflowing at 700° C. A plurality of thermocouples (not shown) for controlling the temperature was embedded in the bottomed hole, whereby the production of a ceramic heater having a resistance heating element as a conductor inside thereof was completed.

EXAMPLE 11

Production of a Ceramic Heater Made of Silicon Carbide (1) An isotropic graphite material (manufactured by Ibiden Co., the tradename "T-4") was formed in a form of a disc having a diameter of 250 mm. The disc was subjected to the high purifying treatment by using a halogeng as at 2000° C., whereby a base material made of graphite was produced.

(2) The base material was set inside a CVD device and decomposed by heat, in the conditions in which the temperature was 1350° C. and the vacuum degree was 150 Torr, by supplying methyl chlorosilane as a reactant gas and supplying hydrogen as a carrier gas, whereby a SiC film (a plate-shaped body) having a thickness of 5 mm was formed.

(3) Next, the SiC film (a plate-shaped body) was separated from the graphite base material by using a diamond cutter and the both faces thereof were ground, whereby a ceramic structure for a SiC substrate having a thickness of 3 mm was obtained. The average particle diameter of the SiC particles constituting the ceramic structure was 1.1 μm.

(4) Next, the ceramic structure made of silicon carbide was subjected to the annealing treatment in nitrogen gas at 1600° C. for 3 hours. Thereafter, a disc-shaped body having a diameter of 210 mm was cut out from the plate-shaped body, whereby a plate-shaped body made of ceramic (a ceramic substrate 91) was obtained.

A glass paste ("G-5270" manufactured by Shoei Kagaku Kogyo Co.) was applied by coating to the surface of the ceramic substrate 91. The glass paste was then heated at 600° C. and melted, whereby a SiO$_2$ layer having a thickness of 2 μm was formed on the surface of the ceramic substrate 91. Next, the ceramic substrate 91 was subjected to drilling and a processing by a cutting member, whereby a through hole 95 which a lifter pin was passed through and a bottomed hole 94 (diameter: 1.1 mm, depth: 2 mm) in which a thermocouple was embedded were formed.

(5) A conductor containing paste was printed at the bottom face of the ceramic substrate 91 obtained in the abovementioned (4) by screen printing. The printing pattern was a concentric circles-like pattern as shown in FIG. 1.

As the conductor containing paste, SOLVEST PS603D manufactured by Tokuriki Kagaku Kenkyujo, which is used for forming a plated through hole of a printed circuit board, was employed in a manner similar to that of examples 1 to 7.

(6) Next, the sintered body on which the conductor containing paste had been printed was heated at 780° C. and fired so that the silver and lead contained in the conductor containing paste were sintered and baked on the sintered body, whereby the resistance heating element 92 was formed. The thickness of the silver-lead resistance heating element 92 at the portion thereof in the vicinity of the terminal was 5 μm, the width thereof was 2.4 mm and the sheet resistivity was 7.7 mΩ/□.

(7) Next, the abovementioned glass paste was coated again on the processed surface and fired at 600° C., whereby a glass coating was provided at the processed surface.

EXAMPLE 12

Production of a Ceramic Heater Having a Resistance Heating Element Inside Thereof (Reference to FIG. 1, FIG. 2 and FIG. 12)

(1) A green sheet 60 was obtained in a manner similar to that of example 9.

(2) The green sheet 60 was dried for five hours at 80° C. Thereafter, a portion which was to serve as a conductor filled through hole for connecting the resistance heating element and an external terminal was formed by punching.

(3) Next, a conductor containing paste A and a conductor containing paste B were prepared in a manner similar to that of example 9.

The conductor containing paste A was printed on the green sheet by screen printing, whereby a resistance heating element printed body was formed. The printing pattern was a concentric circles-like pattern as shown in FIG. 1. The conductor containing paste B was filled in the through hole for the conductor filled through hole provided for obtaining connection to the external terminals, whereby a conductor filled through hole printed body was formed.

The green sheet 60 which had been subjected to the abovementioned treatment was laminated with 37 sheets provided at the upper side thereof (on the heating face thereof); and 13 sheets provided at the lower side thereof: of the green sheet 60 on which the tungsten paste had not been printed, at 130° C. and at a pressure of 8 MPa (80 kgf/cm$^2$) (reference to FIG. 12(a)).

(4) Next, the obtained lamination was degreased in nitrogen gas at 600° C. for 5 hours and then hot-pressed for 3 hours at 1750° C. and at a pressure of 15 MPa (150 kgf/cm$^2$), whereby a plate-shaped body of aluminum nitride having a thickness of 3 mm was obtained. This plate-shaped body of aluminum nitride was cut out so as to have a disc-like shape having a diameter of 215 mm, whereby a ceramic substrate 11 having a conductor whose thickness was 6 μm and width was 10 mm inside thereof was obtained.

Thereafter, The ceramic substrate was subjected to drilling, whereby a through hole 15 which a lifter pin was passed through and a bottomed hole 14 (diameter: 1.2 mm, depth: 2.0 mm) were formed (reference to FIG. 12(b)).

(5) Next, a blind hole 67 was formed by hollowing out a portion of the through hole for the conductor filled through hole (reference to FIG. 12(c)). An external terminal made of kovar was connected to the blind hole 67 by using gold brazing of Ni—Au and conducting heating and reflowing at 700° C. (reference to FIG. 12(d)). A plurality of thermocouples for controlling the temperature was embedded in the bottomed hole, whereby the production of a ceramic heater having a resistance heating element as a conductor inside thereof was completed.

Comparative Example 1

Production of a Ceramic Heater Having a Resistance Heating Element Formed on the Surface Thereof A composition containing: 100 parts by weight of aluminum nitride powder (the average particle diameter: 1.1 μm); 4 parts by weight of yttria (the average particle diameter: 0.4 μm); 12 parts by weight of acrylic binder; and alcohol was prepared. By spray drying the obtained composition, granular powder was produced. A formed body was produced by using the granular powder. The obtained formed body was subjected to the firing process at 1800° C. and under a pressure of 20 MPa. Thereafter, a ceramic heater was produced in a manner substantially similar to that of example 8.

Comparative Example 2

Production of a Ceramic Heater Having a Resistance Heating Element Provided on the Surface Thereof A ceramic heater was produced in a manner similar to that of example 8 except that the firing temperature was 1650° C.

Comparative Example 3

Production of a Ceramic Heater Having a Resistance Heating Element Provided on the Surface Thereof A ceramic heater was produced in a manner similar to that of example 8 except that the firing temperature was 1950° C.

Comparative Example 4

Production of a Ceramic Heater Made of Silicon Carbide (1) A composition was prepared by mixing: 100 parts by weight of silicon carbide powder ("Daiyasic GC-15" manufactured by Yakushima Denko Co., the average particle diameter thereof was 1.1 μm); 4 parts by weight of carbon; 12 parts by weight of acrylic binder; 5 parts by weight of $B_4C$; 0.5 parts by weight of a dispersant; and alcohol comprising 1-butanol and ethanol. By spray drying the obtained composition, granular powder was produced.

(2) Next, the granular powder was filled in a mold and formed so as to have a plate-like shape, whereby a formed body was obtained.

(3) The formed body which had been subjected to the processing treatment was hot-pressed for 3 hours at 1900° C. and at a pressure of 20 MPa, whereby a silicon carbide sintered body having a thickness of 3 mm was obtained.

Thereafter, a ceramic substrate was produced and a resistance heating element and the like were formed therein in a manner similar to that of example 11, whereby a ceramic heater was obtained.

Comparative Example 5

Production of a Ceramic Heater Having a Resistance Heating Element Formed on the Surface Thereof A composition containing: 100 parts by weight of aluminum nitride powder (the average particle diameter: 1.1μ); 4 parts by weight of yttria (the average particle diameter: 0.4 μm); 12 parts by weight of acrylic binder; and alcohol was prepared. By spray drying the obtained composition, granular powder was produced. A formed body was produced by using the granular powder. The obtained formed body was subjected to the firing process at 1950° C. and under a pressure of 20 MPa. Thereafter, a ceramic heater was produced in a manner substantially similar to that of example 8 (that is, the only difference between example 8 and comparative example 5 was the abovementioned conditions in preparing the formed body and firing).

Comparative Example 6

In comparative example 6, a ceramic heater was produced in a manner similar to that of example 8 except that the firing temperature was 1950° C.

For each of the ceramic heaters produced by examples 8 to 12 and comparative examples 1 to 6, measurement of the number of the free particles, measurement of the average grain diameter of the ceramic grains constituting the ceramic substrate and observation of the sectional view of fracture thereof were carried out according to the methods described below.

Figure 25:
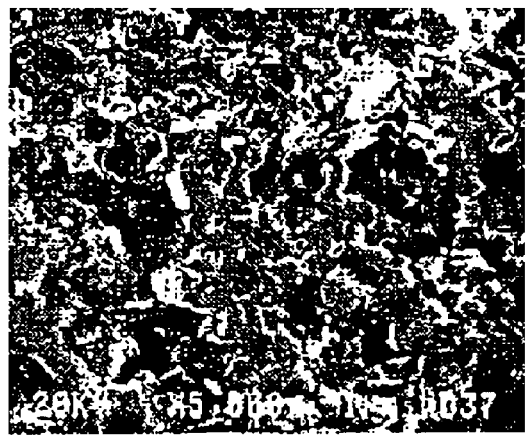
FIG. 25 is a SEM photograph which shows a sectional view of fracture of a ceramic substrate obtained in example 8.
Figure 26:
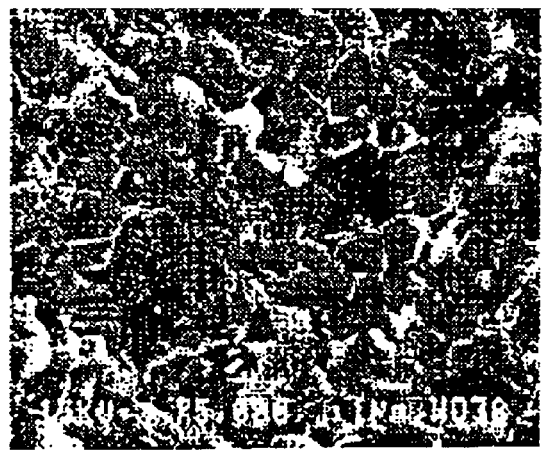
FIG. 26 is a SEM photograph which shows a sectional view of fracture of a ceramic substrate obtained in example 9.
Figure 27:
FIG. 27 is a SEM photograph which shows a sectional view of fracture of a ceramic substrate obtained in comparative example 1.
Figure 28:
FIG. 28 is a SEM photograph which shows a sectional view of fracture of a ceramic substrate obtained in example 12.
Figure 29:
FIG. 29 is a SEM photograph which shows a sectional view of fracture of a ceramic substrate obtained in comparative example 5.
Figure 30:
FIG. 30 is a SEM photograph which shows a sectional view of fracture of a ceramic substrate obtained in comparative example 6.

The SEM photograghs taken in the abovementioned measurement and observation are shown in FIGS. 25 to 30. FIG. 25 is a SEM photograph which shows the result of example 8. FIG. 26 is a SEM photograph which shows the result of example 9. FIG. 27 is a SEM photograph which shows the result of comparative example 1. FIG. 28 is a SEM photograph which shows the result of example 12. FIG. 29 is a SEM photograph which shows the result of comparative example 5. FIG. 30 is a SEM photograph which shows the result of comparative example 6.

Figure 31:
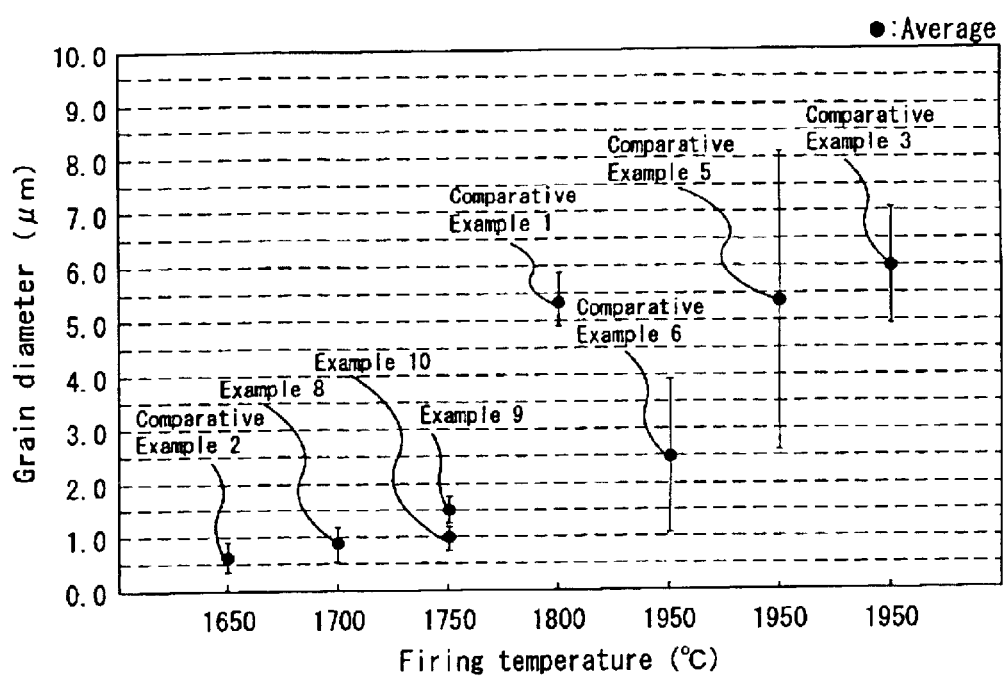
FIG. 31 is a graph which shows the relationship between the firing temperature (the sintering aid) and the grain diameter.

FIG. 31 is a graph which shows the relationship between the firing temperature (the amount of the sintering aid) and the grain diameter.

For each of the ceramic substrates constituting these ceramic heaters, the heat conductivity, the thermal expansion coefficient, the bending strength and the fracture toughness value were measured by the methods described below.

The results are shown in Table 2.

Evaluation Method (1) Measurement of the Number of Free Particles

For each of the ceramic heaters according to examples 8 to 11 and comparative examples 1 to 4, the number of the free particles thereof was measured by a method including the steps of: placing the ceramic substrate with the heating face thereof facing below; setting a silicon wafer under the lower side of the ceramic substrate surface; carrying out a vibration test at 10 to 55 Herz according to JIS C 0040;

thereafter arbitrarily photographing 10 sites at the silicon wafer by an electron microscope, with observation; counting the number of the particles whose particle diameter was 3 µm or more; dividing the number of the free particles by the area of the photographed field, thereby obtaining the number of the free particles per the unit area.

For each of the ceramic heaters according to example 12 and comparative examples 5 and 6, the number of the free particles thereof was measured by a method including the steps of: putting a silicon wafer on each ceramic heater; applying a load of 50 kgf/cm² on the silicon wafer; arbitrarily photographing 10 sites at the silicon wafer by an electron microscope, with observation; counting the number of the free particles whose particle diameter was 2 µm or more; dividing the number of the free particles by the area of the photographed field, thereby obtaining the number of the free particles per the unit area.

The results thereof are shown in Table 2.

(2) Measurement of the Average Grain Diameter

For each of the ceramic heaters according to the examples and the comparative examples, the sectional view of fracture thereof was observed with an electron microscope at a magnification of 5000 times and the diameter of twenty, arbitrarily chosen ceramic grains was each measured. The measured diameter values were averaged.

(3) Observation of the State of the Sectional View of Fracture

For each of the ceramic heaters according to the examples and the comparative examples, the sectional view of fracture thereof was observed with an electron microscope at a magnification of 8000 times and the state of the sectional view of fracture, that is, whether the sectional view of fracture exhibited the state of intragranular fracture or not, was observed.

(4) Measurement of the Heat Conductivity a. Devices Used for the Measurement

Thermal constant measuring device according to the Rigaku laser flush method
LF/TCM-FA8510B b. Test Conditions Temperature: Room Temperature
Atmosphere: Vacuum c. Measurement Method The temperature detection during the measurement of specific heat was carried out by using a thermocouple attached to the back surface of the sample with silver paste (a platinel)

The measurement of specific heat at the room temperature was carried out in a state in which a light-receiving plate (glassy carbon) was further attached to the upper surface of the sample through silicon grease. The specific heat (Cp) of each sample was obtained according to the calculation formula described below.

$$Cp = \left\{ \frac{\Delta O}{\Delta T} - Cp_{G.C.} \cdot W_{G.C.} - Cp_{S.G} \cdot W_{S.G} \right\} \frac{1}{W} \quad (1)$$

In the abovementioned calculation formula (1), $\Delta O$ represents the input energy, $\Delta T$ represents the saturation value of the temperature increase of the sample, $Cp_{G.C.}$ represents the specific heat of the glassy carbon, $W_{G.C.}$ represents the weight of the glassy carbon, $Cp_{S.G}$ represents the specific heat of the silicon grease, $W_{S.G.}$ represents the weight of the silicon grease, W represents the weight of the sample.

(5) Measurement of Strength

For each of the ceramic substrates according to examples 8 to 12 and comparative examples 1 to 6, the strength thereof was measured in a manner similar to that employed for the ceramic heaters according to examples 1 to 7 and comparative examples 1 to 3. However, the present measurement was carried out in the air at 25° C.

(6) Measurement of the Fracture Toughness Value

The fracture toughness value was obtained by using a Vickers hardness measuring device ("MVK-D" type manufactured by Akashi Seisakusho Co.), by pressing the indentator into the surface of the sample, measuring the length of the generated crack and performing the calculation according to the calculation formula (3) described below.

$$\text{Fracture toughness value} = 0.026 \times E^{1/2} \times 0.5 \times p^{1/2} \times a \times C^{-3/2} \quad (3)$$

where E represents the Young's modulus ($3.18 \times 10^{11}$ Pa), P represents the pressing load (98N), "a" represents a half of the average length of the indentation diagonal line (m), C represents a half of the average length of cracks (m).

TABLE 2

| | The number of free particles (particles/cm²) | Average grain diameter (µm) | Sectional view of fracture | Heat conductivity (W/mK) | Thermal expansion coefficient (×10⁻⁸/° C.) | Bending strength (MPa) | Fracture toughness value (Mpa · m½) |
|---|---|---|---|---|---|---|---|
| Examples | | | | | | | |
| 8 | 0.5 | 0.8 | Intragranular fracture | 85 | 4.41 | 471.6 | 2.47 |
| 9 | 0.5 | 1.5 | Intragranular fracture | 85 | 4.41 | 471.6 | 2.47 |
| 10 | 0.5 | 1.0 | Intragranular fracture | 80 | 4.41 | 475.0 | 2.35 |
| 11 | 0.5 | 1.1 | Intragranular fracture | 300 | 4.50 | 550.5 | 2.50 |
| 12 | 0.5 | 1.0 | Intragranular fracture | 85 | 4.41 | 471.6 | 2.47 |
| Comparative examples | | | | | | | |
| 1 | 5 | 5.4 | Intergranular fracture | 175 | 4.45 | 396.9 | 3.06 |
| 2 | 10 | 0.6 | Intergranular fracture | 95 | 4.40 | 352.0 | 3.22 |

TABLE 2-continued

| | The number of free particles (particles/cm$^2$) | Average grain diameter ($\mu$m) | Sectional view of fracture | Heat conductivity (W/mK) | Thermal expansion coefficient ($\times 10^{-8}$/° C.) | Bending strength (MPa) | Fracture toughness value (Mpa · m$^{1/2}$) |
|---|---|---|---|---|---|---|---|
| 3 | 2 | 6.0 | Intergranular fracture | 90 | 4.41 | 416.0 | 2.73 |
| 4 | 5 | 5.0 | Intergranular fracture | 160 | 4.50 | 350.5 | 2.85 |
| 5 | 5 | 5.4 | Intergranular fracture | 175 | 4.45 | 396.9 | 3.06 |
| 6 | 2 | 2.5 | Intragranular fracture | 88 | 4.42 | 475.0 | 2.40 |

As is obvious from the results shown in Table 2, the average grain diameter of the ceramic grains of each of the ceramic heaters according to examples 8 to 11 was 3 $\mu$m or less and the sectional view of fracture thereof exhibited the state of intragranular fracture. When a silicon wafer was heated by using each of these ceramic heaters, no free particles whose particle diameter was 3 $\mu$m or larger and only a very small amount of free particles whose diameter was smaller than 3 $\mu$m were observed at the silicon wafer, which allowed circuits and the like to be formed on the silicon wafer in an excellent state. The bending strength of these ceramic substrate was in a range of 471.6 to 550.5 MPa, which was also excellent.

On the other hand, the average grain diameter of the ceramic grains of each of the ceramic heaters according to comparative examples 1 and 3 was 5.4 $\mu$m and 6.0 $\mu$m, respectively, both of which exceeded 3 $\mu$m, and the sectional view of fracture thereof exhibited the fracture at the grain boundary (intergranular fracture). Further, when a silicon wafer was heated by using each of these ceramic heaters, a number of free particles whose particle diameter was 3 $\mu$m or larger was observed on the silicon wafer, whereby failures such as short circuit occurred at the circuit and the like formed on the silicon wafer, making some samples unsuitable for actual use. In the ceramic heater according to comparative example 4, the average grain diameter thereof was 5.0 $\mu$m. In comparative example 2, the average grain diameter was 0.6 $\mu$m but the sectional view of fracture thereof exhibited intergranular fracture.

Further, in example 12, the average grain diameter of the ceramic grains of the ceramic heater thereof was 2 $\mu$m or less and the sectional view of fracture exhibited intragranular fracture. When a silicon wafer was heated by using each of these ceramic heaters, no free particles whose particle diameter was 2 $\mu$m or larger and only a very small amount of free particles whose diameter was smaller than 2 $\mu$m were observed at the silicon wafer, which allowed circuits and the like to be formed on the silicon wafer in an excellent state.

On the other hand, the average grain diameter of the ceramic grains of the ceramic heater according to comparative example 5 was 5.4 $\mu$m, which exceeded 2 $\mu$m, and the sectional view of fracture thereof exhibited the intergranular fracture. When a silicon wafer was heated by using this ceramic heater, a number of free particles whose particle diameter was 2 $\mu$m or larger were observed on the silicon wafer, whereby failures such as short circuit occurred at the circuit and the like formed on the silicon wafer, making some samples unsuitable for actual use. Further, in comparative example 6, the average grain diameter thereof was 2.5 $\mu$m, which was large.

Further, the bending strength of the ceramic substrate according to examples 8 to 11 was in a range of 471.6 to 550.5 MPa, which was higher than the bending strength of the ceramic substrate of the ceramic heaters according to comparative examples 1 to 4.

Further, as shown in FIG. 31, as the firing temperature increases and as the amount of the sintering aid is increased, the average grain diameter becomes larger.

EXAMPLE 13

Production of the Electrostatic Chuck (FIGS. 4 to 6, FIG. 10)

(1) A paste was produced by mixing: 1000 parts by weight of aluminum nitride powder (manufactured by Tokuyama Co., the average particle diameter: 1.1 $\mu$m); 40 parts by weight of yttria (the average particle diameter: 0.4 $\mu$m); 1.3$\times 10^{-3}$ parts by weight of boron nitride; 115 parts by weight of acrylic binder; 5 parts by weight of a dispersant; 0.3 parts by weight of polysulfone; and 530 parts by weight of alcohol comprising 1-butanol and ethanol. By using the obtained paste and performing the forming process according to the doctor blade method, a green sheet 50 having a thickness of 0.47 mm was obtained.

(2) These green sheets 50 were dried for five hours at 80° C. Thereafter, portions which were to serve as through holes (not shown) which lifter pins (whose diameter was 1.8 mm, 3.0 mm and 5.0 mm, respectively) were passed through and a portion which was to serve as a conductor filled through hole for obtaining connection to the external terminal were formed, by punching, in the green sheets which needed to be processed.

(3) Next, the conductor containing paste A and the conductor containing paste B were prepared in a manner similar to that of example 9.

This conductor containing paste A was printed on the green sheet 50 by screen printing, whereby a conductor containing paste layer was formed. The printing pattern was a concentric circles-like pattern. A conductor containing paste layer having the electrostatic electrode pattern of the shape shown in FIG. 5 was formed on another green sheet 50.

(4) Further, the conductor containing paste B was filled in the through hole for the conductor filled through hole provided for obtaining connection to the external terminals.

The green sheet 50 on which the pattern of the resistance heating element had been formed was laminated with 34 sheets provided at the upper side thereof (on the heating face thereof) and 13 sheets provided at the lower side thereof: of the green sheet 50' on which the tungsten paste had not been printed. A green sheet 50 on which the conductor containing paste layer having the electrostatic electrode pattern had been printed, was further laminated thereon. Two green sheets 50' on which the tungsten paste had not been printed were further laminated thereon. The laminated sheets were pressed to be attached to each other at 130° C. and at a pressure of 8 MPa (80 kgf/cm²), whereby a lamination was formed (reference to FIG. 10(*a*)).

(5) Next, the obtained lamination was degreased in nitrogen gas at 600° C. for 5 hours and then hot-pressed for 3 hours at 1890° C. and at a pressure of 15 MPa (150 kgf/cm2), whereby a plate-shaped body of aluminum nitride having a thickness of 3 mm was obtained. This plate-shaped body of aluminum nitride was cut out so as to have a disc-like shape having a diameter of 300 mm, whereby a plate-shaped body made of aluminum nitride which included the resistance heating element 5 whose thickness was 6 µm and width was 10 mm, a chuck positive electrostatic layer 2 and a chuck negative electrostatic layer 3 having a thickness of 10 µm inside thereof was obtained (reference to FIG. 10(*b*)).

(6) Next, the plate-shaped body obtained in the abovementioned (5) was ground by using a diamond grindstone. Thereafter, a mask was set thereon and a bottomed hole (diameter: 1.2 mm, depth: 2.0 mm) (not shown) for embedding a thermocouple was formed on the surface thereof by blast treatment using SiC and the like.

Figure 10:
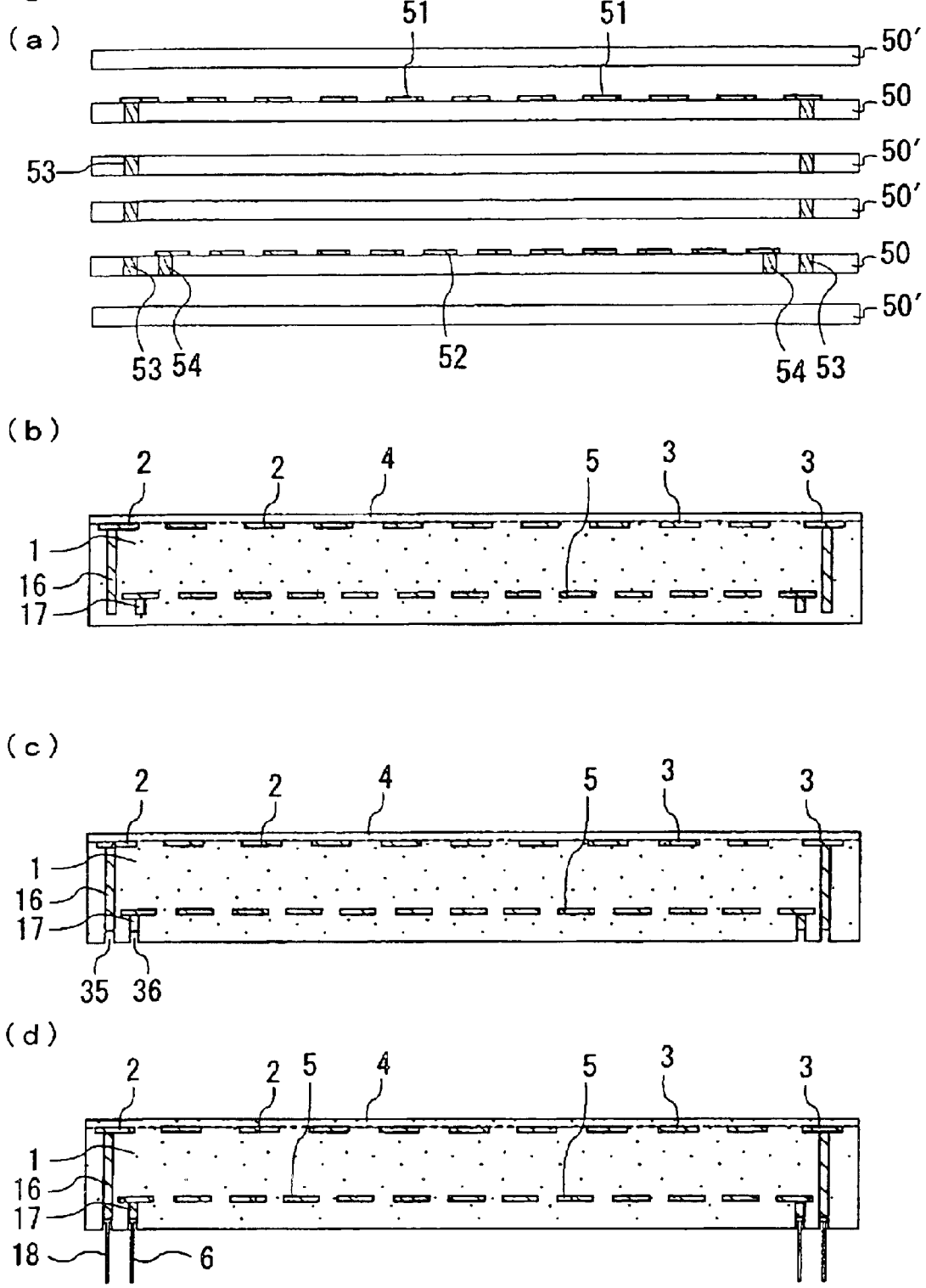
FIGS. 10(a) to (d) are sectional views which schematically show a part of a production process of an electrostatic chuck of the present invention.

(7) Further, blind holes 35, 36 were formed by hollowing out a portion on the conductor filled through hole (reference to FIG. 10(*c*)). External terminals 6, 18 made of kovar were connected to these blind holes 35, 36 by using gold brazing of Ni—Au and conducting heating and reflowing at 700° C. (reference to FIG. 10(*d*)).

(8) Next, a plurality of thermocouples (not shown) for controlling the temperature was embedded in the bottomed hole, whereby the production of the electrostatic chuck having a resistance heating element was completed.

The content of oxygen of the ceramic substrate constituting the electrostatic chuck having a resistance heating element produced in such a manner was 1.6 weight %, and the content of sulfur thereof was 30 ppm.

Further, the resistance heating element of the ceramic substrate is energized, such that the temperature of the ceramic substrate rose up to 400° C. and the resistance heating element was operated. No leak current was observed, the strength at such a high temperature of 400° C. was 400 Mpa, which is significantly high and the ceramic substrate exhibited partial intragranular fracture.

EXAMPLE 14

Production of the Electrostatic Chuck (Reference to FIG. 4)

A paste was produced by mixing: 1000 parts by weight of aluminum nitride powder (manufactured by Tokuyama Co., the average particle diameter: 1.1 µm) which had been fired in the air at 500° C. for 1 hour; 20 parts by weight of alumina (the average particle diameter: 0.4 µm); 115 parts by weight of acrylic binder; 0.07 parts by weight of CaS; 0.03 parts by weight of silica; 5 parts by weight of a dispersant; and 530 parts by weight of alcohol comprising 1-butanol and ethanol. By using the obtained paste and performing the forming process according to the doctor blade method, a green sheet having a thickness of 0.47 mm was obtained. Thereafter, an electrostatic chuck was produced in a manner similar to that of example 13.

EXAMPLE 15

Production of the Electrostatic Chuck (Reference to FIG. 7)

A paste was produced by mixing: 1000 parts by weight of aluminum nitride powder (manufactured by Tokuyama Co., the average particle diameter: 1.1 µm) which had been fired in the air at 500° C. for 1 hour; 20 parts by weight of alumina (the average particle diameter: 0.4 µm);115 parts by weight of acrylic binder; 0.03 parts by weight of silica; 5 parts by weight of a dispersant; and 530 parts by weight of alcohol comprising 1-butanol and ethanol. By using the obtained paste and performing the forming process according to the doctor blade method, a green sheet having a thickness of 0.47 mm was obtained.

(2) This green sheet was dried for five hours at 80° C. Thereafter, portions which were to serve as through holes (whose diameter was 1.8 mm, 3.0 mm and 5.0 mm, respectively) which semiconductor wafer-lifter pins were passed through and a portion which was to serve as a conductor filled through hole for obtaining connection to the external terminal were formed, by punching, in the green sheets.

(3) Next, The conductor containing paste A and the conductor containing paste B were prepared in a manner similar to that of example 9.

This conductor containing paste A was printed on the green sheet by screen printing, whereby a conductor containing paste layer having the electrostatic electrode pattern of a shape shown in FIG. 14 was formed.

Further, the conductor containing paste B was filled in the through hole for the conductor filled through hole provided for obtaining connection to the external terminals.

The green sheet which had been subjected to the abovementioned treatment was laminated with one sheet provided at the upper side thereof (on the heating face thereof); and 48 sheets provided at the lower side thereof: both are the green sheets on which the tungsten paste had not been printed, and the laminated sheets were pressed to be attached to each other at 130° C. and at a pressure of 8 MPa (80 kgf/cm²), whereby a lamination was formed.

(4) Next, the obtained lamination was degreased in nitrogen gas at 600° C. for 5 hours and then hot-pressed for 3 hours at 1890° C. and at a pressure of 15 MPa (150 kgf/cm²), whereby a plate-shaped body of aluminum nitride having a thickness of 3 mm was obtained. This plate-shaped body of aluminum nitride was cut out so as to have a disc-like shape having a diameter of 230 mm, whereby a plate-shaped body made of aluminum nitride which included a chuck positive electrostatic layer 2 and a chuck negative electrostatic layer 3 having a thickness of 15 µm inside thereof was obtained.

(5) A mask was set at the bottom face of the plate-shaped body obtained in the abovementioned (4). Thereafter, a concave portion (not shown) for embedding a thermocouple was formed on the surface thereof by the blast treatment using SiC and the like.

(6) Next, a conductor containing paste for forming a resistance heating element was printed on the face (the bottom face) opposite to the wafer loading face. As the conductor containing paste, SOLVEST PS603D manufactured by Tokuriki Kagaku Kenkyujo, which is used for forming a plated through hole of a printed circuit board, was employed in a manner similar to that of examples 1 to 7.

(7) The plate-shaped body on which the conductor containing paste had been printed was heated and fired at 780°

C., so that the silver and lead contained in the conductor containing paste were sintered and baked on the ceramic substrate. Further, the plate-shaped body was immersed in an electroless nickel plating bath containing aqueous solutions of nickel sulfate (30 g/l), boric acid (30 g/l), ammonium chloride (30 g/l) and Rochelle salt (60 g/l), so that a metal covering layer 25a of nickel containing 1 weight % or less of boron and having a thickness of 1 μm was deposited on the surface of the silver sintered body 25. Thereafter, the plate-shaped body was subjected to the annealing treatment at 120° C. for 3 hours.

The thickness of the resistance heating element of the silver sintered body was 5 μm, the width thereof was 2.4 mm and the sheet resistivity was 7.7 mΩ/□.

(8) Next, a blind hole for exposing the conductor filled through hole 16 was formed in the ceramic substrate. An external terminal made of kovar was connected to this blind hole by using gold brazing of Ni—Au alloy (Au: 81.5 weight %, Ni: 18.4 weight % and impurities: 0.1 weight %) and conducting heating and reflowing at 970° C. Further, an external terminal made of kovar was formed at the resistance heating element through solder (tin: 9/lead: 1).

(9) Next, a plurality of thermocouples for controlling the temperature was embedded in the concave portion, whereby the electrostatic chuck 201 was obtained.

(10) Next, this electrostatic chuck 201 was fitted in a supporting case 41 made of stainless steel having a sectional shape as shown in FIG. 15 through a heat insulator 45 made of ceramic fiber (manufactured by Ibiden Co., the tradename "Ibiwool"). This supporting case 41 has a coolant outlets 42 of cooling gas, so that the temperature of the electrostatic 201 can be adjusted.

The resistance heating element 25 of the electrostatic chuck 201 fitted in this supporting case 41 is energized in order to raise the temperature thereof and, at the same time, the coolant was flowed through the supporting case, so that the temperature of the electrostatic chuck 201 was controlled. The temperature control was very excellently performed.

EXAMPLE 16

Production of the Electrostatic Chuck 301 (FIG. 8)

(1) Two electrodes having shapes shown in FIG. 13 were formed by punching a tungsten film having a thickness of 10 μm.

These two electrodes and tungsten wires were set in a mold, together with: 45 parts by weight of silicon nitride powder (the average particle diameter: 1.1 μm) which had been fired in the air at 500° C. for 1 hour; 15 parts by weight of $Al_2O_3$ (the average particle diameter: 0.54 μm); 40 parts by weight of $SiO_2$ (the average particle diameter: 0.5 μm); and 8 parts by weight of an acrylic resin binder ("SA-545" manufactured by Mitsui Kagaku Co., the acid value thereof being 1.0). The materials set in the mold were hot-pressed in nitrogen gas for 3 hours at 1890° C. and at a pressure of 15 MPa (150 kgf/cm²), whereby a plate-shaped body of aluminum nitride having a thickness of 3 mm was obtained. This plate-shaped body was cut out so as to have a disc-like shape having a diameter of 230 mm, whereby a plate-shaped body was obtained. Here, the thickness of the electrostatic electrode was 10 μm.

(2) This disc-shaped planar body was subjected to the processing steps of the abovementioned (5) to (7) of example 10, whereby the electrostatic chuck 301 was obtained.

EXAMPLE 17

Production of the Electrostatic Chuck 401 (FIG. 9)

After implementing the processing steps of the abovementioned (1) to (5) of example 15, nickel was flame sprayed to the bottom face of the electrostatic chuck and then a lead-tellurium based Peltier device was joined thereto, whereby the electrostatic chuck 401 was obtained.

The electrostatic chuck 401 produced in such a manner had excellent temperature-dropping property. When cooling was performed by the Peltier device, the temperature dropped from 450° C. to 100° C. in three minutes.

Test example 4

A ceramic heater was produced in a manner similar to that of example 1, except that the time duration of the hot-pressing of aluminum nitride in the step (3) was changed to 10 hours.

Comparative Example 7

(1) A paste was produced by mixing: 100 parts by weight of aluminum nitride powder (manufactured by Tokuyama Co., the average particle diameter: 1.1 μm); 4 parts by weight of yttria (the average particle diameter: 0.4 μm); 11.5 parts by weight of acrylic binder; 0.5 parts by weight of a dispersant; and 53 parts by weight of alcohol comprising 1-butanol and ethanol. By using the obtained paste and performing the forming process according to the doctor blade method, a green sheet 50 having a thickness of 0.47 mm was obtained. Thereafter, an electrostatic chuck was produced in a manner similar to that of example 14.

Comparative Example 8

An electrostatic chuck was produced in a manner similar to that of example 15, except that the aluminum nitride powder was not fired in the air and silica and the like was not added.

The content of oxygen in the aluminum nitride powder was presumably 0.01 weight %.

Comparative Example 9

An electrostatic chuck was produced in a manner similar to that of example 15, except that 4 parts by weight of yttria was added.

EXAMPLE 14-1

An electrostatic chuck was produced in a manner similar to that of example 14, except that the electrostatic chuck had a diameter of 330 mm and a thickness of 3 mm.

Comparative Example 7-1

An electrostatic chuck was produced in a manner similar to that of comparative example 7, except that the electrostatic chuck had a diameter of 330 mm and a thickness of 3 mm.

Comparative Example 8-1

An electrostatic chuck was produced in a manner similar to that of comparative example 8, except that the electrostatic chuck had a diameter of 330 mm and a thickness of 3 mm.

For each of the electrostatic chucks obtained by examples 14 to 17 and comparative examples 7 to 9 and the ceramic heater obtained by test example 4, measurement of the number of free particles and the bending strength, observation of the sectional view of fracture and measurement of degree of warp and the oxygen content were carried out by the methods similar to those employed in examples 1 to 7. The results thereof are shown in Table 3. Moreover, the degree of warp was measured by the method described below only for the electrostatic chucks of example 14-1, comparative examples 7-1 and 8-1.

Specifically, after raising the temperature of the ceramic substrate to 600° C. in vacuum, the degree of warp of the ceramic substrate was measured by using a laser displacement measuring device. Moreover, the measurement was carried out in a range of (diameter—10 mm).

TABLE 3

| | The Number of free particles (particles/cm$^2$) | Bending strength (MPa) | Sectional view of fracture | Degree of warp ($\mu$m) | Oxygen content (wt %) |
|---|---|---|---|---|---|
| Examples | | | | | |
| 14 | 30 | 440 | Intragranular fracture | — | 1.4 |
| 15 | 34 | 430 | Intragranular fracture | — | 1.5 |
| 16 | 35 | 420 | Intragranular fracture | — | 7.0 |
| 17 | 32 | 400 | Intragranular fracture | — | 1.5 |
| 14-1 | 30 | 440 | Intragranular fracture | 25 | 1.4 |
| Test example | | | | | |
| 4 | 200 | 350 | Intergranular fracture | — | 11 |
| Comparative examples | | | | | |
| 7 | 200 | 350 | Intergranular fracture | — | 1.6 |
| 8 | 250 | 350 | Intergranular fracture | — | ≤0.01 |
| 9 | 250 | 350 | Intergranular fracture | — | 1.6 |
| 7-1 | 250 | 350 | Intergranular fracture | 105 | 1.6 |
| 8-1 | 250 | 350 | Intergranular fracture | 110 | ≤0.01 |

Figure 22:
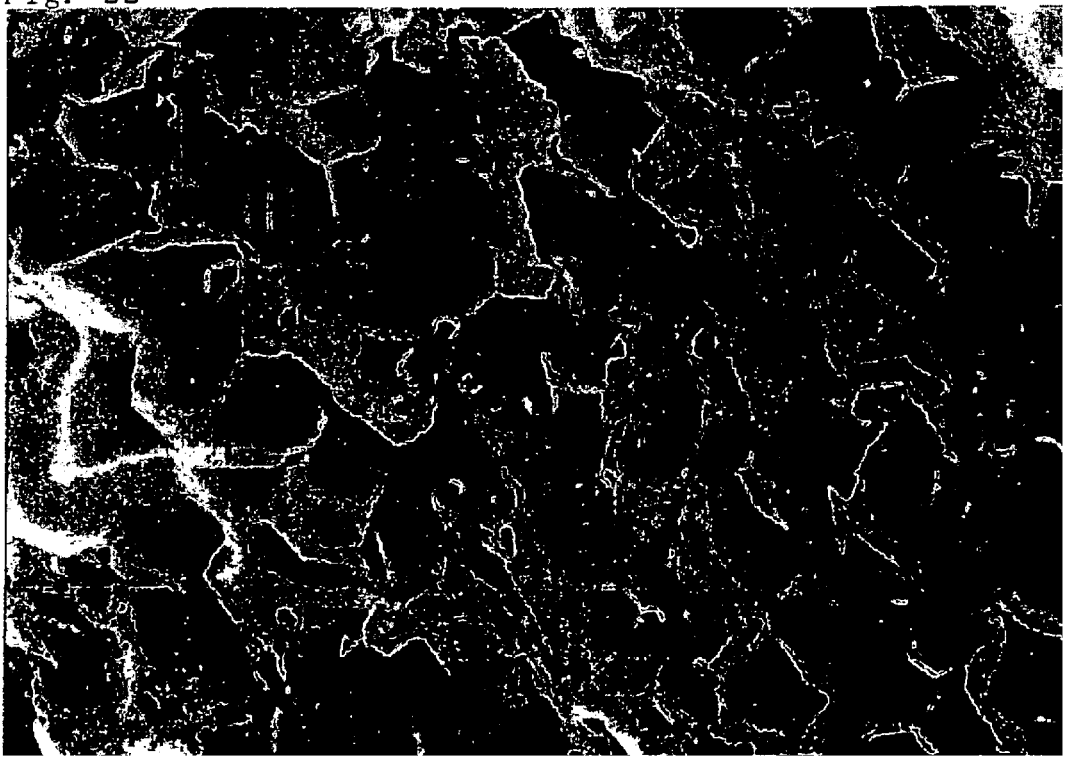
FIG. 22 is a SEM photograph which shows a sectional view of fracture of an electrostatic chuck according to example 14.
Figure 24:
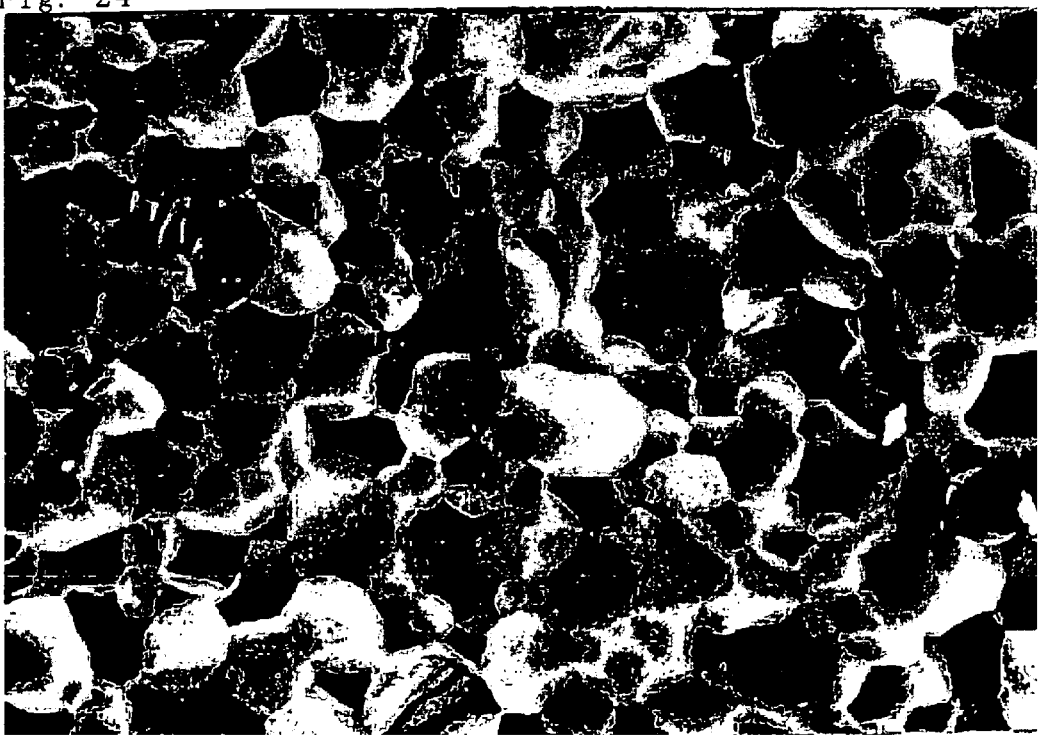
FIG. 24 is a SEM photograph which shows a sectional view of fracture of an electrostatic chuck according to comparative example 7.

As is obvious from the SEM photographs shown in FIG. 22 and FIG. 24, the ceramic substrate constituting the electrostatic chuck according to example 14 exhibits a sectional view of intragranular fracture, and the ceramic substrate constituting the electrostatic chuck of cooperative example 7 exhibits a sectional view of intergranular fracture. Further, it ts obvious from Table 3 that the electrostatic chuck with a hot plate according to example 14 to 17 has excellent bending strength at a high temperature and the number of free particles found on the silicon wafer put on the electrostatic chuck is small.

The reason for the abovementioned high bending strength at a high temperature is not clearly known. It is assumed that the electrostatic chuck has excellent bending strength at a high temperature because relatively few impurities such as oxygen are present at the grain boundary and thus relatively few apparent voids are found therein. In evaluation, the state of "intragranular fracture" does not necessarily mean that all the portions of the sectional view of fracture must show intragranular fracture. As shown in an electron microscope (FIG. 22), when most portions of the sectional view of fracture exhibit intragranular fracture, the state can be called "intragranular fracture" if the sectional view includes some intergranular fracture.

EXAMPLE 18

Production of a Wafer Prober 201 (Reference to FIGS. 16 and 17)

(1) A mixture composition was prepared by mixing: 1000 parts by weight of aluminum nitride powder (manufactured by Tokuyama Co., the average particle diameter: 1.1 $\mu$m); 40 parts by weight of yttria (the average particle diameter: 0.4 $\mu$m); 0.3 parts by weight of polyether sulfone; and 530 parts by weight of alcohol comprising 1-butanol and ethanol. By using the obtained mixture composition and performing the forming process according to the doctor blade method, a green sheet having a thickness of 0.47 mm was obtained.

(2) This green sheet was dried for five hours at 80° C. Thereafter, a through hole for a conductor filled through hole provided for obtaining connection of the heating element to the external terminal was formed therein by punching.

(3) Next, the conductor containing paste A and the conductor containing paste B were prepared in a manner similar to that of example 9.

Next, this conductor containing paste A was printed on the green sheet by screen printing, whereby a printed body for a lattice-like guard electrode and a printed body for a ground electrode were formed.

Further, the conductor containing paste B was filled in the through hole for the conductor filled through hole provided for obtaining connection to a terminal pin.

Fifty green sheets including the green sheets having a printed body formed there on and the green sheet shaving no printed body formed thereon were laminated and formed to be integrated by pressure at 130° C. and at a pressure of 8 MPa (80 kgf/cm$^2$), whereby a lamination was formed.

(4) Next, the obtained lamination was degreased in nitrogen gas at 600° C. for 5 hours and then hot-pressed for 3 hours at 1890° C. and at a pressure of 15 MPa (150 kgf/cm$^2$), whereby a plate-shaped body of aluminum nitride having a thickness of 3 mm was obtained. This plate-shaped body of aluminum nitride was cut out so as to have a disc-like shape having a diameter of 300 mm, whereby a plate-shaped body made of ceramic was produced. The conductor filled through hole 16 had a diameter of 0.2 mm and a depth of 0.2 mm.

Further, the thickness of the guard electrode 65 and the ground electrode 66 was 10 $\mu$m. The guard electrode 65 was formed at a position 1 mm distanced from the wafer loading face. The ground electrode 66 was formed at a position 1.2 mm distanced from the wafer loading face. The length of one side of the non conductor formed area 66a of the guard electrode 65 and the ground electrode 66 was 0.5 mm.

(5) The plate-shaped body obtained in the abovementioned (4) was ground by using a diamond grindstone. Thereafter, a mask was set on the plate-shaped body and a concave portion (not shown) for embedding a thermocouple and grooves 64 (whose width was 0.5 mm and depth was 0.5 mm) for sucking the wafer were formed on the surface thereof by blast treatment.

(6) Further, a layer for forming a heating element 61 was printed on the face opposite to the wafer loading face. The conductor containing paste was used for printing. As the conductor containing paste, similar to examples 1 to 7, SOLVEST PS603D manufactured by Tokuriki Kagaku Kenkyujo, which is used for forming a plated through hole of a printed circuit board, was employed. (7) The heater plate on which the conductor containing paste had been printed was heated and fired at 780° C., so that the silver and lead contained in the conductor containing paste were sintered and baked on the ceramic substrate 63. Further the heater plate was immersed in an electroless nickel plating bath containing aqueous solutions of nickel sulfate (30 g/l), boric acid (30 g/l), ammonium chloride (30 g/l) and Rochelle salt (60 g/l), so that a nickel layer (not shown) having 1 weight % or less of boron and a thickness of 1 μm was deposited on the surface of the silver sintered body 61. Thereafter, the heater plate was subjected to the annealing treatment at 120° C. for 3 hours.

The thickness of the resistance heating element of the silver sintered body was 5 μm, the width thereof was 2.4 mm and the sheet resistivity was 7.7 mΩ/cm².

(8) A titanium layer, a molybdenum layer and a nickel layer were formed in this order, by spattering, on the face in which grooves 64 were formed. "SV-4540" manufactured by ULVAC Japan Co. was used as the device for spattering. The spattering was performed in a condition in which the atmospheric pressure was 0.6 Pa, the temperature was 100° C. and the electric power was 200 W. The time during which spattering was conducted was in a range of 30 seconds to one minute, which was adjusted depending on the type of the metal.

The thickness of the thus produced metal layer 62, as measured from the images obtained by a fluorescent X-ray analyzer, was 0.3 μm in the titanium layer, 2 μm in the molybdenum layer and 1 μm in the nickel layer.

(9) The ceramic plate obtained in the abovementioned (8) was immersed in an electroless nickel plating bath containing aqueous solutions of nickel sulfate (30 g/l), boric acid (30 g/l), ammonium chloride (30 g/1) and Rochelle salt (60 g/l), so that a nickel layer having 1 weight % or less of boron and a thickness of 7 μm was deposited on the surface of the metal layer 62 formed by the spattering. Thereafter, the ceramic plate was subjected to the annealing treatment at 120° C. for 3 hours.

The surface of the heating element was not energized, and thus the surface of the heating element was not covered with an electroless nickel plating.

Further, the ceramic plate was immersed in an electroless gold plating liquid containing aqueous solutions of potassium gold cyanide (2 g/l), ammonium chloride (75 g/l), sodium citrate (50 g/l) and sodium hypophosphite (10 g/l) at 93° C. for 1 minute, so that a gold plating layer having a thickness of 1 μm was formed thereon.

(10) An air suction hole 69 penetrating the ceramic plate to the back face from the grooves 64 were formed by drilling. Further, a blind hole (not shown) for exposing the conductor filled through hole 16 was formed. An external terminal made of kovar was connected to the blind hole by using gold brazing of Ni—Au alloy (Au: 81.5 weight %, Ni: 18.4 weight % and impurities: 0.1 weight %) and conducting heating and reflowing at 970° C. Further, an external terminal made of kovar was formed at the heating element through solder (tin: 90 weight %/lead: 10 weight %).

(11) Next, a plurality of thermocouples for controlling the temperature was embedded in the concave portion, whereby the wafer prober 501 was obtained.

The content of oxygen of the ceramic substrate of the wafer prober produced in such a manner as described above was 1.6 weight % and the content of oxygen ion thereof was 30 ppm.

When the temperature of the ceramic substrate was raised to 200° C., no problems such as short circuit was observed.

Further, the bending strength of the ceramic substrate at 400° C. was 400 MPa, which was excellently high. Further, the sectional view of fracture of the ceramic substrate exhibited partial intragranular fracture.

EXAMPLE 19

Production of a Wafer Prober 501 (Reference to FIGS. 16 and 17)

(1) A paste was prepared by mixing: 100 parts by weight of aluminum nitride powder (manufactured by Tokuyama Co., the average particle diameter: 1.1 μm); 20 parts by weight of alumina (the average particle diameter: 0.4 μm); 115 parts by weight of an acrylic binder; 5 parts by weight of polyether sulfone; 0.03 parts by weight of silica; 5 parts by weight of a dispersant; and 530 parts by weight of alcohol comprising 1-butanol and ethanol. By using the obtained paste and performing the forming process according to the doctor blade method, a green sheet having a thickness of 0.47 mm was obtained. Thereafter, a wafer prober having a heater was produced in a manner similar to that of example 18.

When the obtained wafer prober having a heater was heated, the temperature of the wafer prober reached 200° C. in about 20 seconds. The bending strength thereof at 400° C. was 400 MPa, which was excellently high. Further, the sectional view of fracture of the ceramic substrate exhibited intragranular fracture.

EXAMPLE 20

Figure 20:
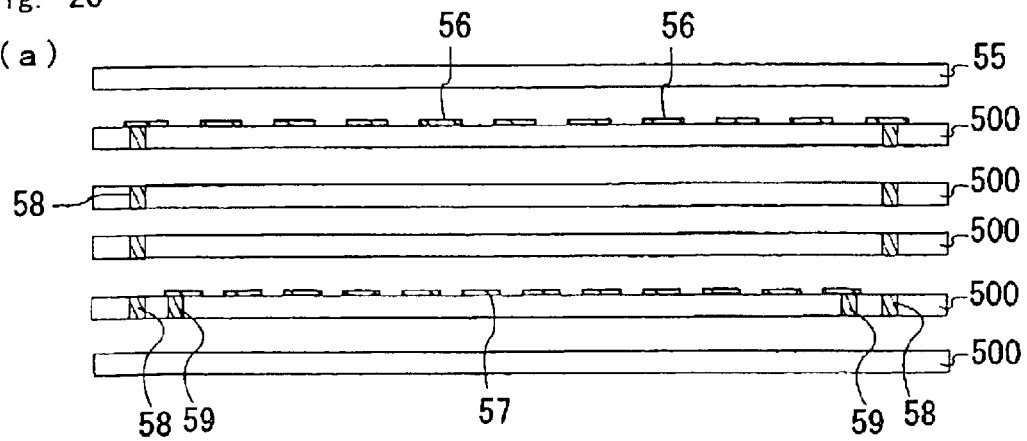
FIGS. 20(a) to (d) are sectional views which schematically show a part of a production process of an electrostatic chuck of the sixth aspect of the present invention.
Figure 20:
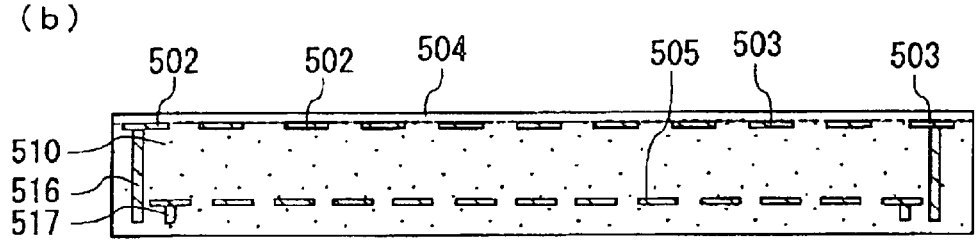
Figure 20:
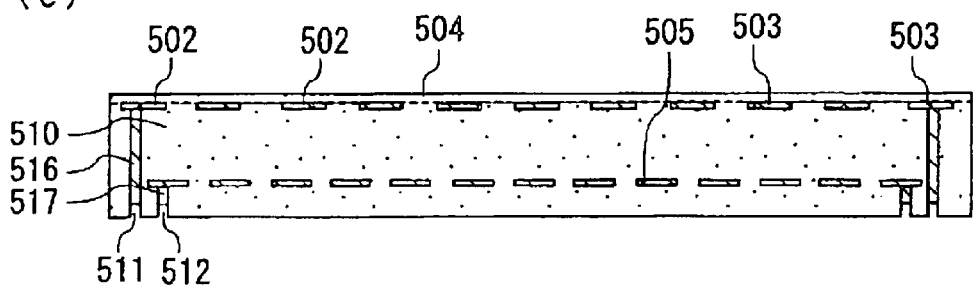
Figure 20:
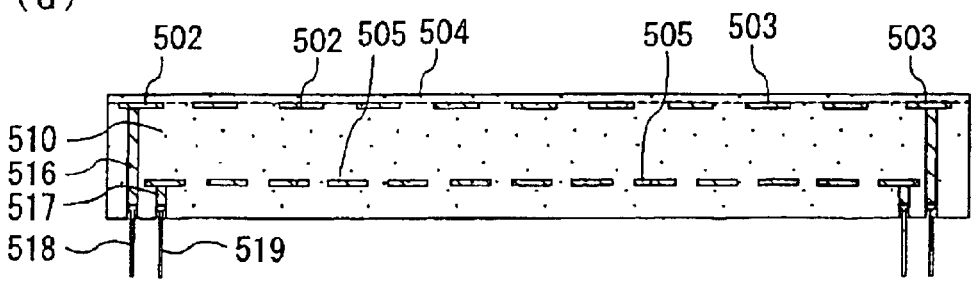

Production of an Electrostatic Chuck (Reference to FIG. 20)

(1) A paste was produced by mixing: 100 parts by weight of aluminum nitride powder (the average particle diameter: 0.6 μm); 0.3 parts by weight of yttria (the average particle diameter: 0.4 μm); 12 parts by weight of acrylic binder; and alcohol. By using the obtained paste and performing the forming process according to the doctor blade method, a green sheet 55 having a thickness of 0.47 mm was obtained as the green sheet for the upper layer. Another paste was produced by mixing: 1000 parts by weight of aluminum nitride powder (manufactured by Tokuyama Co., the average particle diameter: 0.2 μm); 40 parts by weight of yttria (the average particle diameter: 0.4 μm); 115 parts by weight of acrylic binder; 0.002 parts by weight of boron nitride; 5 parts by weight of a dispersant; and 530 parts by weight of alcohol comprising 1-butanol and ethanol. By using the obtained paste and performing the forming process according to the doctor blade method, a green sheet 500 having a thickness of 0.47 mm was obtained for the lower layer.

(2) Next, the green sheet was dried for five hours at 80° C. Thereafter, portions which were to serve as through holes whose diameter was 1.8 mm, 3.0 mm and 5.0 mm, respectively, which semiconductor-wafer supporting pins were passed through and a portion which was to serve as a conductor filled through hole for obtaining connection to the external terminal were formed, by punching, in the green sheets.

(3) Next, the conductor containing paste A and the conductor containing paste B were prepared in a manner similar to that of example 9.

This conductor containing paste A was printed on the green sheet 500 for the lower layer by screen printing, whereby a conductor containing paste layer was formed. The printing pattern was a concentric circles-like pattern.

Further, a conductor containing paste layer having the electrostatic electrode pattern of the shape shown in FIG. 13 was formed on another green sheet 500 for the lower layer.

Further, the conductor containing paste B was filled in the through hole for the conductor filled through hole provided for obtaining connection to the external terminals, whereby a through hole printed bodies 58, 59 were formed.

The green sheet 500 for the lower layer which had been subjected to the abovementioned treatment was laminated with 34 sheets provided at the upper side thereof (on the heating face thereof); and 13 sheets provided at the lower side thereof: of the green sheet 500 for the lower layer on which the tungsten paste had not been printed. A green sheet 500 for the lower layer on which the conductor containing paste layer having the electrostatic electrode patterns had been printed, was further laminated thereon. One green sheet 500 for the lower layer on which the tungsten paste had not been printed was further laminated thereon. The green sheets 55 for the upper layer were laminated further thereon. These laminated sheets were pressed to be attached to each other at 130° C. and at a pressure of 8 MPa (80 kgf/cm²), whereby a lamination was formed (reference to FIG. 20(a)).

(4) Next, the obtained lamination was degreased in nitrogen gas at 600° C. for 5 hours and then hot-pressed for 3 hours at 1700° C. and at a pressure of 20 MPa (200 kgf/cm²), whereby a plate-shaped body of aluminum nitride having a thickness of 3 mm was obtained. This plate-shaped body of aluminum nitride was cut out so as to have a disc-like shape having a diameter of 230 mm, whereby a plate-shaped body made of aluminum nitride which included the resistance heating element 505 (whose thickness was 6 $\mu$m and width was 10 mm), a chuck positive electrostatic layer 502 and a chuck negative electrostatic layer 503 having a thickness of 10 $\mu$m, and the conductor filled through holes 516, 517 inside thereof was obtained (FIG. 20(b)).

(5) Next, the plate-shaped body obtained in the abovementioned (4) was ground by using a diamond grindstone. Thereafter, a mask was set thereon and a bottomed hole (diameter: 1.2 mm, depth: 2.0 mm) for embedding a thermocouple was formed on the surface thereof by the blast treatment using SiC and the like.

(6) Further, blind holes 511, 512 were formed by hollowing out a portion where the conductor filled through holes 516, 517 were formed (reference to FIG. 20(c)). External terminals 518, 519 made of kovar were connected to these blind holes 511, 512 by using gold brazing of Ni—Au and conducting heating and reflowing at 700° C. (reference to FIG. 20(d)).

Moreover, it is preferable that the connection of the external terminals is obtained by a structure, wherein a support of tungsten supports at three points. The external terminals can be reliably connected to the bind holes in such a structure.

(7) Next, a plurality of thermocouples for controlling the temperature was embedded in the bottomed hole, whereby the production of the electrostatic chuck having a resistance heating element was completed.

EXAMPLE 21

Production of an Electrostatic Chuck (Reference to FIG. 20)

An electrostatic chuck was produced in a manner similar to that of example 20, except that the green sheet for the upper layer was produced as follows. First, a paste was produced by mixing: 100 parts by weight of aluminum nitride powder (manufactured by Tokuyama Co., the average particle diameter: 0.6 $\mu$m); 0.2 parts by weight of yttria (the average particle diameter: 0.4 $\mu$m); 11.5 parts by weight of acrylic binder; 0.5 parts by weight of a dispersant; and 53 parts by weight of alcohol comprising 1-butanol and ethanol. By using the obtained paste and performing the forming process according to the doctor blade method, a green sheet for the upper layer having a thickness of 0.47 mm was obtained.

EXAMPLE 22

Production of an Electrostatic Chuck (Reference to FIG. 20)

An electrostatic chuck was produced in a manner similar to that of example 20, except that the green sheet for the lower layer was produced as follows. First, a paste was produced by mixing: 1000 parts by weight of aluminum nitride powder (manufactured by Tokuyama Co., the average particle diameter: 0.6 $\mu$m); 40 parts by weight of yttria (the average particle diameter:0.4 $\mu$m); 115 parts by weight of acrylic binder; 0.002 parts by weight of boron nitride; 0.05 parts by weight of silica; 0.001 parts by weight of Na$_2$O; 5 parts by weight of a dispersant; and 530 parts by weight of alcohol comprising 1-butanol and ethanol. By using the obtained paste and performing the forming process according to the doctor blade method, a green sheet for the lower layer having a thickness of 0.47 mm was obtained.

EXAMPLE 23

Production of an Electrostatic Chuck (Reference to FIG. 20)

An electrostatic chuck was produced in a manner similar to that of example 22, except that the green sheet for the upper layer was produced as follows. First, a paste was prepared by mixing: 100 parts by weight of aluminum nitride powder (manufactured by Tokuyama Co., the average particle diameter: 0.6 $\mu$m); 0.2 parts by weight of yttria (the average particle diameter: 0.4 $\mu$m); 11.5 parts by weight of acrylic binder; 0.5 parts by weight of a dispersant; and 53 parts by weight of alcohol comprising 1-butanol and ethanol. By using the obtained paste and performing the forming process according to the doctor blade method, a green sheet for the upper layer having a thickness of 0.47 mm was obtained.

Comparative Example 10

Production of an Electrostatic Chuck (1) A paste was prepared by mixing: 100 parts by weight of aluminum nitride powder (manufactured by Tokuyama Co., the average particle diameter: 1.1 $\mu$m); 4 parts by weight of yttria (the average particle diameter: 0.4 pr); 11.5 parts by weight of an acrylic binder; 0.5 parts by weight of a dispersant; and 53 parts by weight of alcohol comprising 1-butanol and ethanol. By using the obtained paste and performing the forming process according to the doctor blade method, a green sheet having a thickness of 0.47 mm was obtained.

(2) Next, the green sheet was dried for five hours at 80° C. Thereafter, portions which were to serve as through holes whose diameter was 1.8 mm, 3.0 mm and 5.0 mm, respectively, which semiconductor-wafer supporting pins were passed through and a portion which was to serve as a conductor filled through hole for obtaining connection to the external terminal were formed, by punching, in the green sheets.

(3) Next, the conductor containing paste A and the conductor containing paste B were prepared in a manner similar to that of example 9.

This conductor containing paste A was printed on the green sheet by screen printing, whereby a conductor containing paste layer was formed. The printing pattern was a concentric circles-like pattern. Further, a conductor containing paste layer having the electrostatic electrode pattern of the shape shown in FIG. 13 was formed on another green sheet.

Further, the conductor containing paste B was filled in the through hole for the conductor filled through hole provided for obtaining connection to the external terminals.

The green sheet which had been subjected to the above-mentioned treatment was laminated with 34 sheets provided at the upper side thereof (on the heating face thereof); and 13 sheets provided at the lower side thereof: both are the green sheets on which the tungsten paste had not been printed. A green sheet on which the conductor containing paste layer having the electrostatic electrode patterns had been printed, was further laminated thereon. Two green sheet on which the tungsten paste had not been printed were further laminated thereon. These laminated sheets were pressed to be attached to each other at 130° C. and at a pressure of 8 MPa (80 kgf/cm$^2$), whereby a lamination was formed.

(4) Next, the obtained lamination was degreased in nitrogen gas at 600° C. for 5 hours and then hot-pressed for 3 hours at 1890° C. and at a pressure of 15 MPa (150 kgf/cm$^2$), whereby a plate-shaped body of aluminum nitride having a thickness of 3 mm was obtained. This plate-shaped body of aluminum nitride was cut out so as to have a disc-like shape having a diameter of 230 mm, whereby a plate-shaped body made of aluminum nitride which had a resistance heating element (whose thickness was 6 μm and width was 10 mm), a chuck positive electrostatic layer and a chuck negative electrostatic layer having a thickness of 10 μm inside thereof was obtained.

(5) Next, the plate-shaped body obtained in the above-mentioned (4) was ground by using a diamond grindstone. Thereafter, a mask was set thereon and a bottomed hole (diameter: 1.2 mm, depth: 2 mm) for embedding a thermocouple was formed on the surface thereof by the blast treatment using SiC and the like.

(6) Further, blind holes were formed by hollowing out a portion where the conductor filled through holes were formed. External terminals made of kovar were connected to the blind holes by using gold brazing of Ni—Au and conducting heating and reflowing at 700° C.

(7) Next, a plurality of thermocouples for controlling the temperature was embedded in the bottomed hole, whereby the production of the electrostatic chuck having a resistance heating element was completed.

Comparative Example 11

Production of an Electrostatic Chuck

First, a paste was prepared mixing: 100 parts by weight of aluminum nitride powder (the average particle diameter: 0.6 n); 0.3 parts by weight of yttria (the average particle diameter: 0.4 μm); 12 parts by weight of an acrylic binder; and alcohol. By using the obtained paste and performing the forming process according to the doctor blade method, a green sheet having a thickness of 0.47 mm was obtained. Then, an electrostatic chuck was produced in a manner similar to that of comparative example 10, except that the green sheet was hot-pressed for 3 hours at 1700° C. and at a pressure of 20 MPa (200 kgf/cm$^2$).

For each of electrostatic chucks produced in examples 20 to 23 and comparative examples 10 and 11, counting of the number of free particles, observation of the sectional view of fracture, measurement of the porosity, measurement of temperature distribution after the temperature of the ceramic substrate reached 400° C., and an insulation test of the conductor circuit in the ceramic substrate, were carried out. In addition, presence/absence of occurrence of short circuit between the conductor circuits was checked.

The results thereof are shown in Table 4 below.

Evaluation Method (1) Measurement of the Number of Free Particles

The number of the free particles was measured by a method including the steps of: setting a silicon wafer on each electrostatic chuck; applying a load of 50 kgf/cm$^2$ thereon; arbitrarily photographing 10 sites at the silicon wafer by an electron microscope, with observation; counting the number of the free particles whose particle diameter was 2 μm or more; dividing the number of the particles by the area of the photographed field, there by obtaining the number of the particles per the unit area.

(2) Observation of the State of the Sectional View of Fracture

Figure 32:
FIG. 32 is a photograph taken by a scanning electron microscope (SEM) which shows a sectional view of fracture in the vicinity of the upper surface (the upper layer) of an electrostatic chuck according to example 20.
Figure 33:
FIG. 33 is a photograph taken by a scanning electron microscope (SEM) which shows a sectional view of fracture at the lower layer of the electrostatic chuck according to example 20.

For each of the electrostatic chucks, the sectional view of fracture thereof was observed with an electron microscope at a magnification of 5000 times and the state of the sectional view of fracture, that is, whether the sectional view of fracture exhibited the state of intragranular fracture or not, was observed. FIG. 32 is a photograph taken by a scanning electron microscope (SEM) which shows a sectional view of fracture in the vicinity of the upper surface (the upper layer) of an electrostatic chuck according to example 20. FIG. 33 is a photograph taken by a scanning electron microscope (SEM) which shows a sectional view of fracture at the lower surface of the electrostatic chuck according to example 20.

(3) Measurement of Difference in Temperature at the Heating Face

Each of the electrostatic chucks according to examples 20 to 23 and comparative examples 10 to 11 was energized and the temperature thereof was raised to 400° C. Thereafter, the difference in temperature at the heating face was measured by a thermoviewer ("IR162012-0012" manufactured by Nihon Datum Co.).

(4) Insulation Test of the Conductor Circuit in the Ceramic Substrate

The state of insulation between the conductor circuits provided in the ceramic substrate (that is, whether insulation is being maintained therebetween or not) was checked by using a tester, whereby presence/absence of occurrence of short circuit was checked.

(5) Measurement of the Porosity

Measurement of the porosity was performed according to the Archimedes' method. Moreover, the measurement of the pore diameter at the upper layer portion of the electrostatic chuck was carried out in a method in which the upper layer portion thereof was thinly peeled or separated.

TABLE 4

| | The Number of free particle (Particles/cm²) | Observation of sectional view of fracture | | Porosity (%) | | Difference in temperature(*1) (° C.) | Insulation test of conductor circuits |
|---|---|---|---|---|---|---|---|
| | | Vicinity of the upper portion surface | Lower portion | Vicinity of the upper portion surface | Lower portion | | |
| Example | | | | | | | |
| 20 | 0.5 | Intragranular fracture | Intergranular fracture | 0.3 | 0(*2) | 0.5 | Satisfactory |
| 21 | 0.5 | Intragranular fracture | Intergranular fracture | 0.3 | 0(*2) | 0.5 | Satisfactory |
| 22 | 0.5 | Intragranular fracture | Intergranular fracture | 0.3 | 0(*2) | 0.5 | Satisfactory |
| 23 | 0.5 | Intragranular fracture | Intergranular fracture | 0.3 | 0(*2) | 0.5 | Satisfactory |
| Comparative examples | | | | | | | |
| 10 | 1 | Intergranular fracture | Intergranular fracture | 0(*2) | 0(*2) | 0.1 | Satisfactory |
| 11 | 0.5 | Intragranular fracture | Intragranular fracture | 0.3 | 0.3 | 0.5 | Poor |

*1)Difference in temperature between the highest temperature and the lowest temperature
*2)Below the measurement limit As is obvious from the results shown in Table 4, the sectional view of fracture in the vicinity of the upper portion surface (the upper layer) of the electrostatic chuck according to examples 20 to 23 exhibited the state of intragranular fracture. Accordingly, the number of free particles observed in the vicinity of the surface of the silicon wafer and the like which had been treated was relatively small.

On the other hand, the sectional view of fracture of the lower portion (the lower layer) exhibited the state of intergranular fracture. Further, the porosity of the lower layer was lower than that of the upper layer. Accordingly, the results of the insulation test of the conductor circuit in the ceramic substrates were unanimously excellent and no short circuit was observed therein.

In comparative example 10, the sectional view of fracture exhibited the state of intergranular fracture at both the upper and lower layers. In this comparative example, the porosity of the ceramic substrate as a whole was relatively low and the result of the insulation test of the conductor circuit in the ceramic substrate was generally good, thereby avoiding occurrence of short circuit between the conductor circuits. However, in this case, the number of free particles observed on the surface of the silicon wafer and the like which had been treated was relatively large, whereby short circuits, disconnection and the like occurred in the conductor circuit of the silicon wafer.

Further, the sectional view of fracture of the electrostatic chuck according to comparative example 11 exhibited the state of intragranular fracture at both the upper and lower layers. Therefore, the number of free particles observed on the surface of the silicon wafer and the like which had been treated was relatively small and occurrence of short circuit, disconnection and the like was not observed in the conductor circuits of the silicon wafer. However, in this case, the porosity of the electrostatic chuck was high as a whole and the insulation between the conductor circuits in the ceramic substrate was not reliably maintained, whereby occurrence of short circuit was observed.

Industrial Applicability

As described above, the aluminum nitride sintered body of the first aspect of the present invention contains sulfur. As a result, the binding force between the ceramic grains is strong and the aluminum nitride sintered body has excellent mechanical strength, whereby coming-off of the ceramic particles from the surface and/or the side face of the aluminum nitride sintered body is suppressed and generation of free particles can be significantly prevented.

The aluminum nitride sintered body of the second aspect of the present invention exhibits intragranular fracture at the sectional view of fracture thereof. In addition, the average grain diameter of the aluminum nitride sintered body is adjusted so as to be 3 μm or less. Accordingly, coming-off of particles is hardly observed. Further, as there exist hardly any barriers between the grains of the aluminum nitride sintered body, the strength thereof at a high temperature is significantly enhanced.

The ceramic substrate of the third aspect of the present invention is sintered such that the sectional view of fracture thereof exhibits intragranular fracture. As a result, the ceramic substrate is excellent in the properties at a high temperature, generates a relatively small number of free particles which attach to the silicon wafer and the like and thus can be most suitably used as a ceramic substrate for a semiconductor producing/examining device.

In the ceramic substrate of the fourth aspect of the present invention, the average grain diameter of the ceramic grain of the ceramic substrate is adjusted so as to be 2 μm or less. Accordingly, the sectional view of fracture thereof is likely to exhibit intragranular fracture and coming-off of particles is not likely to happen. Further, as the diameter of the free particles which come off is small (2 μm or less), the silicon wafer and the like is prevented from being contaminated. Therefore, the ceramic substrate of the present invention can be most preferably used as a ceramic substrate for a semiconductor producing/examining device.

The ceramic substrate for a semiconductor producing/ examining device of the fifth aspect of the present invention is a ceramic substrate including a conductor formed inside thereof. The ceramic layer which includes the conductor and the layers located lower than the conductor (that is, the lower layer) exhibits the state of intergranular fracture at the time of fracture. Another ceramic layer (the upper layer) exhibits the state of intragranular fracture at the time of fracture. Accordingly, generation of free particles as a result of coming-off of the ceramic particles is not likely to occur at the substrate surface on which the material to be treated is loaded, whereby short circuit, disconnection and the like are not likely to happen between the conductor circuits formed on the object to be treated (for instance, a silicon wafer). Further, as the porosity is relatively small between the conductor circuits of the ceramic substrate, short circuits are not likely to occur between the conductor circuits and thus the substrate reliably function in an excellent manner.

The electrostatic chuck of the sixth aspect of the present invention is the electrostatic chuck comprising the electrostatic electrode and the resistance heating element formed inside the ceramic substrate. The ceramic layer which includes the electrostatic electrode and the layers located lower than the electrostatic electrode (that is, the lower layer) exhibits the state of intergranular fracture at the time of fracture. Another ceramic layer (the upper layer) exhibits the state of intragranular fracture at the time of fracture. Accordingly, grains constituting the upper layer are firmly bound to each other and the ceramic particles are not likely to come off from the surface of the upper layer, whereby coming-off of particles from the dielectric film surface and attachment of the generated free particles to the object to be treated (such as a silicon wafer) can be prevented and thus occurrence of adhesion failure between the object to be treated and the electrostatic chuck can be prevented. Further, the lower ceramic layer exhibits the state of intergranular fracture at the time of fracture and has a relatively low porosity, whereby occurrence of short circuit: between the electrostatic electrodes; between the resistance heating elements; or between the electrostatic electrode and the resistance heating element of the lower layer can be prevented. In case that a RF electrode is present in the electrostatic chuck, occurrence of short circuit between the electrostatic electrode and the RF electrode and between the RF electrode and the resistance heating element can also be prevented, whereby the electrostatic chuck can function in an excellent manner.

What is claimed is:

1. A ceramic substrate having a conductor formed inside thereof for a semiconductor producing/examining device, wherein:
    a ceramic layer including said conductor and the vicinity thereof and a ceramic layer located lower than said conductor exhibit a state of intergranular fracture at the time of fracture; and
    a ceramic layer other than said ceramic layers exhibits a state of intragranular fracture at the time of fracture.

2. The ceramic substrate for a semiconductor producing/examining device according to claim 1,
    wherein said ceramic substrate comprises nitride ceramic or carbide ceramic.

3. The ceramic substrate for a semiconductor producing/examining device according to claim 1,
    wherein said ceramic substrate has a thickness of 20 mm or less.

4. The ceramic substrate for a semiconductor producing/examining device according to claim 1,
    wherein said ceramic substrate has a disc-like shape and a diameter of 200 mm or more.

5. The ceramic substrate for a semiconductor producing/examining device according to claim 1,
    wherein said ceramic substrate is used at a temperature of 150° C. or higher.

6. The ceramic substrate for a semiconductor producing/examining device according to claim 1,
    wherein said ceramic substrate has an electrostatic electrode or an RF electrode.

7. The ceramic substrate for a semiconductor producing/examining device according to claim 1,
    wherein said conductor is a metal foil, a metal wire, or a sintered body of metal particles.

8. The ceramic substrate for a semiconductor producing/examining device according to claim 1,
    wherein the average grain diameter of a ceramic grain of said ceramic substrate is 3 μm or less.

9. The ceramic substrate for a semiconductor producing/examining device according to claim 1,
    wherein the average grain diameter of a ceramic grain of said ceramic substrate is 2 μm or less.

10. The ceramic substrate for a semiconductor producing/examining device according to claim 1,
    wherein said ceramic substrate contains oxygen.

11. The ceramic substrate for a semiconductor producing/examining device according to claim 1,
    wherein said ceramic substrate contains 0.05 to 10 weight % of oxygen.

12. The ceramic substrate for a semiconductor producing/examining device according to claim 1,
    wherein said ceramic substrate contains sulfur.

13. The ceramic substrate for a semiconductor producing/examining device according to claim 1,
    wherein said ceramic substrate contains 0.05 to 200 ppm of sulfur.

14. The ceramic substrate for a semiconductor producing/examining device according to claim 1,
    wherein said ceramic substrate contains an oxide.

15. The ceramic substrate for a semiconductor producing/examining device according to claim 1,
    wherein said ceramic substrate contains an oxide of a rare earth element.

16. The ceramic substrate for a semiconductor producing/examining device according to claim 1,
    which is used as a ceramic heater.

17. An electrostatic chuck having an electrostatic electrode and a resistance heating element formed inside a ceramic substrate thereof, wherein:
    a ceramic layer including said electrostatic electrode and the vicinity thereof and a ceramic layer located lower than said electrostatic electrode exhibit a state of intergranular fracture at the time of fracture; and
    a ceramic layer other than said ceramic layers exhibits a state of intragranular fracture at the time of fracture.

18. The electrostatic chuck according to claim 17,
    wherein said ceramic substrate comprises nitride ceramic or carbide ceramic.

19. The electrostatic chuck according to claim 17,
    wherein said ceramic substrate has a thickness of 20 mm or less.

20. The electrostatic chuck according to claim 17,
    wherein said ceramic substrate has a disc-like shape and a diameter of 200 mm or more.

21. The electrostatic chuck according to claim 17,
    wherein said ceramic substrate is used at a temperature of 150° C. or higher.

22. The electrostatic chuck according to claim 17, wherein said ceramic substrate has an RF electrode.

23. The electrostatic chuck according to claim 17, wherein said heating element is a metal foil, a metal wire, or a sintered body of metal particles.

24. The electrostatic chuck according to claim 17, wherein the average grain diameter of a ceramic grain of said ceramic substrate is 3 μm or less.

25. The electrostatic chuck according to claim 17, wherein the average grain diameter of a ceramic grain of said ceramic substrate is 2 μm or less.

26. The electrostatic chuck according to claim 17, wherein said ceramic substrate contains oxygen.

27. The electrostatic chuck according to claim 17, wherein said ceramic substrate contains 0.05 to 10 weight % of oxygen.

28. The electrostatic chuck according to claim 17, wherein said ceramic substrate contains sulfur.

29. The electrostatic chuck according to claim 17, wherein said ceramic substrate contains 0.05 to 200 ppm of sulfur.

30. The electrostatic chuck according to claim 17, wherein said ceramic substrate contains an oxide.

31. The electrostatic chuck according to claim 17, wherein said ceramic substrate contains an oxide of a rare earth element.

32. The electrostatic chuck according to claim 17, which is used as a ceramic heater.

* * * * *